United States Patent [19]

Butts et al.

[11] Patent Number: 5,661,662
[45] Date of Patent: Aug. 26, 1997

[54] STRUCTURES AND METHODS FOR ADDING STIMULUS AND RESPONSE FUNCTIONS TO A CIRCUIT DESIGN UNDERGOING EMULATION

[75] Inventors: Michael R. Butts, Portland; Jon A. Batcheller, Newberg, both of Oreg.

[73] Assignee: Quickturn Design Systems, Inc., Mountain View, Calif.

[21] Appl. No.: 471,679

[22] Filed: Jun. 6, 1995

Related U.S. Application Data

[62] Division of Ser. No. 245,310, May 17, 1994, Pat. No. 5,452,231, which is a continuation of Ser. No. 923,361, Jul. 31, 1992, abandoned, which is a division of Ser. No. 698,734, May 10, 1991, abandoned, which is a continuation-in-part of Ser. No. 417,196, Oct. 4, 1989, Pat. No. 5,036,473, which is a continuation-in-part of Ser. No. 254,463, Oct. 5, 1988, abandoned.

[51] Int. Cl.$^6$ .................................................. H03K 17/693
[52] U.S. Cl. .................................. 364/489; 364/488
[58] Field of Search ............................ 364/488, 489, 364/490, 491, 578; 395/500; 326/39, 41; 340/825.83

[56] References Cited

U.S. PATENT DOCUMENTS

| | | | |
|---|---|---|---|
| 4,872,125 | 10/1989 | Catlin | 364/578 |
| 4,901,259 | 2/1990 | Watkins | 364/578 |
| 4,945,503 | 7/1990 | Takasaki | 364/578 |
| 5,053,980 | 10/1991 | Kanazawa | 364/578 |
| 5,126,966 | 6/1992 | Hafeman et al. | 364/578 |
| 5,128,871 | 7/1992 | Schmitz | 364/490 |
| 5,140,526 | 8/1992 | McDermith et al. | 364/488 |
| 5,146,460 | 9/1992 | Ackerman et al. | 364/488 |
| 5,189,628 | 2/1993 | Olsen et al. | 364/489 |
| 5,193,068 | 3/1993 | Britman | 364/578 |
| 5,197,016 | 3/1993 | Sugimoto et al. | 364/490 |
| 5,224,056 | 6/1993 | Chene et al. | 364/490 |
| 5,258,932 | 11/1993 | Matsuzaki | 364/578 |
| 5,272,651 | 12/1993 | Bush et al. | 364/578 |
| 5,425,036 | 6/1995 | Liu et al. | 364/488 |
| 5,452,227 | 9/1995 | Kelsey et al. | 364/489 |
| 5,467,462 | 11/1995 | Fujii | 364/578 |

OTHER PUBLICATIONS

T. Payne; Automated Partitioning of Hierarchically Specified Digital Systems; May 1981.

"Emulation of VLSI Devices Using LCAs" by N. Schmitz, VLSI Systems Design, May 20, 1987 pp. 54–62.

"Silicon Compilation a Hierarchical Use of PLAs" by R. Ayres, Serox Corporation, pp. 314–326.

*Primary Examiner*—Vincent N. Trans
*Attorney, Agent, or Firm*—Lyon & Lyon

[57] ABSTRACT

A plurality of electronically reconfigurable gate array (ERCGA) logic chips are interconnected via a reconfigurable interconnect, and electronic representations of large digital networks are converted to take temporary actual operating hardware form on the interconnected chips. The reconfigurable interconnect permits the digital network realized on the interconnected chips to be changed at will, making the system well suited for a variety of purposes including simulation, prototyping, execution and computing. The reconfigurable interconnect may comprise a partial crossbar that is formed of ERCGA chips dedicated to interconnection functions, wherein each such interconnect ERCGA is connected to at least one, but not all of the pins of a plurality of the logic chips. Other reconfigurable interconnect topologies are also detailed.

1 Claim, 49 Drawing Sheets

4 Logic Chips with 8 pins each,
4 Crossbar Chips with 8 pins each.

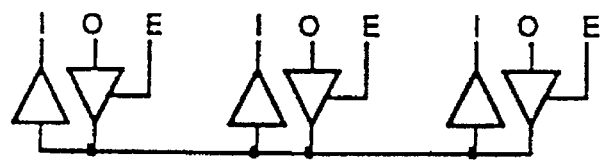
FIG 9
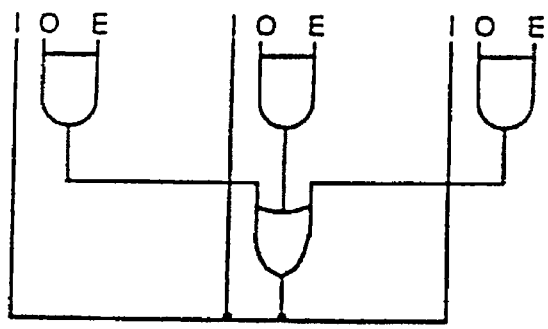
FIG 10
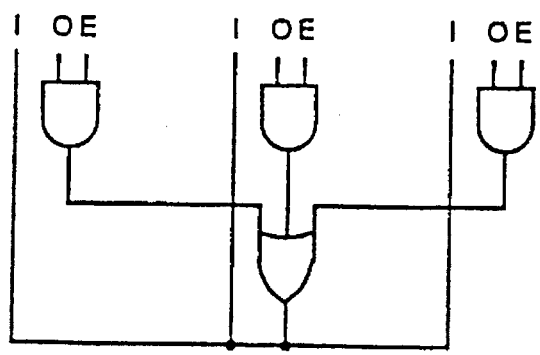 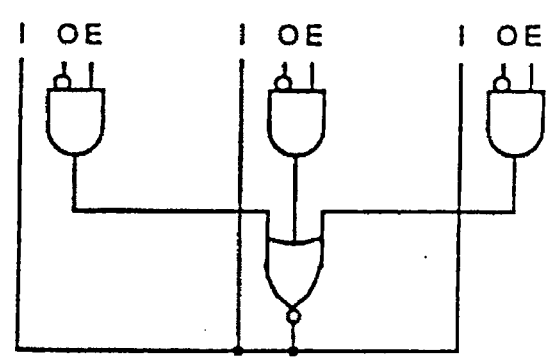
FIG 11a          FIG 11b

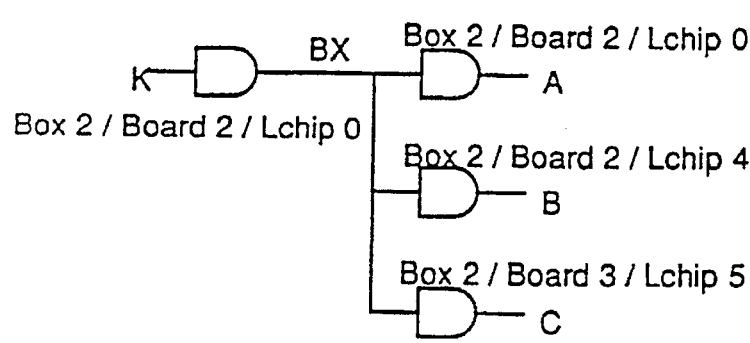
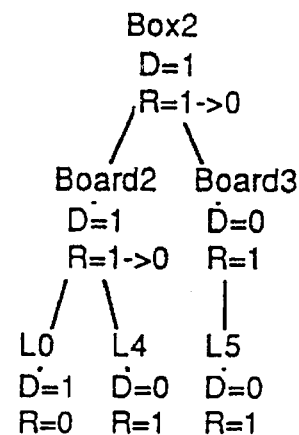
FIG 47a     FIG 47b
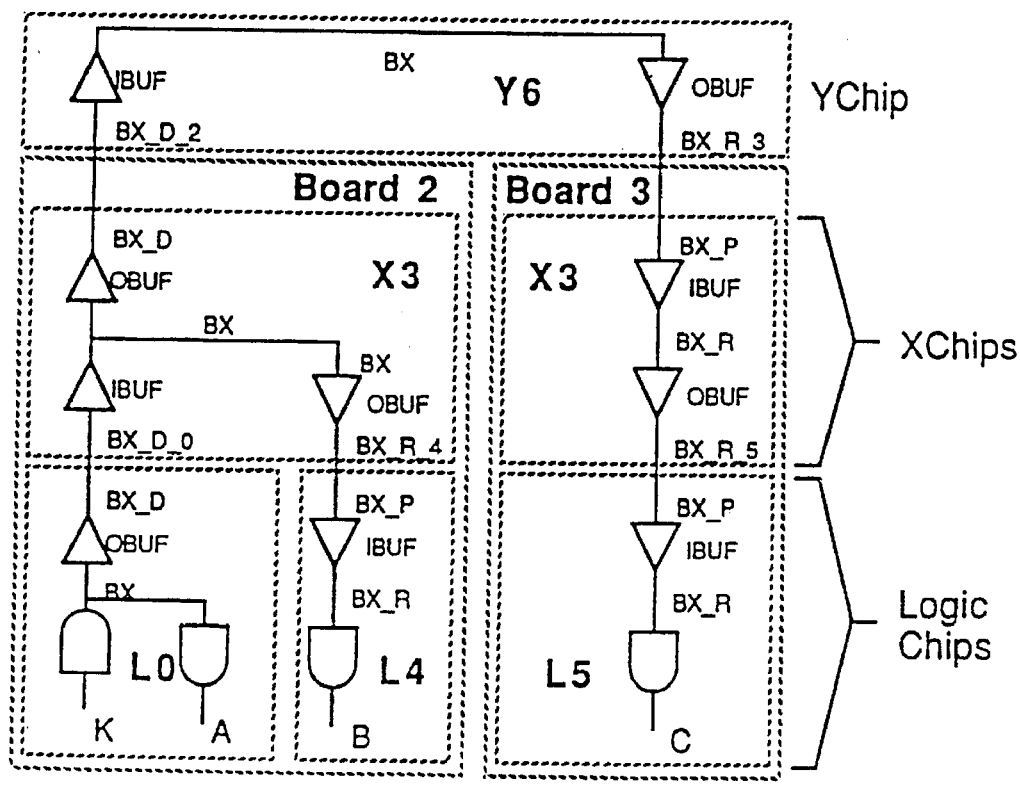
FIG 47c

| state | bit 1 | 0 |
|---|---|---|
| L | 0 | 0 |
| H | 0 | 1 |
| X | 1 | 0 |

L = low, false
H = high, true
X = unknown

| Input | | | | | | Output | | |
|---|---|---|---|---|---|---|---|---|
| A | B | A1 | A0 | B1 | B0 | C | C1 | C0 |
| L | L | 0 | 0 | 0 | 0 | L | 0 | 0 |
| L | H | 0 | 0 | 0 | 1 | L | 0 | 0 |
| L | X | 0 | 0 | 1 | 0 | L | 0 | 0 |
| H | L | 0 | 1 | 0 | 0 | L | 0 | 0 |
| H | H | 0 | 1 | 0 | 1 | H | 0 | 1 |
| H | X | 0 | 1 | 1 | 0 | X | 1 | 0 |
| X | L | 1 | 0 | 0 | 0 | L | 0 | 0 |
| X | H | 1 | 0 | 0 | 1 | X | 1 | 0 |
| X | X | 1 | 0 | 1 | 0 | X | 1 | 0 |

STRUCTURES AND METHODS FOR ADDING STIMULUS AND RESPONSE FUNCTIONS TO A CIRCUIT DESIGN UNDERGOING EMULATION

RELATED APPLICATION DATA

This is a divisional of application Ser. No. 08/245,310 filed on May 17, 1994, now U.S. Pat. No. 5,452,231, which is a continuation of application Ser. No. 07/923,361 filed on Jul. 31, 1992, now abandoned, which was a division of application Ser. No. 07/698,734 filed on May 10, 1991, now abandoned, which was a continuation-in-part of application Ser. No. 07/417,196 filed on Oct. 4, 1989, now U.S. Pat. No. 5,036,473, which was a continuation-in-part of application Ser. No. 07/254,463 filed on Oct. 5, 1988, now abandoned. These applications are incorporated herein by reference.

FIELD OF THE INVENTION

The present invention relates to reconfigurable hardware simulators (more precisely here termed "emulators") which employ electronically reconfigurable gate array logic elements (ERCGAs). The claimed invention more particularly relates to hybrid simulation methods and apparatuses wherein such a reconfigurable hardware emulator is used in conjunction with a second simulator, such as an event driven simulator, to permit fast and detailed analysis of a logic circuit's operation.

BACKGROUND AND SUMMARY OF THE INVENTION

For expository convenience, the present application refers to the present invention as a Realizer™ system, the lexicon being devoid of a succinct descriptive name for a system of the type hereinafter described.

The Realizer system comprises hardware and software that turns representations of large digital logic networks into temporary actual operating hardware form, for the purpose of simulation, prototyping, execution or computing. (A digital logic network is considered "large" when it is contains too many logic functions to be contained in a few of the largest available configurable logic devices.)

The following discussions will be made clearer by a brief review the relevant terminology as it is typically (but not exclusively) used.

To "realize" something is to make it real or actual. To realize all or part of a digital logic network or design is to cause it to take actual operating form without building it permanently.

An "input design" is the representation of the digital logic network which is to be realized. It contains primitives representing combinational logic and storage, as well as instrumentation devices or user-supplied actual devices, and nets representing connections among primitive input and output pins.

To "configure" a logic chip or interconnect chip is to cause its internal logic functions and/or interconnections to be arranged in a particular way. To configure a Realizer system for an input design is to cause its internal logic functions and interconnections to be arranged according to the input design.

To "convert" a design is to convert its representation into a file of configuration data, which, when used directly to configure Realizer hardware, will cause the design to be realized.

To "operate" a design is to cause Realizer hardware, which is configured according to the input design's representations, to actually operate.

An "interconnect" is a reconfigurable means for passing logic signals between a large number of chip I/O pins as if the pins were interconnected with wires.

A "path" is one of the built-in interconnection wires between a logic chip and a crossbar chip in a partial crossbar interconnect, or between crossbar chips in a hierarchy of partial crossbars.

A "path number" specifies a particular path, out of the many that may interconnect a pair of chips.

An "ERCGA" is an electronically reconfigurable gate array, that is a collection of combinational logic, and input/output connections (and optionally storage) whose functions and interconnections can be configured and reconfigured many times over, purely by applying electronic signals.

A "logic chip" is an ERCGA used to realize the combinational logic, stroage and interconnections of an input design in the Realizer system.

An "Lchip" is a logic chip, or a memory module or user-supplied device module which is installed in place of a logic chip.

An "interconnect chip" is an electronically reconfigurable device which can implement arbitrary interconnections among its I/O pins.

A "routing chip" is an interconnect chip used in a direct or channel-routing interconnect.

A "crossbar chip" is an interconnect chip used in a crossbar or partial crossbar interconnect.

An "Xchip" is a crossbar chip in the partial crossbar which interconnects Lchips. A "Ychip" is a crossbar chip in the second level of a hierarchical partial crossbar interconnect, which interconnects Xchips. A "Zchip" is a crossbar chip in the third level of a hierarchical partial crossbar interconnect, which interconnects Ychips.

A "logic board" is a printed circuit board carrying logic and interconnect chips. A "box" is a physical enclosure, such as a cardcage, containing one or more logic boards. A "rack" is a physical enclosure containing one or more boxes.

A "system-level interconnect" is one which interconnects devices larger than individual chips, such as logic boards, boxes, racks and so forth.

A "Logic Cell Array" or "LCA" is a particular example of ERCGA which is manufactured by Xilinx, Inc., and others and is used in the preferred embodiment.

A "configurable logic block" or "CLB" is a small block of configurable logic and flip-flops, which represent the combinational logic and storage in an LCA.

A "design memory" is a memory device which realizes a memory function specified in the input design.

A "vector memory" is a memory device used to provide a large body of stimulus signals to and/or collect a large body of response signals from a realized design in the Realizer system.

A "simulator" is a device in the Realizer system used to provide stimulus signals to an individual input of a realized design. A "sampler" is a device in the Realizer system used to collect response signals from an individual output of a realized design.

A "host computer" is a conventional computer system to which the Realizer system's host interface hardware is connected, and which controls the configuration and operation of the Realizer hardware.

An "EDA system" is a electronic design automation system, that is a system of computer-based tools used for creating, editing and analyzing electronic designs. The host EDA system is the one which generates the input design file in most Realizer system applications.

If a reconfigurable gate array with enough capacity to hold a single large design were available, then much of the Realizer technology would be unnecessary. However, this will never be the case, for two reasons.

First, ERCGAs cannot have as much logic capacity as a non-reconfigurable integrated circuit of the same physical size made with the same fabrication technology. The facilities for reconfigurability take up substantial space on the chip. An ERCGA must have switching transistors to direct signals and storage transistors to control those switches, where a non-reconfigurable chip just has a metal trace, and can put those transistors to use as logic. The regularity required for a reconfigurable chip also means that some resources will go unused in real designs, since placement and routing of regular logic structures are never able to use 100% of the available gates. These factors combine to make ERCGAs have about one tenth the logic capacity of non-reconfigurable chips. In actual current practice, the highest gate capacity claimed for an ERCGA is 9,000 gates (Xilinx XC3090). Actual semi-custom integrated circuits fabricated with similar technology offer over 100,000 gate logic capacity (Motorola).

Second, it is well known that real digital systems are built with many integrated circuits, typically ten to one hundred or more, often on many printed circuit boards. If an ERCGA did have as much logic capacity as the largest integrated circuit, it would still take many such chips to realize most digital systems. Since it does not, still more are required.

Consequently, for a Realizer system to have the logic capacity of even a single large-scale chip, it should have many ERCGAs, on the order of ten. To have the capacity for a system of such chips, on the order of hundreds of ERCGAs are required. Note that this is true regardless of the specific fabrication capabilities. If a fabrication process can double the capacity of ERCGAs by doubling the number of transistors per chip, then non-reconfigurable chip capacities and therefore overall design sizes will double, as well.

For these reasons, to build a useful Realizer system, it is necessary to be able to interconnect hundreds of ERCGAs in an electronically reconfigurable way, and to convert designs into configurations for hundreds of ERCGAs. This invention does not cover the technology of any ERCGA itself, only the techniques for building a Realizer system out of many ERCGAs.

ERCGA technology does not show how to build a Realizer system, because the problems are different. ERCGA technology for reconfigurably interconnecting logic elements which are all part of one IC chip does not apply to interconnecting many. ERCGA interconnections are made simply by switching transistors that pass signals in either direction. Since there are no barriers across one chip, there are a large number of paths available for interconnections to take. Since the chip is small, signal delays are small. Interconnecting many ERCGAs is a different problem, because IC package pins and printed circuit boards are involved. The limited number of pins available means a limited number of paths for interconnections. Sending signals onto and off of chips must be done through active (i.e. amplifying) pin buffers, which can only send signals in one direction. These buffers and the circuit board traces add delays which are an order of magnitude greater than the on-chip delays. The Realizer system's interconnection technology solves these problems in a very different way than the ERCGA.

Finally, the need to convert a design into configurations for many chips is not addressed by ERCGA technology. The Realizer system's interconnect is entirely different than that inside an ERCGA, and an entirely different method of determining and configuring the interconnect is required.

ERCGAs are made with the fastest and densest silicon technology available at any given time. (1989 Xilinx XC3000 LCAs are made in 1 micron SRAM technology.) That is the same technology as the fastest and densest systems to be realized. Because ERCGAs are general and have reconfigurable interconnections, they will always be a certain factor less dense than contemporary gate arrays and custom chips. Realizer systems repeat the support for generality and reconfigurability above the ERCGA level. Therefore, a Realizer system is always a certain factor, roughly one order of magnitude, less dense than the densest contemporary systems. Board-level Realizer systems realize gate arrays, box-level Realizer systems realize boards and large custom chips, and rack-level Realizer systems realize boxes.

Design architectures are strongly affected by the realities of packaging. I/O pin width: at the VLSI chip level, 100 I/O pins is easily built, 200 pins are larger but not uncommon, and 400 pins is almost unheard of. At the board level, these figures roughly double. Logic densities: boards often accommodate 5 VLSI chips, 10 is possible, and 20 is unusual, simply because practical boards are limited to about 200 square inches maximum. Boxes accommodate 10 to 20 boards, rarely 40. Interconnect densities: modules may be richly interconnected on chips and boards, as several planes of two-dimensional wiring are available, but less so at the box level and above, as backplanes are essentially one-dimensional.

These packaging restrictions have a strong effect on system architectures that should be observed in effective Realizer systems. Because of the lower density in a Realizer system, a single logic chip will usually be realizing only a module in the realized design. A one-board logic chip complex will be realizing a VLSI chip or two, a box of Realizer boards will realize a single board in the design, and a rack of boxes will realize the design's box of boards.

Thus, a Realizer system's board-level logic and interconnect complex needs to have as much logic and interconnect capacity and I/O pin width as the design's VLSI chip. The Realizer system's box needs as much as the design's board, and the Realizer system's rack needs as much as the design's box.

BRIEF DESCRIPTION OF THE DRAWINGS

FIGS. 4 and 4A are schematic block diagrams of a crossbar interconnect system.

FIG. 9 is a schematic block diagram of a tri-state net.

FIG. 10 is a schematic block diagram of a sum-of-products equivalent to the tri-state net of FIG. 9.

FIGS. 11a and 11b are schematic block diagrams of "floating low" and "floating high" sum of products networks.

FIGS. 47a, 47b and 47c illustrate a simple net interconnection.

DETAILED DESCRIPTION

TABLE OF CONTENTS

Figure 1:
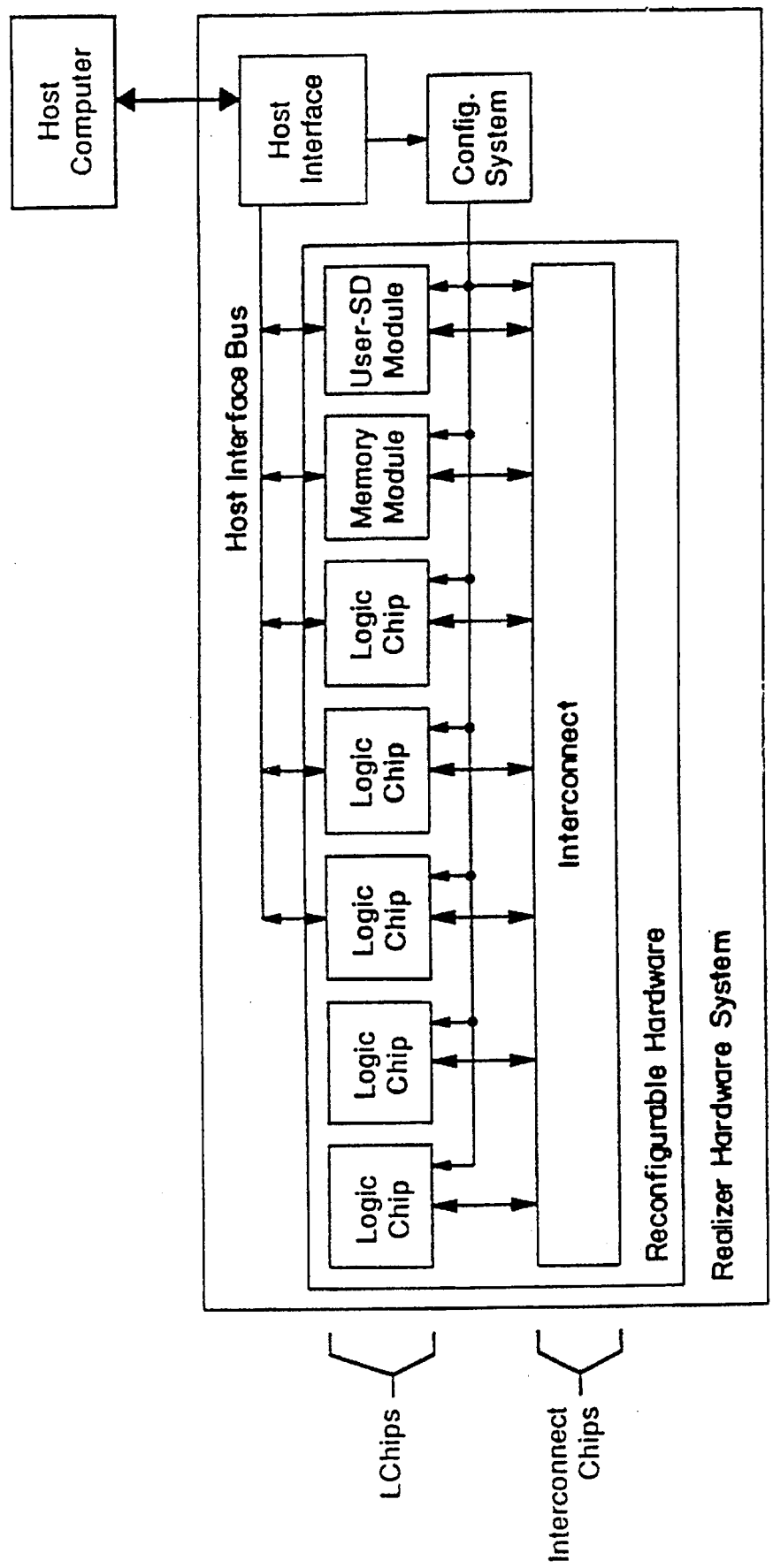
FIG. 1 is a schematic block diagram of a Realizer hardware system.

1. Realizer Hardware System
   1.1 Logic and Interconnect Chip Technology
   1.2 Interconnect Architecture
      1.2.1 Nearest-Neighbor Interconnects
      1.2.2 Crossbar Interconnects
      1.2.3 Interconnecting Tri-State Nets
      1.2.4 System-Level Interconnect
   1.3 Special-Purpose Elements
      1.3.1 Design Memory
      1.3.2 Stimulus/Response
      1.3.3 User-Supplied Devices
   1.4 Configuration
   1.5 Host Interface 2. Realizer Design Conversion System
  2.1 Design Reader
  2.2 Primitive Conversion
  2.3 Partitioning
  2.4 Netlisting & Interconnection
3. Realizer Applications
  3.1 Realizer Logic Simulation System
    3.1.1 Logic Sim. Stimulus & Response Translation System
    3.1.2 Logic Simulation Operating Kernel
    3.1.3 Using the Realizer Logic Simulation System
    3.1.4 Realization of More Than Two States
    3.1.5 Realizer Representation of Delay
    3.1.6 Transferring State From a Realizer Sim. into Another Sim.
  3.2 Realizer Fault Simulation System
  3.3 Realizer Logic Simulator Evaluation System
  3.4 Realizer Prototyping System
    3.4.1 Realizer Virtual Instruments
  3.5 Realizer Execution System
  3.6 Realizer Production System
  3.7 Realizer Computing System
4. Preferred Embodiment
  4.1 Hardware
  4.2 Software 1 Realizer Hardware System The Realizer hardware system (FIG. 1) consists of:

1) A set of Lchips, consisting of:
  1) At least two logic chips (normally tens or hundreds).
  2) Optionally, one or more special-purpose elements, such as memory modules and user-supplied device modules.
2) A configurable interconnect, connected to all LChip interconnectable I/O pins.
3) A host interface, connected to the host computer, the configuration system, and to all devices which can be used by the host for data input/output or control.
4) A configuration system, connected to the host interface, and to all configurable Lchip and interconnect devices.

This hardware is normally packaged in the form of logic boards, boxes and racks, and is connected to and is operated under the control of the host computer.

1.1 Logic & Interconnect Chip Technology 1.1.1 Logic Chip Devices

For a device to be useful as a Realizer logic chip, it should be an electronically reconfigurable gate array (ERCGA):

1) It should have the ability to be configured according to any digital logic network consisting of combinational logic (and optionally storage), subject to capacity limitations.
2) It should be electronically reconfigurable, in that its function and internal interconnect may be configured electronically any number of times to suit many different logic networks.
3) It should have the ability to freely connect I/O pins with the digital network, regardless of the particular network or which I/O pins are specified, to allow the Realizer system partial crossbar or direct interconnect to successfully interconnect logic chips.

An example of a reconfigurable logic chip which is suitable for logic chips is the Logic Cell Array (LCA) ("The Programmable Gate Array Handbook", Zilinx, Inc., San Jose, Calif, 1989). It is manufactured by Xilinx, Inc., and others. This chip consists of a regular 2-dimensional array of Configurable Logic Blocks (CLBs), surrounded by reconfigurable I/O Blocks (IOBs), and interconnected by wiring segments arranged in rows and columns among the CLBs and IOBs. Each CLB has a small number of inputs, a multi-input combinational logic network, whose logic function can be reconfigured, one or more flip-flops, and one or more outputs, which can be linked together by reconfigurable interconnections inside the CLB. Each IOB can be reconfigured to be an input or output buffer for the chip, and is connected to an external I/O pin. The wiring segments can be connected to CLBs, IOBs, and each other, to form interconnections among them, through reconfigurable pass transistors and interconnect matrices. All reconfigurable features are controlled by bits in a serial shift register on the chip. Thus the LCA is entirely configured by shifting in the "configuration bit pattern", which takes between 10 and 100 milliseconds. Xilinx 2000 and 3000-series LCAs have between 64 and 320 CLBs, with between 56 and 144 IOBs available for use.

The LCA netlist conversion tool (described below) maps logic onto CLBs so as to optimize the interconnections among CLBs and IOBs. The configurability of interconnect between CLBs and the I/O pins gives the LCA the ability to freely connect I/O pins with the digital network, regardless of the particular network or which I/O pins are specified. The preferred implementation of the Realizer system uses LCA devices for its logic chips.

Another type of ERCGA which is suitable for logic chips is the ERA, or electrically reconfigurable array. A commercial example is the Plessey ERA60K-type device. It is configured by loading a configuration bit pattern into a RAM in the part. The ERA is organized as an array of two-input NAND gates, each of which can be independently interconnected with others according to values in the RAM which switch the gates' input connections to a series of interconnection paths. The ERA60100 has about 10,000 NAND gates. I/O cells on the periphery of the array are used to connect gate inputs and/or outputs to external I/O pins. The ERA netlist conversion tool maps logic onto the gates so as to optimize the interconnections among them, and generates a configuration bit pattern file, as described below. The configurability of interconnect between gates and the I/O cells gives the ERA the ability to freely connect I/O pins with the digital network, regardless of the particular network, or which I/O pins are specified.

Still another type of reconfigurable logic chip which could be used as a logic chip is the EEPLD, or electrically erasable programmable logic device ("GAL Handbook", Lattice Semiconductor Corp., Portland, Oreg., 1986). A commercial example is the Lattice Generic Array Logic (GAL). It is configured by loading a bit pattern into the part which configures the logic. The GAL is organized as a sum-of-products array with output flip-flops, so it is less generally configurable than the Xilinx LCA. It offers freedom of connection of I/O pins to logic only among all input pins and among all output pins, so it partially satisfies that requirement. It is also smaller, with 10 to 20 I/O pins. It can, however, be used as a Realizer logic chip.

Additional details on programmable logic chips can be found in U.S. Pat. Nos. 4,642,487, 4,700,187, 4,706,216, 4,722,084, 4,724,307, 4,758,985, 4,768,196 and 4,786,904 the disclosures of which are incorporated herein by reference.

1.1.2 Interconnect Chip Devices

Interconnect chips include crossbar chips, used in full and partial crossbar interconnects, and routing chips, used in direct and channel-routed interconnects. For a device to be useful as a Realizer interconnect chip:

1) It should have the ability to establish many logical interconnections between arbitrarily chosen groups of I/O pins at once, each interconnection receiving logic signals from its input I/O pin and driving those signals to its output I/O Pin(s).
2) It should be electronically reconfigurable, iin that its interconnect is defined electronically, and may be redefined to suit many different designs.
3) If a crossbar summing technique is used to interconnect tri-state nets in the partial crossbar interconnect, it should be able to implement summing gates. (If not, other tri-state techniques are used, as discussed in the tri-state section.)

The ERCGA devices discussed above, namely the LCA, the ERA and the EEPLD, satisfy these requirements, so they may be used as interconnect chips. Even though little or no logic is used in the interconnect chip, the ability to be configured into nearly any digital network includes the ability to pass data directly from input to output pins. The LCA is used for crossbar chips in the preferred implementation of the Realizer system.

Crossbar switch devices, such as the TI 74AS8840 digital crossbar switch (SN74AS8840 Data Sheet, Texas Instruments, Dallas, Tex., 1987), or the crosspoint switch devices commonly used in telephone switches, may be used as interconnect chips. However, they offer a speed of reconfiguration comparable to the speed of data transfer, as they are intended for applications where the configuration is dynamically changing during operation. This is much faster than the configuration speed of the ERCGA devices. Consequently, such devices have higher prices and lower capacities than the ERCGAs, making them less desirable Realizer interconnection chips.

1.1.3 ERCGA Configuration Software

The configuration bit patterns, which are loaded into an ERCGA to configure its logic according to a user's specifications, are impractical for the user to generate on his own. Therefore, manufacturers of ERCGA devices commonly offer netlist conversion software tools, which convert logic specifications contained in a netlist file into a configuration bit pattern file.

The Realizer design conversion system uses the netlist conversion tools provided by the ERCGA vendor(s). Once it has read in the design, converted it, partitioned it into logic chips, and determined the interconnect, it generates netlists for each logic and interconnect chip in the Realizer hardware. The netlist file is a list of all primitives (gates, flip-flops, and I/O buffers) and their interconnections which are to be configured in a single logic or interconnect chip.

The Realizer design conversion system applies the ERCGA netlist conversion tool to each netlist file, to get a configuration file for each chip. When different devices are used for logic chips and interconnect chips, the appropriate tool is used in each case. The configuration file contains the binary bit patterns which, when loaded into the ERCGA device, will configure it according to the netlist file's specifications. It then collects these files into a single binary file which is permanently stored, and used to configure the Realizer system for the design before operation. The Realizer design conversion system conforms to the netlist and configuration file formats defined by the ERCGA vendor for its tool.

1.1.4 Netlist Conversion Tools

Since the preferred implementation of the Realizer system uses LCAs for logic and crossbar chips, the Xilinx LCA netlist conversion tool and its file formats are described here. Other ERCGA netlist conversion tools will have similar characteristics and formats.

Xilinx's LCA netlist conversion tool (XACT) takes the description of a logic network in netlist form and automatically maps the logic elements into CLBs. This mapping is made in an optimal way with respect to I/O pin locations, to facilitate internal interconnection. Then the tool works out how to configure the logic chip's internal interconnect, creating a configuration file as its output result. The LCA netlist conversion tool only converts individual LCAs, and fails if the logic network is too large to fit into a single LCA.

The Xilinx LCA netlist file is called an XNF file. It is an ASCII text file, containing a set of statements in the XNF file for each primitive, specifying the type of primitive, the pins, and the names of nets connected to those pins. Note that these nets are interconnections in the LCA netlist, connecting LCA primitives, not the nets of the input design. Some nets in the XNF file directly correspond to nets of the input design as a result of design conversion, others do not.

For example, these are the XNF file primitive statements which specify a 2-input XOR gate, named 'I__1781', whose input pins are connected to nets named 'DATA0' and 'INVERT', and whose output pin is connected to a net named 'RESULT':

SYM,I__1781,XOR
PIN,O,O,RESULT
PIN,1,I,DATA0
PIN,0,I,INVERT
END

Input and output I/O pin buffers (BUF, for input, and OBUF, for output) are specified in a similar way, with the addition of a statement for specifying the I/O pin. These are the primitive statements for the OBUF which drives net 'RESULT' onto I/O pin 'P57', via a net named 'RESULT__D':

SYM,IA__1266, OBUF
PIN,O,O,RESULT_D
PIN,I,I,RESULT
END
EXT,RESULT_D,O,,LOC=P57

The Xilinx LCA configuration file is called an RBT file. It is an ASCII text file, containing some header statements identifying the part to be configured, and a stream of '0's and '1's, specifying the binary bit pattern to be used to configure the part for operation.

1,2 Interconnect Architecture

Since in practice, many logic chips must be used to realize a large input design, the logic chips in a Realizer system are connected to a reconfigurable interconnect, which allows signals in the design to pass among the separate logic chips as needed. The interconnect consists of a combination of electrical interconnections and/or interconnecting chips. To realize a large design with the Realizer system, hundreds of logic chips, with a total of tens of thousands of I/O pins, must be served by the interconnect.

An interconnect should be economically extensible as system size grows, easy and reliable to configure for a wide variety of input designs, and fast, minimizing delay between the logic chips. Since the average number of pins per net in real designs is a small number, which is independent of design size, the size and cost of a good interconnect should increase directly as the total number of logic chip pins to be connected increases. Given a particular logic chip capacity, the number of logic chips, and thus the number of logic chip pins, will go up directly as design capacity goes up. Thus the size and cost of a good interconnect should also vary directly with the design capacity.

Two classes of interconnect architectures are described: Nearest-neighbor interconnects are described in the first section, and Crossbar interconnects are described in the following section. Nearest-neighbor interconnects are organized with logic chips and interconnect intermixed and arranged according to a surface of two, three or more dimensions. They extend the row-and-column organization of a gate array chip or printed circuit board into the organization of logic chips. Their configuration for a given input design is determined by a placement and routing process similar to that used when developing chips and boards. Crossbar interconnects are distinct from the logic chips being interconnected. They are based on the many-input-to-many-output organization of crossbars used in communications and computing, and their configuration is determined in a tabular fashion.

Nearest-neighbor interconnects grow in size directly as logic capacity grows, but as routing pathways become congested large interconnects become slow and determining the configuration becomes difficult and unreliable. Pure crossbars are very fast because of their directness and are very easy to configure because of their regularity, but they grow to impractical size very quickly. The partial crossbar interconnect preserves most of the directness and regularity of the pure crossbar, but it only grows directly with design capacity, making it an ideal Realizer interconnect. While practical Realizer systems are possible using the other interconnects shown, the partial crossbar is used in the preferred implementation, and its use is assumed through the rest of this disclosure.

1.2.1 Nearest-Neighbor Interconnects

1.2.1.1 Direct Interconnects

In the direct interconnect, all logic chips are directly connected to each other in a regular array, without the use of interconnect chips. The interconnect consists only of electrical connections among logic chips. Many different patterns of interconnecting logic chips are possible. In general, the pins of one logic chip are divided into groups. Each group of pins is then connected to another logic chip's like group of pins, and so forth, for all logic chips. Each logic chip only connects with a subset of all logic chips, those that are its nearest neighbors, in a physical sense, or at least in the sense of the topology of the array.

All input design nets that connect logic on more than one logic chip either connect directly, when all those logic chips are directly connected, or are routed through a series of other logic chips, with those other logic chips taking on the function of interconnect chips, passing logical signals from one I/O pin to another without connection to any of that chip's realized logic. Thus, any given logic chip will be configured for its share of the design's logic, plus some interconnection signals passing through from one chip to another. Non-logic chip resources which cannot fulfill interconnection functions, are connected to dedicated logic chip pins at the periphery of the array, or tangentially to pins which also interconnect logic chips.

Figure 2:
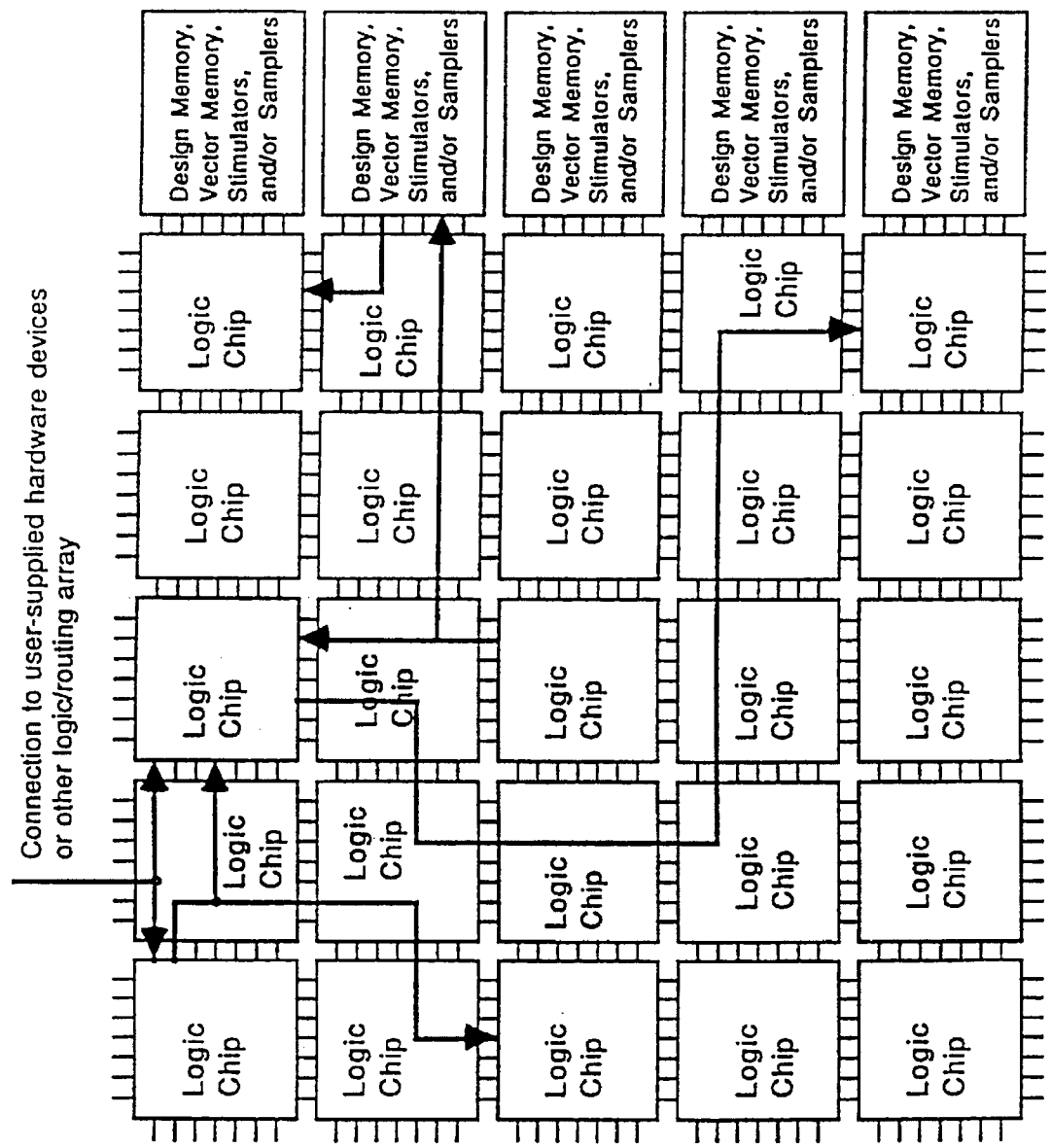
FIG. 2 is a schematic block diagram of a direct interconnect system.

A specific example, shown in FIG. 2, has logic chips laid out in a row-and-column 2-dimensional grid, each chip having four groups of pins connected to neighboring logic chips, north, south, east, and west, with memory, I/O and user-supplied devices connected at the periphery.

This interconnect can be extended to more dimensions, beyond this two-dimensional example. In general, if 'n' is the number of dimensions, each logic chip's pins are divided into 2*n groups. Each logic chip connects to 2*n other logic chips in a regular fashion. A further variation is similar, but the sizes of the pin groups are not equal. Depending on the number of logic chips and the numbers of pins on each one, a dimension and set of pin group sizes is chosen that will minimize the number of logic chips intervening between any two logic chips while providing enough interconnections between each directly enighboring pair of chips to allow for nets which span only those two chips. Determining how to configure the logic chips for interconnect is done together with determining how to configure them for logic. To configure the logic chips:

1) Convert the design's logic into logic chip primitive form, as described in the primitive conversion section.

2) Partition and place the logic primitives in the logic chips. In addition to partitioning the design into sub-networks which each fit with in a logic chip's logic capacity, the sub-networks should be placed with respect to each other so as to minimize the amount of interconnect required. Use standard partitioning and placement tool methodology, such as that used in a gate-array or standard-cell chip automatic partitioning and placement tool ("Gate Station Reference Manual", Mentor Graphics Corp., 1987), to determine how to assign logic primitives to logic chips so as to accomplish the interconnect. Since that is a well-established methodology, it is not described further here.

3) Route the interconnections among logic chips, that is, assign them to specific logic chips and I/O pin interconnections, using standard routing tool methodology, such as that used in a gate-array or standard-cell chip automatic routing tool ("Gate Station Reference Manual", Mentor Graphics Corp., 1987), to determine how to configure the chips so as to accomplish the interconnect. Since that is a well-established methodology as well, it is not described further here, except in terms of how it is applied to the interconnection problem. The array of logic chips is treated with the same method as a single large gate array or standard-cell chip, with each partitioned logic sub-network corresponding to a large gate array logic macro, and the interconnected logic chip I/O pins defining wiring channels available for routing. Specifically, therea re as many channels in each routing direction as there are pins in each group of interconnected logic chip I/O pins. Since there are many possibilities for interconnection through the logic chips, the routing is not constrained to use the same channel at each end, with the same method as when many routing layers remove channel constraints in a gate array.

4) If it is not possible to accomplish an interconnect, due to routing congestion (unavailability of routing channels at some point during the routing process), the design is re-partitioned and/or re-placed using adjusted criteria to relieve the congestion, and interconnect is attempted again.

5) Convert the specifications of which nets occupy which channels into netlist files for the individual logic chips and specific pin assignments for the logic chip signals, according to the correspondence between specific routing channels and I/O pins. Issue these specifications in the form of I/O pin specifications and logic chip internal interconnections, along with the specifications of logic primitives, to the netlist file for each logic chip.

6) Use the logic chip netlist conversion tool to generate configuration files for each logic chip, and combine them into the final Realizer configuration file for the input design.

1.2.1.2 Channel-Routing Interconnects

The channel-routing interconnect is a variation of the direct interconnect, where the chips are divided into some which are not used for logic, dedicated only to accomplishing interconnections, thus becoming interconnect chips, and the others are used exclusively for logic, remaining logic chips. In particular, logic chips are not directly interconnected to each other, but instead connect only to interconnect chips. In all other respects, the channel-routing interconnect is composed according to the direct interconnect method. Nets which span more than one logic chip are interconnected by configuring a series of interconnect chips, called routing chips, that connect to those logic chips and to each other, such that logical connections are established between the logic chip I/O pins. It is thus used as a configurable 'circuit board'.

Figure 3:
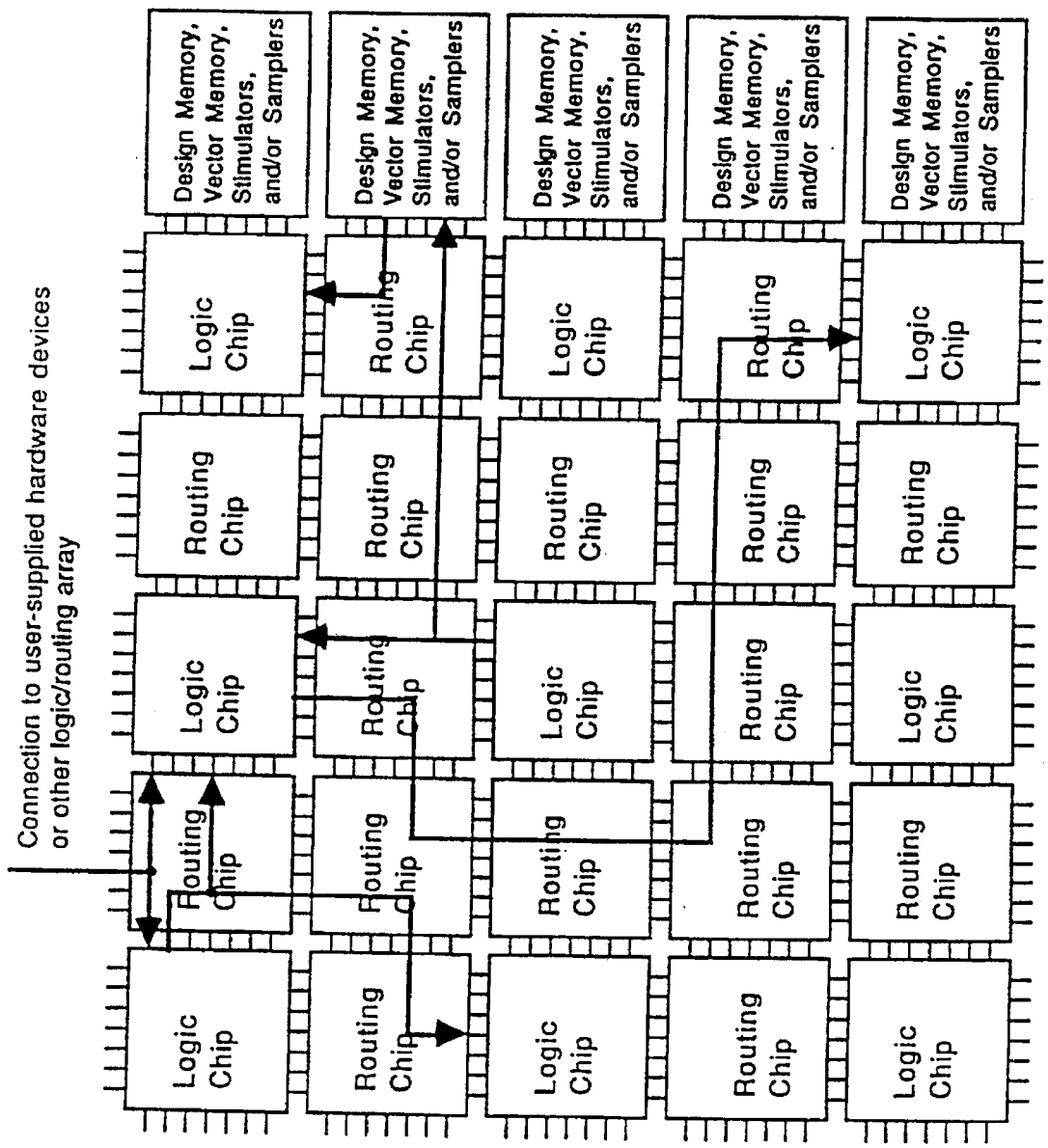
FIG. 3 is a schematic block diagram of channel-routing interconnect system.

One example of a channel-routing interconnect is two-dimensional: logic chips are arranged in a row-and-column manner, completely surrounded by routing chips, as shown in FIG. 3. The array is made up of rows entirely composed of routing chips alternating with rows composed of alternating logic and routing chips. In this way, there are unbroken rows and columns of routing chips, surrounding the logic chips. The pins of each chip are broken into four groups, or edges, named "north, east, south and west." The pins of each chip are connected to its four nearest neighbors in a grid-wise fashion: north pins connected with the northern neighbor's south pins, east pins connected with the eastern neighbor's west pins, and so forth.

This model can be extended to more dimensions, beyond the two-dimensional example given above. In general, if 'n' is the number of dimensions, each logic chip's pins are divided into $2*n$ groups. Each logic chip connects to $2*n$ neighbors. There are $(2**n-1)$ routing chips for each logic chip at the center of the array.

Generalizations of this channel-routing model are used as well, based on the distinction between logic and routing chips. The pins of the logic chips can be broken into any number of groups. The pins of the routing chips can be broken into any number of groups, which need not be the same number as that of the logic chip groups. The logic chips and routing chips need not have the same number of pins. These variations are applied so long as they result in a regular array of logic and routing chips, and any given logic chip only connects with a limited set of its nearest neighbors.

Determining how to configure the interconnect chips is done together with determining how to configure the logic chips, with the same method used for the direct interconnect, with the exception that interconnections between logic chips are only routed through interconnect chips, not through logic chips.

A net's logical signal passes through as many routing chips as are needed to complete the interconnection. Since each routing chip delays the propagation of the signal, the more routing chips a signal must pass through, the slower the signal's propagation delay time through the interconnect. It is desirable in general to partition the logic design and place the partitions onto specific logic chips in such a way as to minimize the routing requirements. If it is not possible to accomplish an interconnect, due to routing congestion, the design is re-partitioned and/or re-placed using adjusted criteria to relieve the congestion, and interconnect is attempted again. This cycle is repeated as long as necessary to succeed.

1.2.2 Crossbar Interconnects
1.2.2.1 Full Crossbar Interconnect

The crossbar is an interconnection architecture which can connect any pin with any other pin or pins, without restriction. It is used widely for communicating messages in switching networks in computers and communication devices. An interconnect organized as a full crossbar, connected to all logic chip pins and able to be configured into any combination of pin interconnections, accomplishes the interconnect directly for any input design and logic chip partitioning, since it could directly connect any pin with any other. Unfortunately, these is no practical single device which can interconnect a number of logic chips. The logic board of the preferred embodiment, for example, has 14 logic chips with 128 pins each to be connected, for a total of 1792 pins, far beyond the capability of any practical single chip. It is possible to construct crossbars out of a collection of practical interconnect chips, devices which can be configured to implement arbitrary interconnections among their I/O pins. In the context of crossbar interconnects, they are also called crossbar chips.

Figure 4:
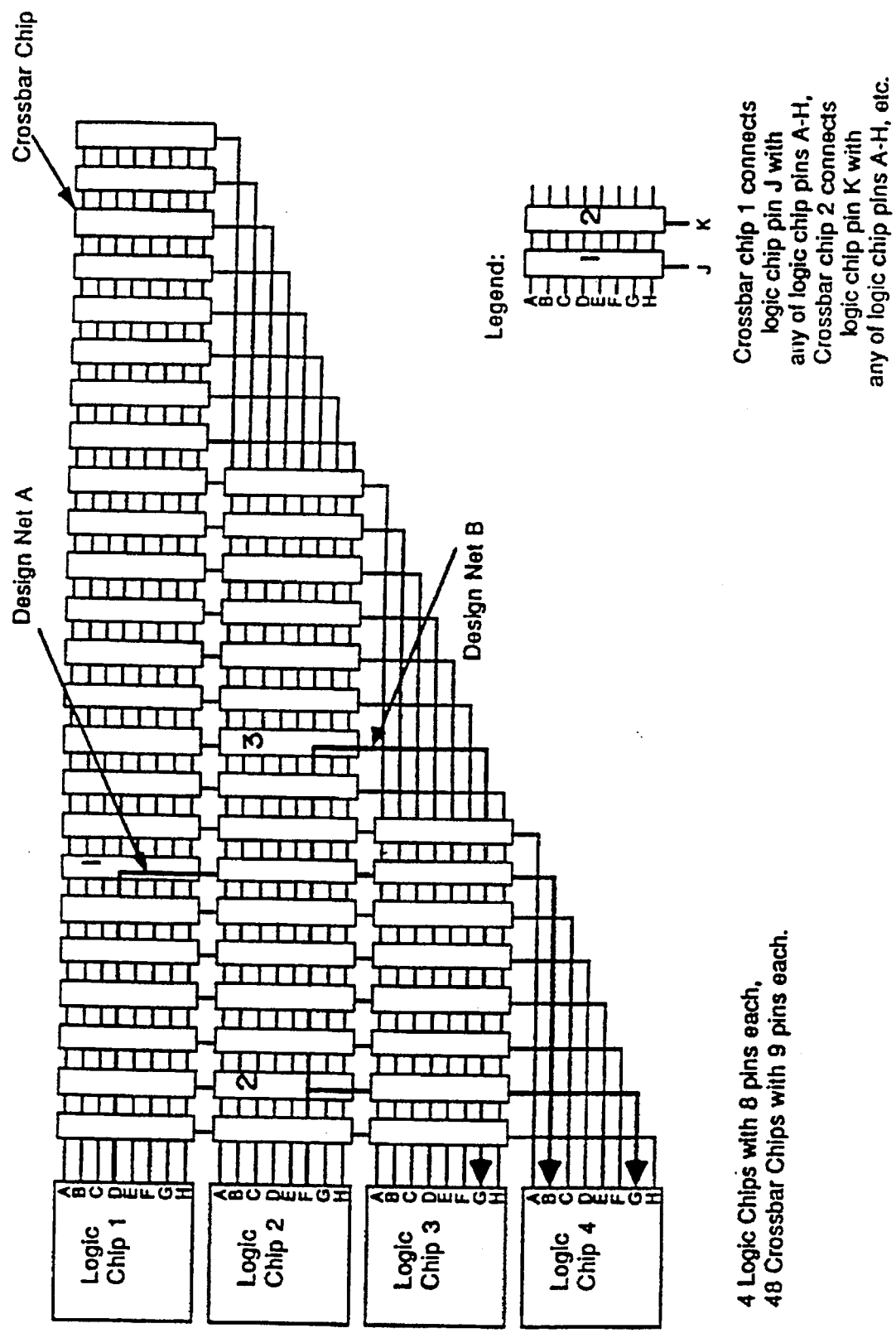

A general method of constructing a crossbar interconnect out of practical crossbar chips is to use one crossbar chip to interconnect one logic chip pin with as many other logic chip pins as the crossbar chip has pins. FIG. 4 shows an example, extremely simplified for clarity. Four logic chips, with eight pins each, are to be interconnected. Crossbar chips with nine pins each are used. The left-most column of three crossbar chips connects logic chip 4's pin H with pins of logic chip 1, 2 and 3. The next column connects pin G, and so on to pin G of logic chip 4. There is no need to connect a logic chip pin with other pins on the same logic chip, as that would be connected internally. The next eight columns of crossbar chips interconnect logic chip 3 with logic chips 1 and 2. Logic chip 4 is not included because its pins are connected to logic chip 3's pins by the first eight columns of crossbar chips. The final eight columns interconnect logic chips 1 and 2. A total of 48 crossbar chips are used.

Two nets from an input design are shown interconnected. Net A is driven by logic chip 1, pin D, and received by logic chip 4, pin B. The crossbar chip marked 1 is the one which connects to both of those pins, so it is configured to receive from chip 1, pin D and drive what it receives to chip 4, pin B, thus establishing the logical connection. Net B is driven by chip 2, pin F and received by chip 3, pin G and chip 4, pin G. Crossbar chip 2 makes the first interconnection, and crossbar chip 3 makes the second.

In general, the number of crossbar chips required can be predicted. If there are L logic chips, each with Pl pins, and crossbar chips, which each interconnect one logic chip pin with as many other logic chip pins as possible, have Px pins:

1) One pin of logic chip 1 must be connected to $(L-1)Pl$ pins on logic chips 2 through L. This will require $(L-1)Pl/(Px-1)$ crossbar chips. Connecting all pins will require $(L-1)Pl^2/(Px-1)$ crossbar chips.

2) Each pin of logic chip 2 must be connected to $(L-2)Pl$ pins on logic chips 3 through L. This will require $(L-2)Pl^2/(Px-1)$ crossbar chips.

3) Each pin of logic chip L-1 must be connected to Pl pins on logic chip L. This will require $Pl^2/(Px-1)$ crossbar chips.

4) $X=(L-1)Pl^2/(Px-1)+(L-2)Pl^2/(Px-1)+\ldots +Pl^2/(Px-1) =(L2-L)Pl^2/2(Px-1)$.

The number of crossbar chips, X, increases as the square of the number of logic chips times the square of the number of pins per logic chip. A crossbar interconnect for the preferred embodiment's logic board (14 logic chips with 128 pins each) would require 11648 crossbar chips with 129 pins each, or 23296 crossbar chips with 65 pins each. Crossbar interconnects are iompractically large and expensive for any useful Realizer system.

1.2.2.2 Full Crossbar-Net Interconnect

The size of a crossbar interconnect can be reduced by recognizing that the number of design nets to be interconnected can never exceed one half of the total number of logic chip pins. A crossbar-net interconnect is logically composed of two crossbars, each of which connects all logic chip pins with a set of connections, called interconnect nets (ICNs), numbering one half the total number of logic chip pins. Since a crossbar chip which connects a set of logic chip pins to a set of ICNs can also connect from them back to those pins (recalling the generality of interconnect chips), this interconnect is built with crossbar chips each connecting a set of logic chip pins with a set of ICNs.

Figures 5, 5A:
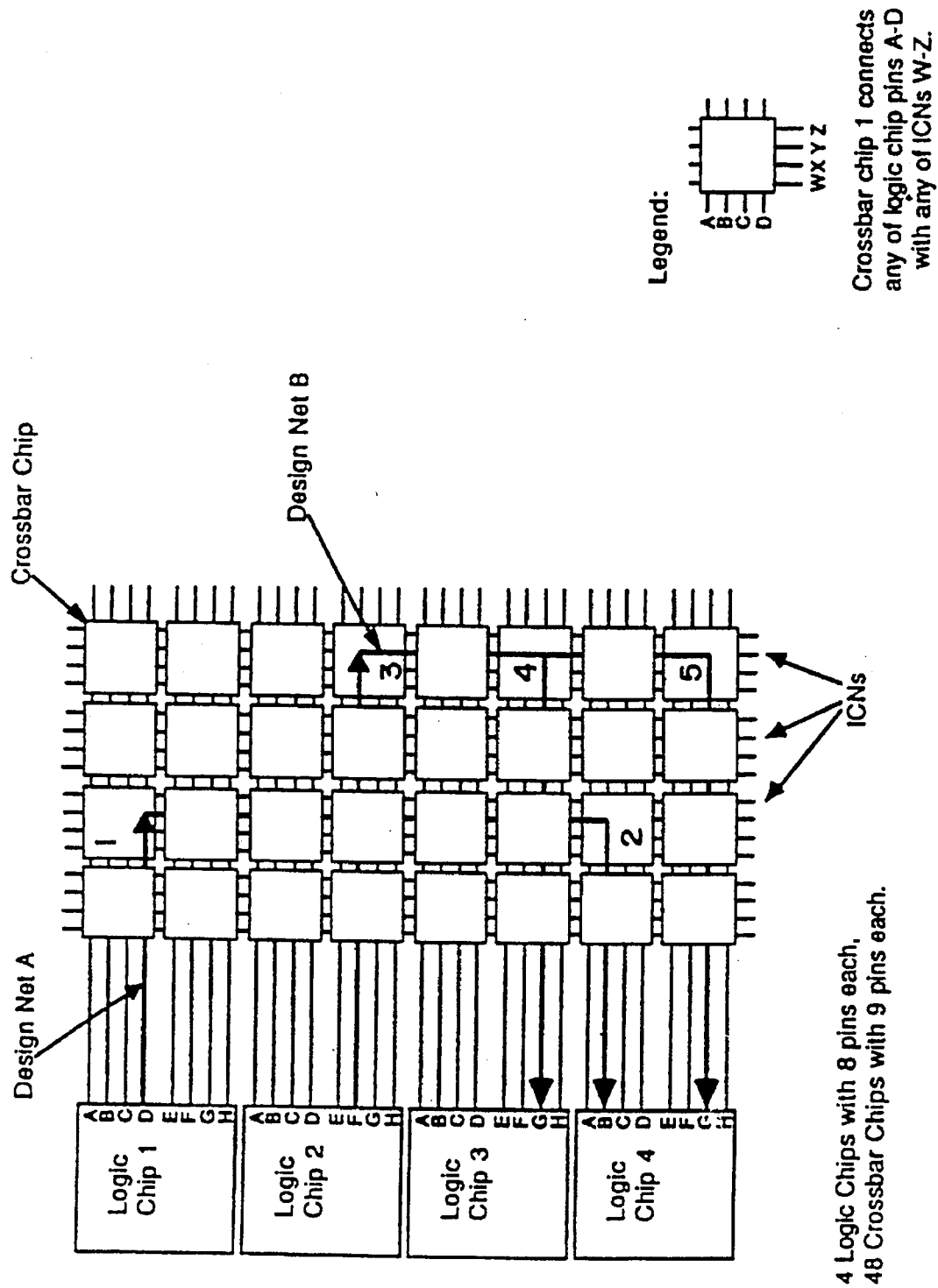
FIGS. 5 and 5A are schematic block diagrams of a crossbar-net interconnect system.

FIG. 5 shows an example, interconnecting the same four logic chips as in FIG. 4. Crossbar chips with eight pins each are used, and there are 16 ICNs. Each of the 32 crossbar chips connects four logic chip pins with four ICNs. Net A is interconnected by crossbar chip 1, configured to receive from chip 1, pin D and drive what it receives to an ICN, and by crossbar chip 2, which is configured to receive that ICN and drive chip 4, pin B, thus establishing the logical connection. Net B is driven by chip 2, pin F, connected to another ICN by crossbar chip 3, received by chip 3, pin G, via crossbar chip 4, and by chip 4, pin G, via crossbar chip 5.

A crossbar-net interconnect for the preferred embodiment's logic board (14 logic chips with 128 pins each) would require 392 crossbar chips with 128 pins each, or 1568 crossbar chips with 64 pins each. The crossbar-net interconnect uses fewer crossbar chips than the pure crossbar. Its size increases as the product of logic chips and total logic chip pins, which amounts to the square of the number of logic chips. This is better than the pure crossbar, but still not the direct scaling desired.

1.2.2.3 Partial Crossbar Interconnect

The logic chip itself can offer an additional degree of freedom which crossbars do not exploit, because it has the ability to be configured to use any of its I/O pins for a given input or output of the logic network it is being configured for, regardless of the particular network. That freedom allows the possibility of the partial crossbar interconnect, which is the reason it is specified in the definition of the logic chip.

In the partial crossbar interconnect, the I/O pins of each logic chip are divided into proper subsets, using the same division on each logic chip. The pins of each crossbar chip are connected to the same subset of pins from each of every logic chip. Thus, crossbar chip 'n' is connected to subset 'n' of each logic chip's pins. As many crossbar chips are used as there are subsets, and each crossbar chip has as many pins as the number of pins in the subset times the number of logic chips. Each logic chip/crossbar chip pair is interconnected by as many wires, called paths, as there are pins in each subset.

Since each crossbar chip is connected to the same subset of pins on each logic chip, an interconnection from an I/O pin in one subset of pins on one logic chip to an I/O pin in a different subset of pins on another logic chip cannot be configured. This is avoided by interconnecting each net using I/O pins from the same subset of pins on each of the logic chips to be interconnected, and configuring the logic chips accordingly. Since the logic chip can be configured to use any I/O pin may be assigned to the logic configured in a logic chip which is connected to a net, one I/O pin is as good as another.

Figure 6:
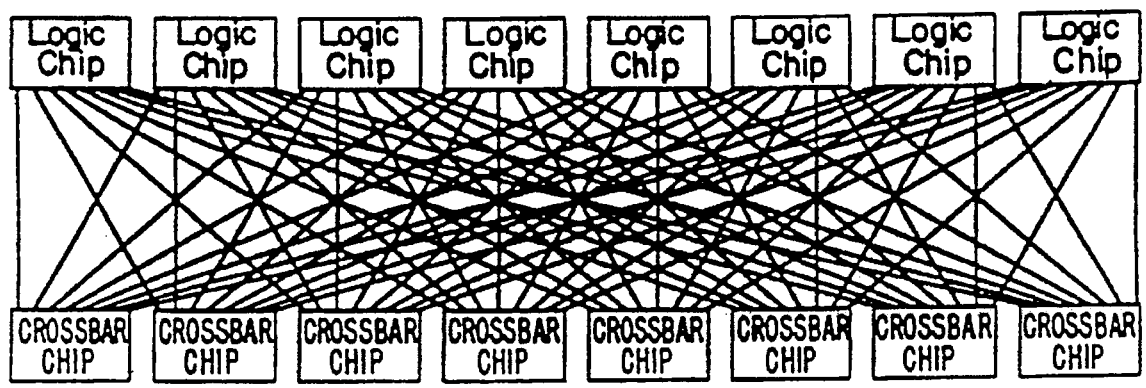
FIG. 6 is a schematic block diagram of a simple specific example of a partial crossbar interconnect system.

The general pattern is shown in FIG. 6. Each line connecting a logic chip and a crossbar chip in this figure represents a subset of the logic chip pins. Each crossbar chip is connected to a subset of the pins of every logic chip. Conversely, this implies that each logic chip is connected to a subset of the pins of every crossbar chip. The number of crossbar chips need not equal the number of logic chips, as it happens to in these examples. It does not in the preferred implementation.

Figure 7:
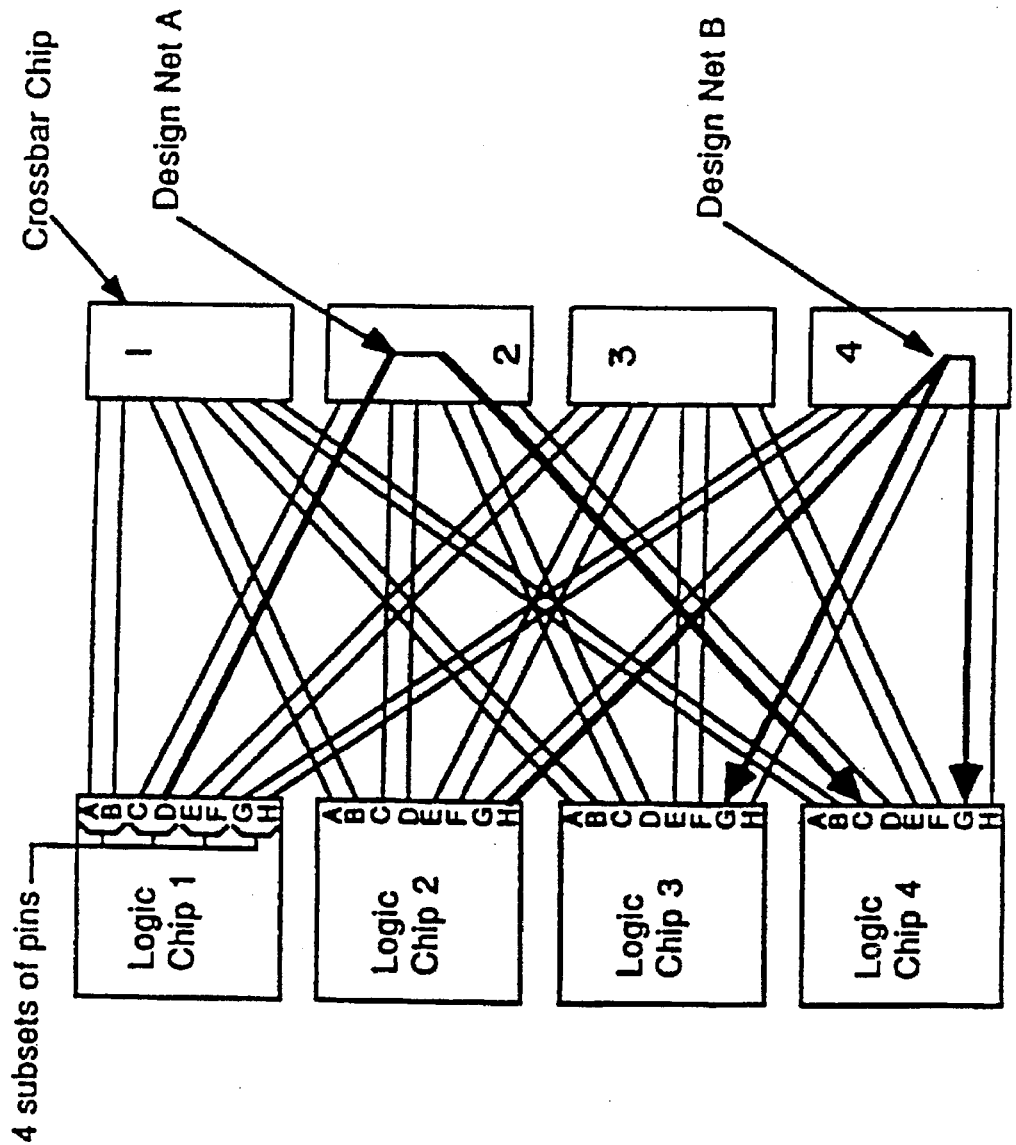
FIG. 7 is a schematic block diagram of a partial crossbar interconnect system.

FIG. 7 shows an example, interconnecting the same four logic chips as in FIGS. 1 and 2. Four crossbar chips with eight pins each are used. Each crossbar chip connects to the same two pins of each logic chip. Crossbar chip 1 is connected to pins A and B of each of logic chips 1 through 4. Crossbar chip 2 is connected to all pins C and D, chip 3 to all pins E and F, and chip 4 to all pins G and H.

Design net A was received on pin B of logic chip 4 in the previous examples, but there is no crossbar chip or chips which can interconnect this with the driver on pin D of logic chip 1. Since any I/O pin may be assigned to the logic configured in logic chip 4 which receives net A, pin C is as good as pin B, which may then be used for some other net. Consequently, net A is received by pin C instead, and the interconnection is accomplished by configuring crossbar chip 2. Design net B is received by chip 3, pin G, and by chip 4, pin G, but there is no crossbar chip or chips which can interconnect this with the driver on pin F of logic chip 2. Net B is driven by pin H instead, and the interconnection is accomplished by configuring crossbar chip 4.

The partial crossbar interconnect is used in the preferred embodiment. Its logic board consists of 14 logic chips, each with 128 pins, interconnected by 32 crossbar chips with 56 pins each. Logic chip pins are divided into 32 proper subsets of four pins each, and the pins of each crossbar chip are divided into 14 subsets of four pins each. Each logic chip/crossbar chip pair is interconnected by four paths, as crossbar chip 'n' is connected to subset 'n' of each logic chip's pins.

The partial crossbar uses the fewest crossbar chips of all crossbar interconnects. Its size increases directly as total number of logic chip pins increases. This is directly related to the number of logic chips and thus logic capacity, which is the desired result. It is fast, in that all interconnections pass through only one interconnect chip. It is relatively easy to use, since it is regular, its paths can be represented in a table, and determining how to establish a particular interconnect is simply a matter of searching that table for the best available pair of paths.

1.2.2.4 Capability of the Partial Crossbar Interconnect

Partial crossbar interconnects cannot handle as many nets as full crossbars can. The partial crossbar interconnect will fail to interconnect a net when the only I/O pins not already used for other nets on the source logic chip go to crossbar chips whose paths to the destination logic chip are likewise full. The destination may have pins available, but in such a case they go to other crossbars with full source pins, and there is no way to get from any of those crossbars to the first.

The capacity of a partial crossbar interconnect depends on its architecture. At one logical extreme, there would be only one logic chip pin subset, and one crossbar would serve all pins. Such an arrangement has the greatest ability to interconnect, but is the impractical full crossbar. At the other logical extreme, the subset size is one, with as many crossbar chips as there are pins on a logic chip. This will have the least ability to interconnect of all partial crossbars, but that ability could still be enough. In between are architectures where each crossbar chip serves two, three, or more pins of each logic chip. More interconnect ability becomes available as the crossbar chip count drops and the pin count per crossbar chip increases.

This variation derives from the fact, noted earlier, that there may be free logic chip pins which cannot be interconnected because they are served by different crossbar chips. The fewer and wider the crossbar chips, the less commonly this will crop up. The full crossbar can interconnect all pins in any pattern, by definition.

Figures 8A, 8B:
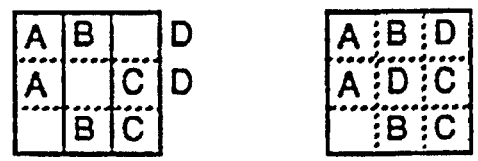
FIGS. 8a and 8b illustrate a difference in crossbar chip width.

As a simple example of the difference, suppose there are three logic chips, number 1, 2 and 3, with three pins each, and there are four nets, A, B, C and D. Net A connects logic chips 1 and 2, B connects 1 and 3, C connects 2 and 3, and D connects logic chips 1 and 2. In FIGS. 8a and 8b, the pins of each logic chip are shown as a row of cells, and each crossbar chip covers as many columns as the number of pins it serves.

In the first case (FIG. 8a), we use three crossbar chips, numbered 1, 2 and 3, which are each one pin wide. Each crossbar chip can only accommodate one net: crossbar chip 1 is programmed to interconnect net A, crossbar 2 connects net B, and crossbar chip 3 connects net C. Net D is left unconnected, even though there are free logic chip pins available. In the second case (FIG. 8b), a full crossbar which is three pins wide is used instead of crossbar chips 1, 2 and 3, and net D may be connected.

Analysis and computer modeling has been conducted on the number of input design nets which can be interconnected by different partial crossbar interconnect architectures. Results indicate that a narrow partial crossbar is nearly as effective as a wide one or even a full crossbar. For example, the interconnect used on the logic board in the preferred implementation (14 128-pin logic chips, 32 56-pin crossbar chips) showed 98% of the interconnect capacity that a full crossbar would have.

It is extremely rare for real input designs to demand the maximum available number of multi-logic-chip nets and logic chip pins, as was assumed in the modeling. Real designs will nearly always have fewer nets than the maximum possible, and fewer than the average number of nets connected by the partial crossbar in the above model, usually substantially fewer. This is insured by using a small proportion more logic chip pins and crossbar chips than would be absolutely necessary to support the logic capacity, thus insuring that real designs are nearly always interconnectable by a narrow partial crossbar.

Narrow crossbar chips are much smaller, and therefore less expensive, pin-for-pin, than wide ones. Since they offer nearly as much interconnectability, they are preferred. 1.2.3 Interconnecting Tri-State Nets An important difference between an active interconnect, such as the partial crossbar interconnect, and a passive one, such as actual wire, is that the active interconnect is unidirectional. Each interconnection actually consists of a series of drivers and receivers at the chip boundaries, joined by metal and traces. Normal nets have a single driver, and may be implemented with fixed drivers and receivers in the active interconnect. Some nets in actual designs are tri-state, with several tri-state drivers, as shown in FIG. 9.

At any given time, a maximum of one driver is active, and the others are presenting high impedance to the net. All receivers see the same logic level at all times (neglecting propagation delays).

1.2.3.1 Sum of Products Replaces Tri-State Net

If the entire net is partitioned into the same logic chip, the network may be replaced by a two-state sum of products, or multiplexer, equivalent, as shown in FIG. 10.

When there are no active enables, this network will output a logic low. Often tri-state nets are passively pulled high. When necessary, the sum of products is made to output a logic high when not enabled by inverting the data input to each AND, and inverting the final summing gate output. When more than one enable is active, the result is the sum (OR) of all inputs. This is acceptable, as the behavior of real tri-state drivers is undefined when more than one is enabled with different data. FIGS. 11a and 11b show both types of networks: "floating low" and "floating high."

The primitive conversion part of the Realizer system's design conversion system makes the sum or products substitution, because the Xilinx LCA, used for the logic and crossbar chips in the preferred implementation, does not support tri-state drive uniformly on all nets. Tri-state drivers are available on all I/O pins at the boundary of the LCA. A limited number of tri-state drivers are available internally in the XC3000 series LCAs, only on a small number of internal interconnects spaced across the chip, each of which serves only a single row of CLBs. Mapping tri-state nets onto those interconnects would add another constraint to partitioning, and could constrain the freedom of CLB placement on the LCA. At the same time, tri-state connections with a small number of drivers per net are common in some gate array library cells. Consequently, the sum of products substitution is made when possible to avoid these complexities.

Figure 12:
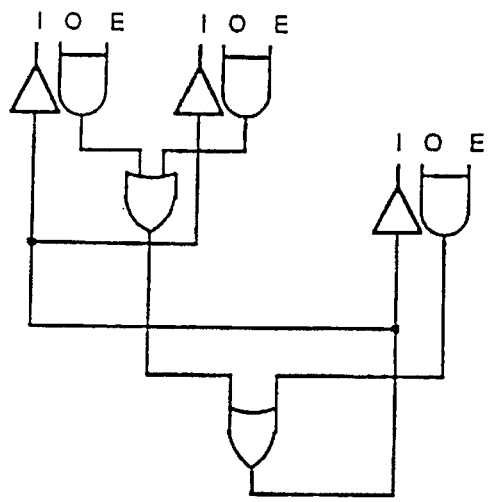
FIG. 12 is a schematic block diagram of drivers and receivers collected to minimize interconnect.

When a tri-state net has been split across more than one logic chip by the partitioning of the design into multiple logic chips, sums of products are used locally to reduce each logic chip's connection to the net to a single driver and/or receiver at the logic chip boundary. FIG. 12 shows two drivers and two receivers collected together. The two drivers are collected by a local sum of products, which then contributes to the overall sum of products, requiring only a single driver connection. Likewise, only a single receiver connection is distributed across two receivers.

Then the active interconnect comes into play. At any given point along a tri-state net, the "direction" of drive depends on which driver is active. While this makes no difference to a passive interconnect, an active interconnect must be organized to actively drive and receive in the correct directions. There are several configurations that accomplish this in the partial crossbar interconnect.

1.2.3.2 Logic Summing Configuration

Figure 13:
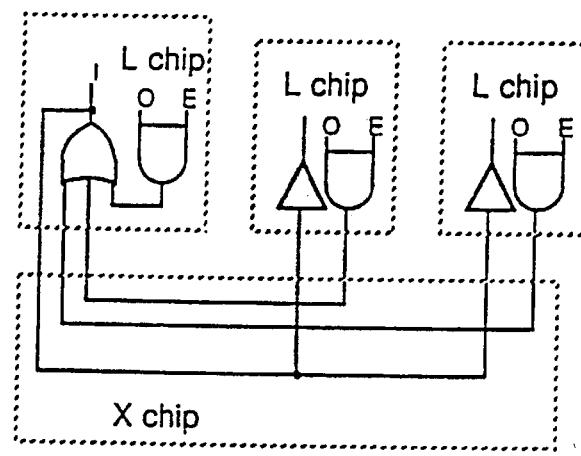
FIG. 13 is a schematic block diagram of a logic summing configuration.

Three configurations are based on reducing the net to a sum of products. The logic summing configuration places the summing OR gate in one of the logic chips involved, as shown in FIG. 13.

The AND gates which generate the products are distributed in the driving logic chips, each of which needs an output pin. Each receiving logic chip needs an input pin, and the summing logic chip, which is a special case, will need an input pin for each other driver and one output pin. These connections are all unidirectional, involving an OBUF/IBUF pair across each chip boundary. Since there is a higher pin cost for drivers, a driving logic chip should be chosen as the summing chip.

For the sake of clarity, not all LCA primitives involved are shown in these figures. The actual path from a driving input pin through to a receiving output pin includes a CLB and OBUF on the driver, an IBUF/OBUF on the crossbar, an IBUF, a CLB and an OBUF on the summing chip, another IBUF/OBUF on the crossbar, and an IBUF on the receiver. If we call the crossbar IBUF delay Ix, the logic CLB delay Cl, etc., the total datapath delay is Cl+Ol+Ix+Ox+Il+Cl+ Ol+Ix+Ox+Il. In a specific case, if the logic chip is an XC3090-70, and the crossbar is an XC2018-70, the maximum total delay is 82 ns, plus internal LCA interconnect delay. The same delay applies to the enable.

If an n-bit bus is to be interconnected, all enables will be the same for each bit of the bus. In this particular configuration, the product gates are in the driving logic chips, the enables stay inside, and the pins required for the bus are just n times that for one bit.

1.2.3.3 Crossbar Summing Configuration

Figure 14:
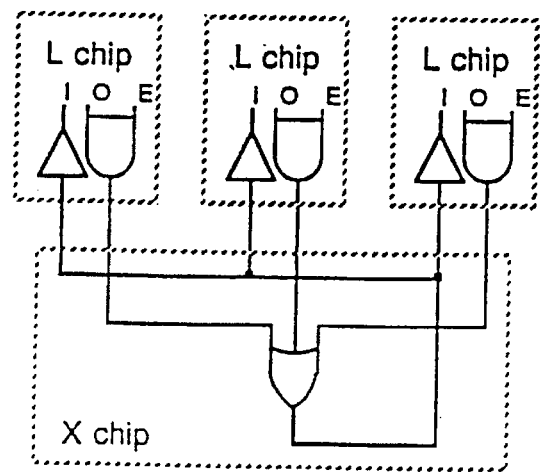
FIG. 14 is a schematic block diagram of a crossbar summing configuration.

In the crossbar summing configuration, the summing OR gate is placed on the crossbar chip, making use of the fact that the crossbar chips in some embodiments are implemented with ERCGAs, such as LCAs, which have logic available, as shown in FIG. 14.

Each logic chip needs one pin if it is a driver, and/or one pin if it is a receiver. The crossbar chip must have one or more logic elements for the summing gate. Crossbar summing deviates from the practice of putting all logic in the logic chips and none in the crossbar chips, but an important distinction is that the logic placed in the crossbar chip is not part of the realized design's logic. It is only logic which serves to accomplish the interconnection functionality of a tri-state net.

This configuration uses fewer pins that the previous one when there are more than two driving logic chips. An n-bit bus takes n times as many pins. Total delay is reduced: Cl+Ol+Ix+Cx+Ox+Il, or 51 ns max. The enable has the same delay.

1.2.3.4 Bidirectional Crossbar Summing Configuration

Figure 15:
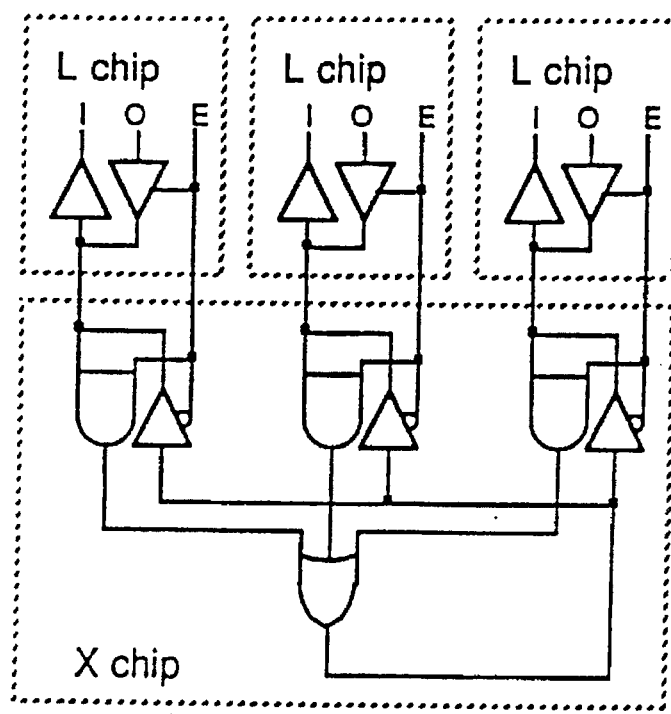
FIG. 15 is a schematic block diagram of a bidirectional crossbar summing configuration.

The summing gate on the crossbar chip is reached via bidirectional connections in the bidirectional crossbar summing configuration, shown in FIG. 15.

AND gates which allow only the enabled path into the OR gate are provided in the crossbar chip to block feedback latchup paths. A logic chip needs one pin if it is only a receiver, and two pins if it is a driver or both, one for the signal itself and one for the enable output, which is used by the crossbar chip. Reduced interconnect is possible for multi-bit busses by using a single enable for more than one bit. If more than one bit of the bus is interconnected through the same crossbar chip, only one set of enable signals need be provided to that chip. The total datapath delay is Ol+Ix+Cx+Ox+Il, or 42 ns in the preferred LCA embodiment. An additional Cs (10 ns) may be added if the sum of products takes more than one CLB. The enable delay will depend on the enable delay for the OBUFZ, El, instead of the output delay Ol.

1.2.3.5 Bidirectional Crossbar Tri-State Configuration

Figure 16:
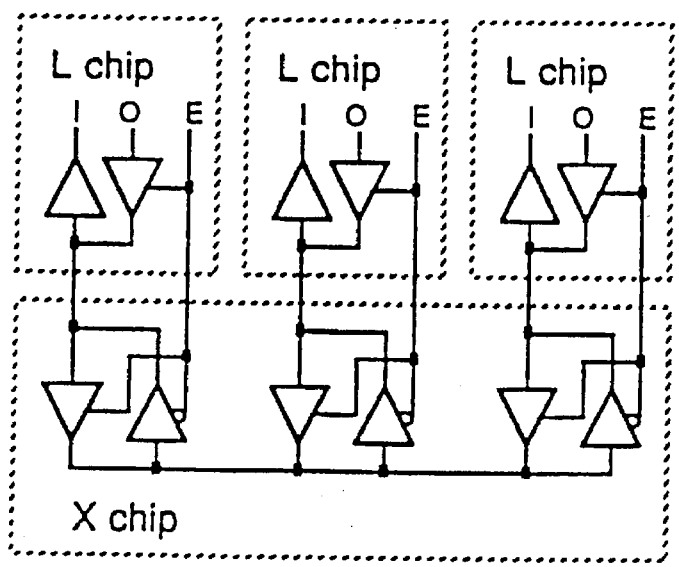
FIG. 16 is a schematic block diagram of a bidirectional crossbar tri-state configuration.

Note that all the configurations specified so far may be used with identical hardware. Only the primitive placement and interconnect vary. Finally, if the crossbar chip supports internal tri-state, the bi-directional crossbar tri-state configuration duplicates the actual tri-state net inside the crossbar chip, shown in FIG. 16.

Each logic chip's actual tri-state driver is repeated onto the crossbar chip's bus, and should be accompanied by an interconnect for the enable signal. The crossbar chip's bus is driven back out when the driver is not enabled. If the LCA were used as a crossbar chip, its internal tri-state interconnects described above would be used. Specifically, there is an IBUF/OBUFZ pair at the logic chip boundary, another IBUF/OBUFZ pair for each logic chip on the crossbar chip boundary, and a TBUF for each logic chip driving the internal tri-state line. Each enable passes through an OBUF and an IBUF. The total enabled datapath delay is Ol+Ix+Tx+Ox+Il, or 39 ns (XC3030-70 LCA crossbar), and the total enable delay is Ol+Ix+TEx+Ox+Il, or 45 ns.

As before, if more than one bit of the bus is interconnected through the same crossbar chip, only one set of enable signals need be provided to that chip.

This configuration requires that the crossbar be an LCA or other such ERCGA which has internal tri-state capability, and is subject to the availability of those internal interconnects. Specifically, the XC2000-series LCAs do not have internal tri-state, but the XC3000 parts do. The XC3030 has 80 I/O pins, 100 CLBs, and 20 tri-state-drivable internal 'long lines'. Thus a maximum of 20 such tri-state nets could be interconnected by one crossbar chip in this configuration. That could be the interconnect limitation, but only for a small fraction of cases, given the I/O pin limit. The XC3030 is twice as expensive as the XC2018 at this time.

If the hardware allows the tri-state configuration to be used, the other configurations are not precluded, and may be used as well.

1.2.3.6 Summary of All Configurations

This chart summarizes the configurations:

|  | Logic Summing | Crossbar Summing | Bi-dir Crossbar Summing | Bi-dir Crossbar Tri-state |
|---|---|---|---|---|
| Pins/logic chip: | | | | |
| bi-directional | =driving+ receiving | 2 | 1 datapath 1 sharable enb. | 1 datapath 1 sharable enb. |
| driving-only | 1st chip: 0 others: 2 | 1 | 1 datapath 1 sharable enb. | 1 datapath 1 sharable enb. |
| receiving-only | 1st non-sum: 2 others: 1 | 1 | 1 | |
| Delay: (assuming LCA crossbar chips: +LCA interconnect, 70 MHz LCA chip speed) | | | | |
| datapath | 82 ns | 51 | 42 | 39 |
| enable | 82 | 51 | 46 | 45 |
| Resources per chip: (d = number of drivers) | | | | |
| driving-only | 2-in AND Sum: d-in OR | 2-in AND | 0 | 0 |
| receiving-only | 0 | 0 | 0 | 0 |
| bi-directional | 2-in AND | 2-in AND | 0 | 0 |
| crossbar | 0 | d-in OR | d-in OR d 2-in ANDs | d TBUFs 3-s bus |

The logic summing configuration is clearly less effective. Crossbar summing is much faster and uses fewer pins, and is almost as simple. Bi-directional crossbar summing is slightly faster still, and offers the possibility of reduced pin count for directional busses, but is more complex and places more demands on the limited logic resources in the crossbar chips. The tri-state configuration offers similar pin count and delay, but requires more expensive crossbar chips.

1.2.3.7 Comparing Plain and Bi-directional Crossbar Summing Configurations

It is useful to test the characteristics of the most efficient configurations. The following chart shows the number of crossbar CLBs and crossbar CLB delays incurred when the plain and bi-directional crossbar summing configurations are used to interconnect a large number of bi-directional nets, and when LCAs are used for crossbar chips. It assumes XC2018-70 crossbar chips are used, which have 72 I/O pins and 100 CLBs available. Each CLB supports up to 4 inputs and up to 2 outputs. Each logic chip is assumed to have a bi-directional connection to the net, with no enable sharing, so each test case uses all 73 I/O pins in the crossbar ship.

|  | Crossbar Summing | Bi-dir Crossbar Summing |
|---|---|---|
| 18 bi-dir nets serving | 9 CLBs | 18 CLBs |
| 2 logic chips each | 1 Cx | 1 Cx |
| 12 bi-dir nets serving | 12 CLBs | 24 CLBs |
| 3 logic chips each | 1 Cx | 2 Cx |
| 9 bi-dir nets serving | 9 CLBs | 27 CLBs |
| 4 logic chips each | 1 Cx | 2 Cx |
| 6 bi-dir nets serving | 12 CLBs | 24 CLBs |
| 6 logic chips each | 2 Cx | 2 Cx |
| 3 bi-dir nets serving | 12 CLBs | 30 CLBs |
| 12 logic chips each | 2 Cx | 3 Cx |

The bi-directional crossbar summing configuration uses up to 2.5 times as many CLBs, which increases the possibility that the crossbar chip won't route, or that the internal interconnect delays will be higher, although it stays well short of the 100 CLBs available. In exchange, the unidirectional configuration puts more gates on the logic chips, although the logic chips are in a better position to handle extra gates. The bi-directional configuration incurs extra Cx delays more often, which can offset its speed advantage. The preferred embodiment of the realizer system uses the crossbar summing configuration for all tri-state nets.

1.2.4 System-Level Interconnect

The natural way to package a set of logic chips interconnected by crossbar chips is on a single circuit board. When a system is too large to fit on a single board, then the boards must be interconnected in some way, with a system-level interconnect. It is impractical to spread a single partial crossbar interconnect and its logic chips across more than one circuit board because of the very broad distribution of paths. For example, suppose a complex of 32 128-pin logic chips and 64-pin crossbar chips was to be split across two boards, 16 logic chips and 32 crossbars on each. If it was cut between the logic chips and the crossbar chips, then all 4096 interconnect paths between logic chips and crossbar chips would have to pass through a pair of backplane connectors. If it is cut the other way, 'down the middle' with 16 logic chips and 32 crosbar chips on each board, then all the paths which connect logic chips on board 1 to crossbars on board 2 (16 logic*64 pins =1024), and vice versa (another 1024, totalling 2048), would have to cross.

A further constraint is that a single such interconnect is not expandable. By definition, each crossbar chip has connections to all logic chips. Once configured for a particular number of logic chips, more may not be added.

Figure 17:
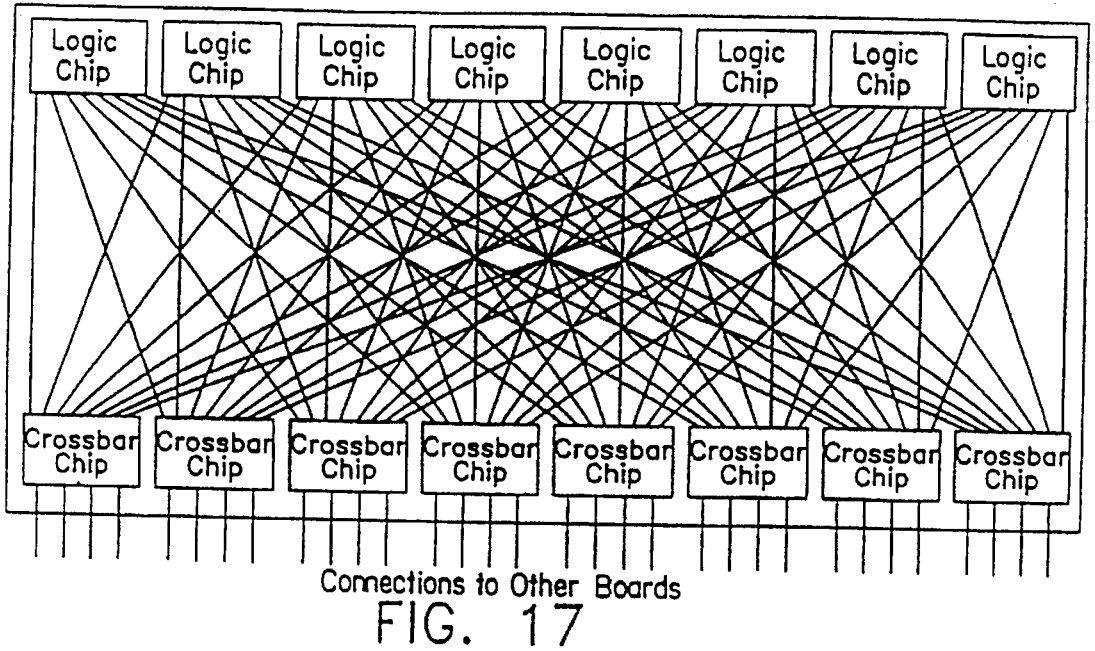
FIG. 17 is a schematic block diagram showing off-board connections from partial crossbar.

Instead, the largest complex of logic and crossbar chips which can be packaged together on a circuit board is used treated as a module, called a logic board, and multiples of these are connected by a system-level interconnect. To provide paths for interconnecting nets which span more than one board, additional off-board connections are made to additional I/O pins of each of the crossbar chips of each logic board, establishing logic board I/O pins (FIG. 17). The crossbar chip I/O pins used to connect to logic board I/O pins are different from the ones which connect to the board's logic chip I/O pins.

1.2.4.1 Partial Crossbar System-Level Interconnects

One means of interconnecting logic boards is to reapply the partial crossbar interconnect hierarchically, treating each board as if it were a logic chip, and interconnecting board I/O pins using an additional set of crossbar chips. This partial crossbar interconnects all the boards in a box. A third interconnect is applied again to interconnect all the boxes in a rack, etc. Applying same interconnect method throughout has the advantage of conceptual simplicity and uniformity with the board-level interconnect.

To distinguish among crossbar chips in a Realizer system, the partial crossbar interconnect which interconnects logic chips is called the X-level interconnect, and its crossbar chips are called Xchips. The interconnect which interconnects logic boards is called the Y-level interconnect, and its crossbar chips are called Ychips. In the X-level interconnect, the I/O pins of each logic board are divided into proper subsets, using the same division on each logic board. The pins of each Ychip are connected to the same subset of pins from each of every logic board. As many Ychips are used as there are subsets, and each Ychip has as many pins as the number of pins in the subset times the number of logic boards.

Figure 18:
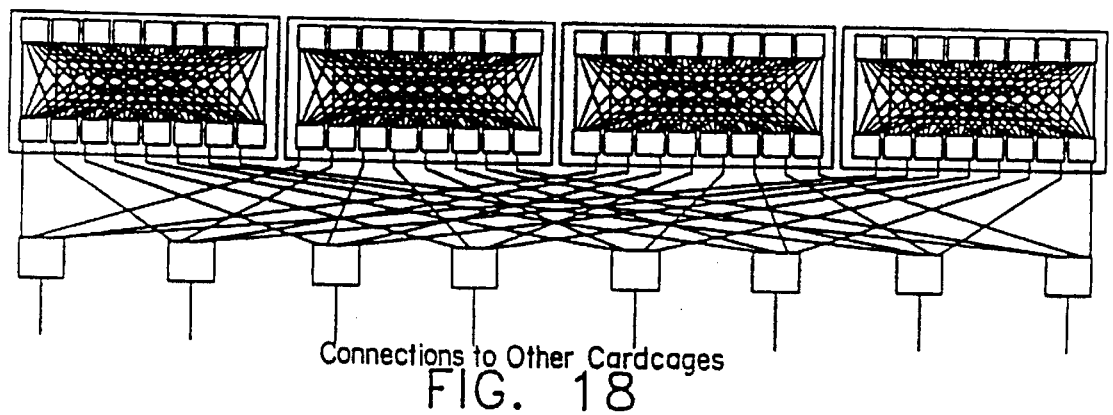
FIG. 18 is a schematic block diagram of Y-level partial crossbar interconnect.

Likewise, additional off-box connections are made to additional I/O pins of each of the Ychips, establishing box I/O pins, each of which are divided into proper subsets, using the same division on each box (FIG. 18). The pins of each Zchip are connected to the same subset of pins from each of every box. As many Zchips are used as there are subsets, and each Zchip has as many pins as the number of pins in the subset times the number of boxes. This method of estalishing additional levels of partial crossbar interconnects can be continued as far as needed.

When the input design is partitioned, the limited number of board I/O pins through which nets which may pass on and off a board is a constraint which is observed, just as a logic chip has a limited number of I/O pins. In a multiple box Realizer system the limited number of box I/O pins is observed, and so on. The interconnect's symmetry means optimizing placement across chips, boards, or cardcages is not necessary, except so far as special facilities, such as design memories, are involved.

Bidirectional nets and busses are implemented using on of the methods discussed in the tri-state section, such as the crossbar summing method, applied across each level of the interconnect hierarchy spanned by the net.

A specific example is the preferred embodiment:
The partial crossbar interconnect is used hierarchically at three levels across the entire hardware system.
A logic board consists of up to 14 logic chips, with 128 interconnected I/O pins each, and an X-level partial crossbar composed of 32 Xchips. Each Xchip has four paths to each of the 14 Lchips (56 total), and eight paths to each of two Ychips, totalling 512 logic board I/O pins per board.
A box contains one to eight boards, with 512 interconnected I/O pins each, and a Y-level partial crossbar composed of 64 Ychips. Each Ychip has eight paths to an Xchip on each board via logic board I/O pins, and eight paths to one Zchip, totalling 512 box I/O pins per box.

A rack contains one to eight boxes, with 512 interconnected I/O pins each, and a Z-level partial crossbar composed of 64 Zchips. Each Zchip has eight paths to a Ychip in each box via box I/O pins.

1.2.4.2 Bidirectional Bus System-Level Interconnects

Figure 19:
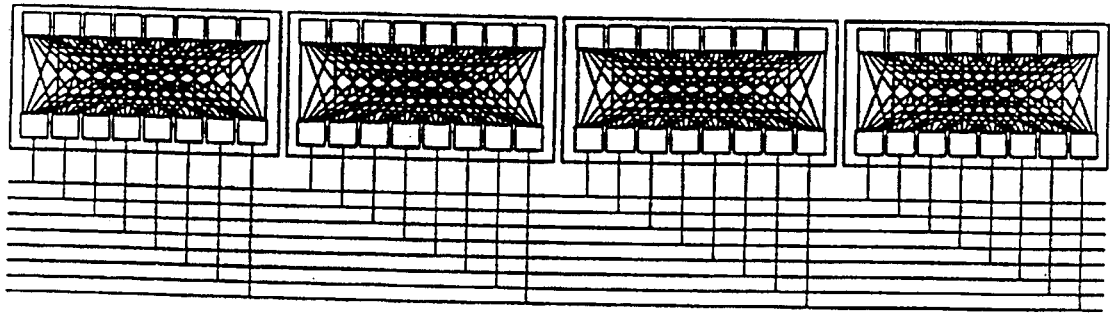
FIG. 19 is a schematic block diagram of a bidirectional bus system-level interconnect.

Computer hardware practice inspires another method of system-level interconnection of logic boards, using a backplane of bidirectional busses. Each logic board is provided with I/O pins, as before, and each board's I/O pins is connected to the like I/O pins of all the other boards in the box by a bus wire (FIG. 19).

Figure 20:
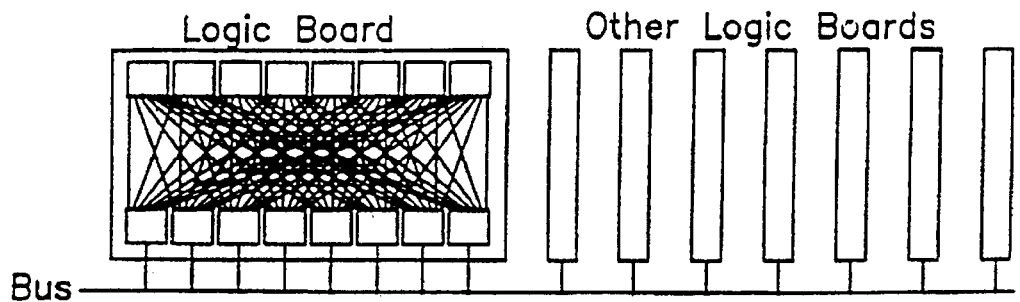
FIG. 20 is a schematic block diagram showing eight boards on a common bus interconnect.

Some logic board I/O pins are wasted, i.e. unable to interconnect design nets, since the use of a bus wire for interconnecting one design net blocks off the use of pins connected to that wire on all the other boards sharing the bus. The maximum number of design nets which can be interconnected is equal to the bus wires, which equals the number of I/O pins per board. For a specific example, suppose eight boards share a common interconnect bus, with 512 bus wires connecting the 512 I/O pins of each board (FIG. 20).

Assuming different distributions of 2, 3, 4, 5, 6, 7 and 8-board nets, analysis shows that while the average number of nets connecting to each board is 512 in each case, the boards and bus should be up to 1166 pins wide to allow for all the nets. This can be partially mitigated by keeping the number of boards on a single backplane small. But the maximum number of boards interconnected with one set of bidirectional busses is limited. To accommodate larger systems more efficiently, groups of busses are interconnected hierarchically.

Figure 21:
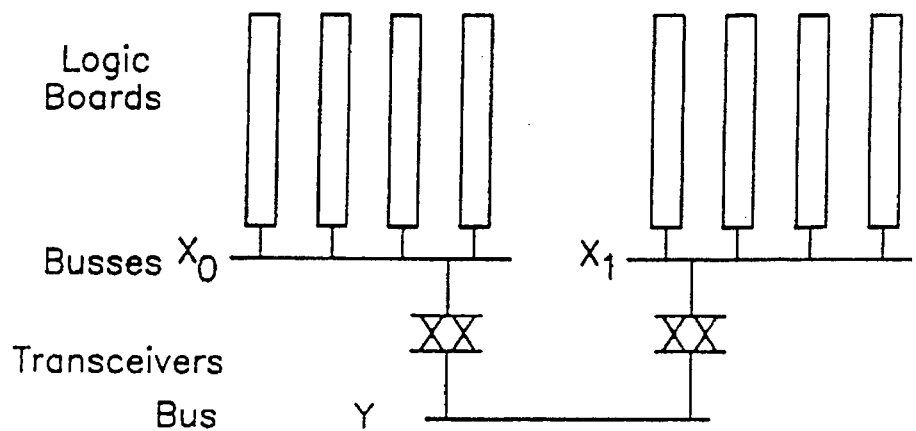
FIG. 21 is a schematic block diagram showing the hierarchy of two bus levels.

The first example shown in FIG. 21 has two sets of busses, X0 and X1, connecting four boards each. The X-level busses are interconnected by another bus, Y. Each wire in an X bus can be connected to its counterpart in Y by a reconfigurable bidirectional transceiver, whose configuration determines whether the X and Y wires are isolated, driven X to Y, or Y to X. When a net connects only the left set of boards or the right set of boards, then only one or the other of the X-level busses is used. When boards on both sides are involved, then a wire in each of X0 and X1 is used, and these wires are interconnected by a wire in Y, via the transceivers. Each board should have as many I/O pins as the width of one of the X-level busses.

If the interconnection through Y is to be bidirectional, that is, driven from either X0 or X1, then an additional signal should be passed from X0 and X1 to dynamically control the transceiver directions.

This interconnect has been analyzed to show its capability for interconnecting nets among the boards, making the same net pin count and I/O pin count assumptions as above. While the single-level method requires the same width as the total number of all nets, breaking it into two decreases the maximum width required by 10 to 15%.

Figure 22:
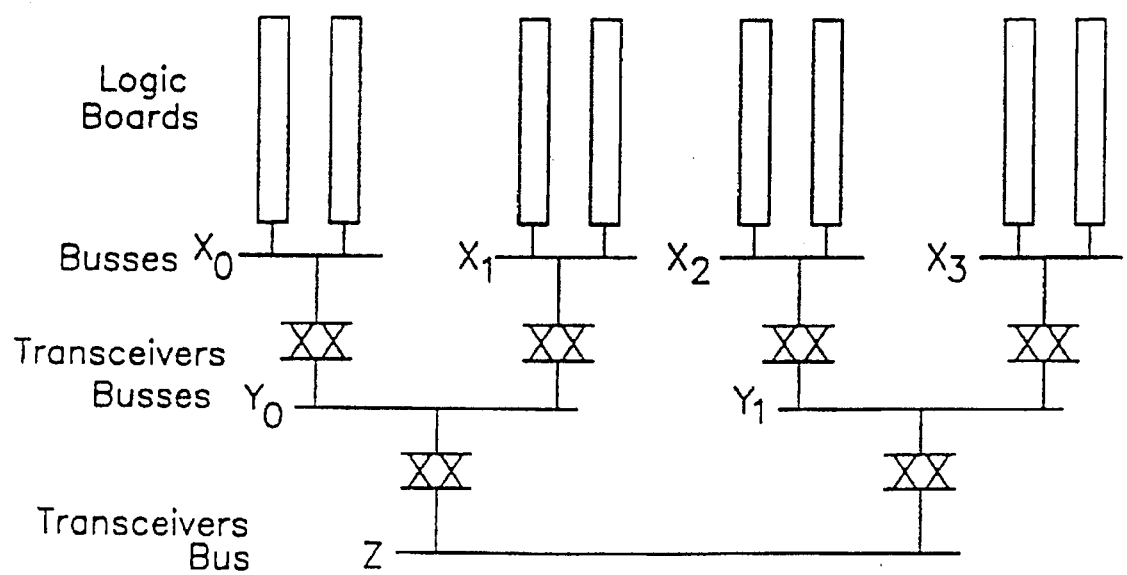
FIG. 22 is a schematic block diagram showing a maximum bus interconnect hierarchy.

The maximum amount of hierarchy has only two boards or groups of boards per bus (FIG. 22).

Bidirectional bus interconnects are simple and easy to build, but they are expensive, because a large number of logic board I/O pins are wasted by connecting to other boards' nets. Introducing hierarchy and short backplanes to avoid this proves to have very little effect. In addition, the introduction of bidirectional transceivers removes a speed and cost advantage that the single-level backplane bus interconnect had over a partial crossbar. Consequently, partial crossbars are used in the system-level interconnect of the preferred embodiment.

1.3 Special-Purpose Elements

Special-purpose elements are hardware elements which contribute to the realization of the input design, and which are installed in Lchip locations on the logic board of the preferred embodiment, but which are not combinational logic gates or flip-flops, which are configured into logic chips.

1.3.1 Design Memory

Most input designs included memory. It would be ideal if logic chips included memory. Current logic chip devices don't, and even if they did, there would still be a need for megabyte-scale main memories which one would never expect in a logic chip. Therefore, design memory devices are included in the Realizer system.

1.3.1.1 Design Memory Architecture

The architecture of a design memory module is derived from requirements:

a) Since it is part of the design, it should be freely interconnectable with other components.

b) It should allow freedom in assigning data, address and control inputs and outputs to interconnect paths, as the logic chip does, to allow successful interconnection.

c) A variety of configurations allowing one or more design memories, with different capacities and bit widths, and either common or separate I/O, should be available.

d) It should be accessible by the host interface to allow debugger-type interaction with the design.

e) It should be static, not dynamic, so the design may be stopped, started or run at any clock speed, at will.

Figure 23:
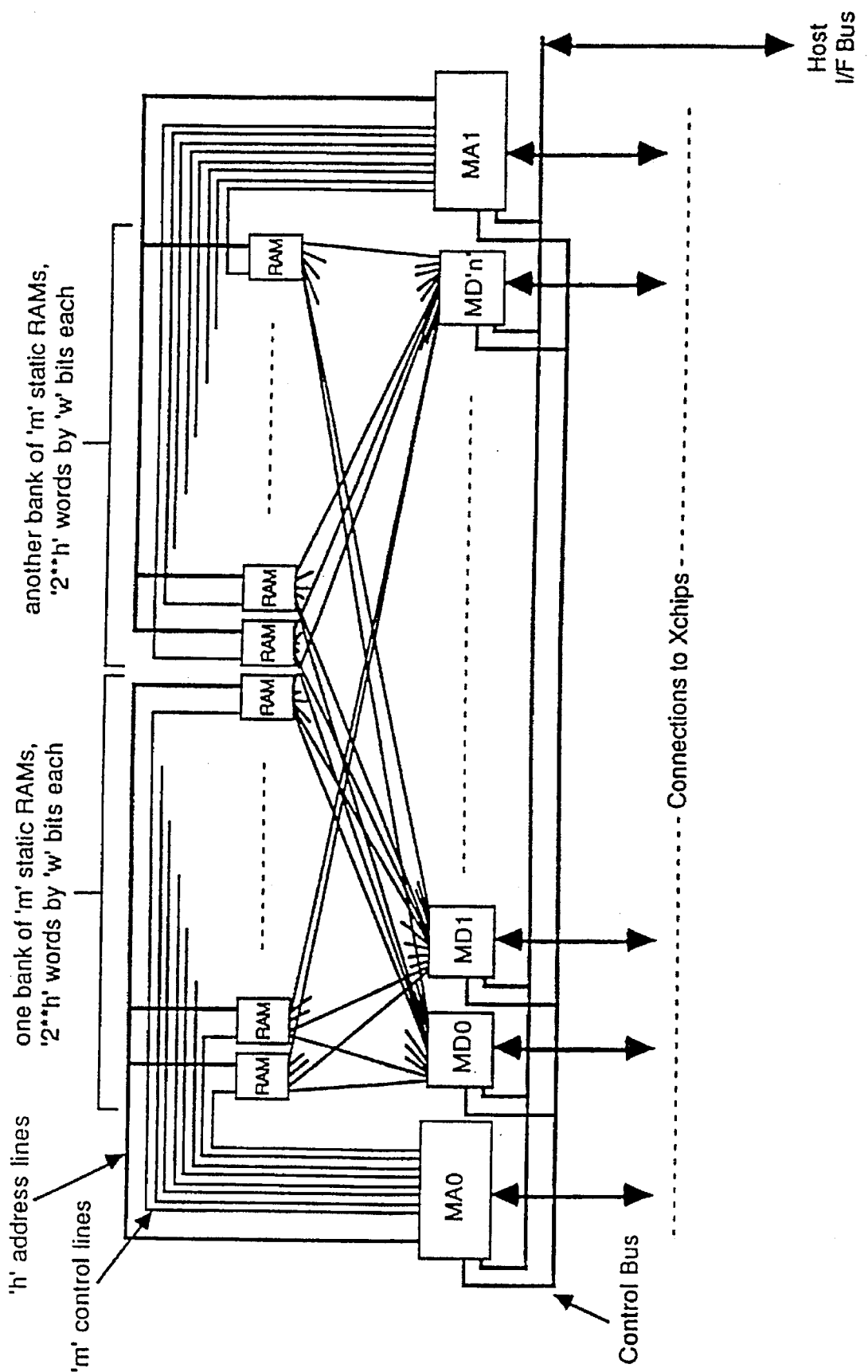
FIG. 23 is a schematic block diagram of a general memory module architecture.

The general architecture of a memory module that satisfies these requirements is shown in FIG. 23.

To support interconnectability with the design, and flexibility of physical composition of the Realizer system, the memory module is designed to plug into an Lchip socket, connected to the same interconnect and other pins as the logic chip it replaces. As many modules as needed are installed.

RAM chips are not directly connected to the interconnect, mainly because their data, address and control functions are fixed to specific pins. Since the success of the partial crossbar interconnect depends on the logic chip's ability to freely assign internal interconnects to I/O pins, non-logic chip devices installed in a logic chip's place should have a similar capability. To accomplish this, and to provide for other logic functions in the memory module, logic chips are installed in the memory module, interconnecting the RAM chips with the crossbar's Xchips.

They are configured to interconnect specific RAM pins with arbitrarily chosen Xchip pins, using the same L-X paths used by the logic chip whose place the memory module has taken. More than one logic chip is used per module because of the large numbers of RAM pins and L-X paths to be connected.

An additional function of the memory module's logic chips is to provide it with configurability and host accessibility. Address, data and control paths are configured through the logic chips to connect the RAM chips in a variety of capacities, bit widths and input/output structures. The memory module may be configured as one large memory or several smaller ones. By connecting each of these logic chips to the host interface bus, and by configuring bus interface logic in them, functionality is realized which allows the host processor to randomly access the RAMs, so a user's host computer program, such as a debugger, can inspect and modify the memory contents. Examples of these logic structures are shown below.

The densest and cheapest available static memory which fulfills the timing requirements of realized designs is chosen for design memory. In the preferred embodiment, that device is the 32K by 8 bit CMOS SRAM, such as the Fujitsu MB84256. It is available at speeds down to 50 ns. Much faster devices offer diminishing returns, as the Realizer system's crossbar chip interconnect delays start to predominate.

Dynamic memory devices are not used because they must be refreshed regularly, which would present problems in the Realizer system. If the input design calls for a dynamic memory, presumably it includes refresh logic. However, since the realized design may not be operating at 100% of design speed, letting the design do the refresh may not be successful. In fact it is desirable to stop the design's operation altogether when debugging. Or, the design may be part of a system which depends for refresh on some other element, not included in the input design. Finally, if the design calls for static memory, refresh of a dynamic design memory would be impractical. A static memory can realize a dynamic memory in the design, as refresh cycles may just be ignored. Thus the design memory is implemented with static devices.

1.3.1.2 Using Logic Chips to Interconnect RAMs with the Crossbar

Ideally, a single logic ch ip would be used to interconnect RAMs with the X-level crossbar, with enough pins to connect to all RAM signal pins as well as all L-X interconnect paths. Practical Realizer system memory modules require far too many pins for a single logic chip to fulfill. For example, suppose 2 banks of eight 32K by 8 bit RAMs were used in a module with 128 L-X paths. Each RAM bank would have 15 address pins, 8 write enable pins, and 64 data pins. Two banks and the L-X paths would require 302 pins, plus pins for the host interface bus. This outstrips the pin count of available logic chips by a factor of two. More than one logic chip must be used. The architecture described here uses a number of small logic chips, which are given specialized functions, some for address and control, and other for the data paths.

1.3.1.2.1 Memory Address Logic Chips

Address and control logic chips are marked "MA0" and "MA1" in FIG. 23. The RAMs are split into banks, one controlled by each MA chip. There are as many MA chips as the maximum number of separate design memories to be realizable by the module. Each is given its own set of L-X paths to the crossbar, as many paths as needed for one bank's address and control lines. MA0 and MA1 use a different set of paths. For example, two MA chips, each connected to half the RAMs, allows two independent memories to be realized. If one larger memory is to be realized, the address and control nets are interconnected to both MA chips, using both sets of L-X paths. Each MA chip controls the address inputs of all RAMS in its bank, which are tied together in a single bus. Each MA chip individually controls the control inputs to the RAMs, to allow for data to be written into only the addressed RAM(s). Finally, each MA chip is connected to the host interface bus for accessibility, and to a control bus common to all logic chips on this memory module.

Figure 24:
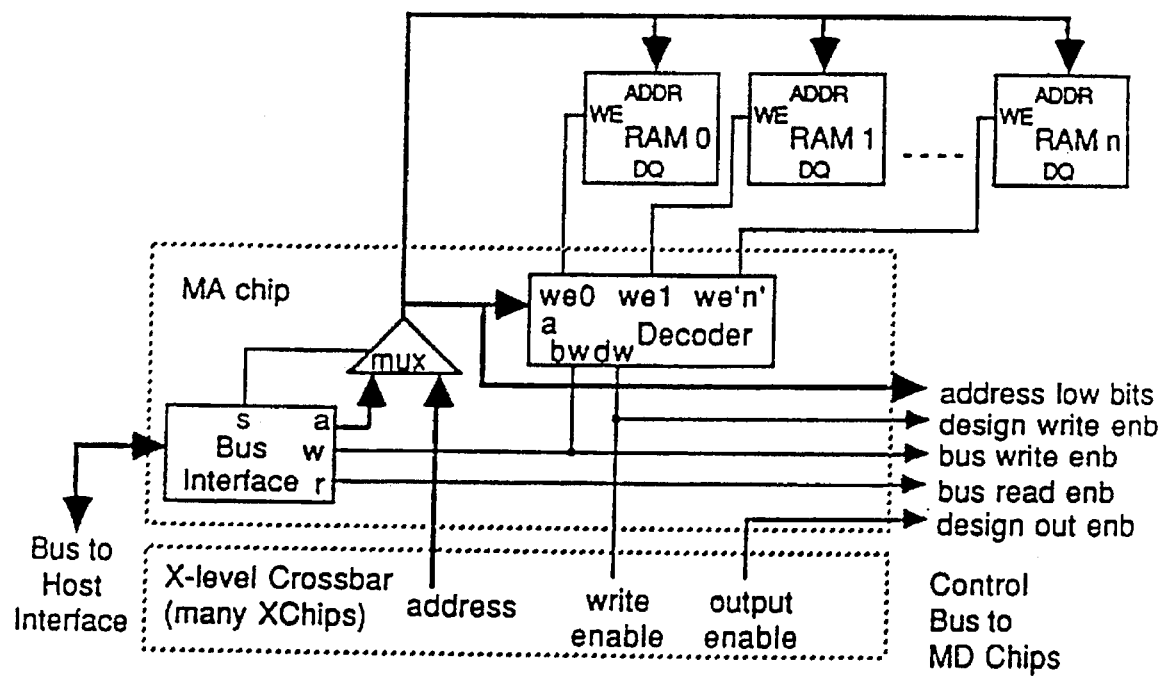
FIG. 24 is a schematic block diagram of a memory address logic chip.

FIG. 24 shows in greater detail how an MA chip is connected to the X-level crossbar and to the RAM chips. The MA chip is configured according to the logic and data paths as shown. The full address enters the MA chip from the crossbar. Normally (when the bus interface is inactive), a fraction of address bits corresponding to the number of RAM address bits is passed on to address the RAMs in the bank controlled by this MA chip. The other address bits and the design's write enable drive decoder logic which controls the write enable signals for each RAM. This logic is configured according to the configuration needed for this design memory. For example, if the design memory has the same bit width as one of the RAMs, when the design asserts its write enable only a single RAM write enable will be asserted, according to the address bits. If the design memory is twice as wide as one chip, then a pair of RAM write enables will be asserted, and so on.

If a design memory with more than one write enable, each controlling a subset of the memory's data path width, is desired, several design write enable nets may be used, each operating along the lines described above, with suitable configuration of the decode logic in the MA and MD chips. This is subject to the availability of L-X paths into the MA chip and control bus paths into the MD chips.

The bus interface logic allows the host to access this RAM via the host interface bus. When this set of RAMs is addressed by the bus, the bus interface switches the address multiplexer ('mux') to address the RAMs with its address. When the host is writing one of the RAMs, the bus interface logic sends a signal to the decoder logic, which uses the address bits not driving the RAMs to assert the appropriate RAM write enable.

Finally, some signals are needed to control the data paths in the MD chips. Since the MD chips are not all connected to the same L-X paths as the MA chip(s), they may not have access to the address and control signals from the design. A control bus is connected to all MA and MD chips to allow these signals, and bus interface control signals, to be sent to the MD chips.

1.3.1.2.2 Memory Data Path Logic Chips

MD chips handle the data paths according to a bit-slice organization. Multi-bit bus data paths are interconnected in the Realizer system by being bit-sliced across the crossbar. Busses are spread out across the Xchips, with one or two bits per chip. MD chips are bit-sliced to facilitate connection to these busses. Each MD chip is connected to the same bit or bits of every RAM in all banks, and to a subset of Xchips. Bringing all the like RAM bits together in the MD chip allows flexibility in configuring design memories of various bit widths and sizes. Design memories are realized in various multiples of the RAM width by suitably configuring logic and data paths in the MD chip.

When there are 'n' MD chips and 'M' Xchips, each MD chip connects with M/n different Xchips. Each data bit requires two L-X paths; either a DI and a DO path for separate I/O configurations, or the summing input and summing result for common I/O bidirectional configurations, due to the crossbar summing interconnect configuration. Thus, each MD chip has at least 2*M/n L-X paths. Additional paths may be added beyond this, and may overlap with MA's L-X paths. The number of MD chips, RAMs and RAM bit widths are chosen to suit these constraints and capacity constraints, to efficiently use the number of pins in the logic chip used for the MD chip, and to come out even.

The industry-standard static RAM chip has a common I/O structure, with bidirectional data pins (named DQ), used for data in and tri-state data out. It has address input pins (ADDR), and a write enable pin (WE). The output enable pins and chip select pins are permanently enabled in this implementation, so the output pins are controlled by write enable. When disabled, the RAM is reading, and the addressed data is driven out on the DQ pins. When write enable is asserted, data in is received on the DQ pins. On the trailing edge of the assertion, data is written into the address location. The standard device only requires data in setup to the trailing edge of write enable, and requires zero hold time, so write enable control of datapaths is acceptable.

Figure 25:
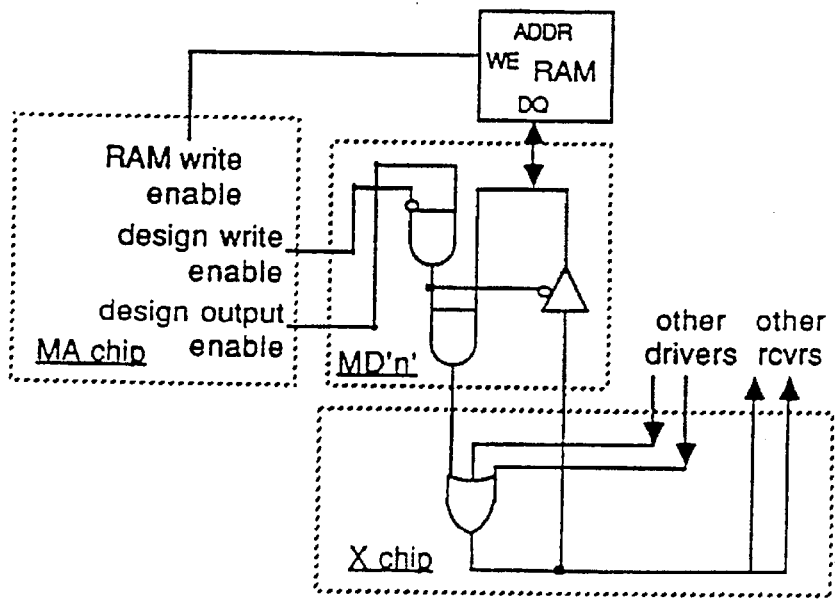
FIG. 25 is a schematic block diagram of a memory data logic chip using common I/O.

When the design's memory calls for common I/O, that's a tri-state net in the design, which is realized using the crossbar summing configuration: the driving pins are separately gated by their enables and collected into a summing OR gate, which drives the receiving pins. The RAM DQ data pins are interfaced by logic and data paths configured in the MD chips as shown in FIG. 25 (one bit, bit 'n', is shown, others similar).

Each MD chip (MD 'n' shown) is configured with an enable gate driving a summing gate in the Xchip, just as an Lchip has an enable gate driving a summing gate in the Xchip when it has a tri-state driver. When the design memory input nets have output enabled and write disabled, the logic gates the RAM output into the summing gate and disables the receiving driver. Otherwise, the net value is driven from the summing gate into the RAM, allowing writing when write enable is asserted. Note that the design write enable and output enable signals come from the MA chip (over the control bus), as discussed above. Bus interface logic is not shown.

Figure 26:
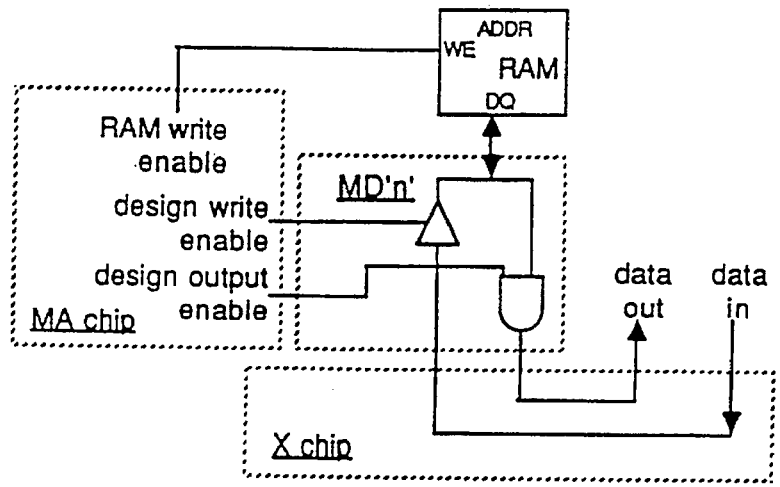
FIG. 26 is a schematic block diagram of a memory data logic chip using separate I/O.

When the design's memory calls for separate I/O, it is extracted from the SRAM's common I/O as shown in FIG. 26. Data out always reflects the SRAM's data pin state when output enable is asserted. When write enable is asserted, data in is driven onto the SRAM's DQ pins.

The above figures only show one RAM connected to a design data bit. Often there will be several, when the number of locations in the design memory is to be a multiple of the size of a single RAM chip. In such cases, the MD chip is configured as shown in FIG. 27.

A DQ pin from each of several RAMs is connected to this MD chip. Low address bits and the design and bus interface control signals are carried to the MD chips over the control bus from the MA chip. When reading, the low bits of the address select one of the RAM DQ outputs through the multiplexer. The selected output is gated by the design output enable to form the design memory data out, as in the previous case. When the design asserts its write enable, the data in is driven to one of the RAM DQ inputs by enabling a driver. Decode logic, driven by the low address bits and the design write enable signal, selects the appropriate driver to be driven. Recall that the RAM chip's write enable is driven by the MA chip.

Figure 27:
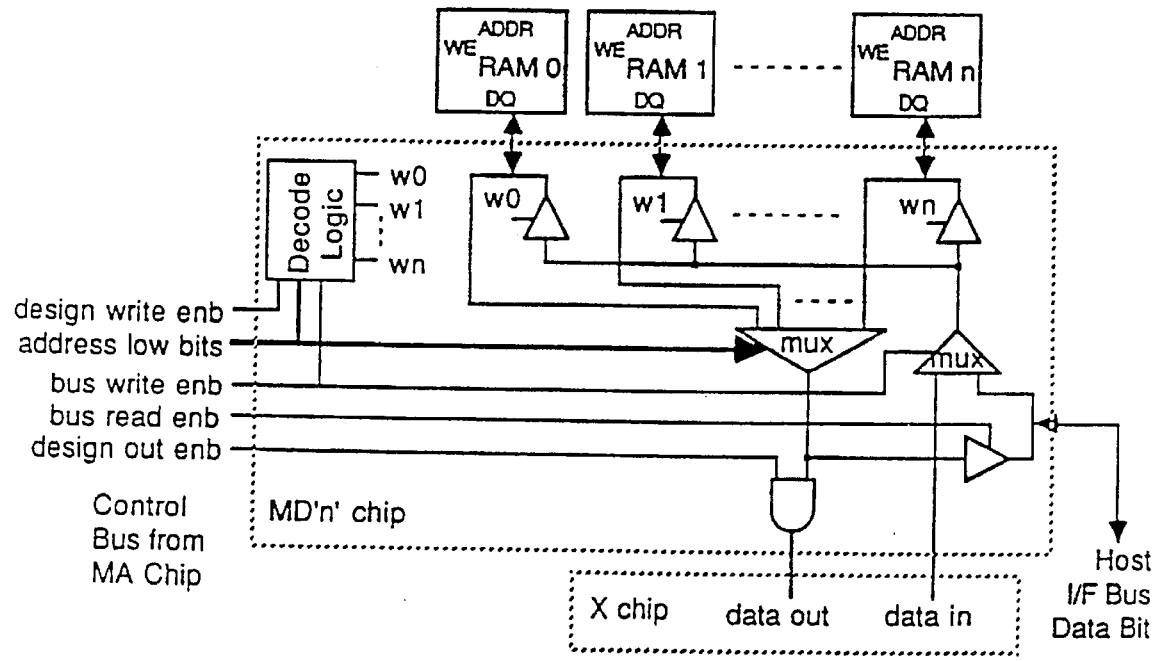
FIG. 27 is a schematic block diagram showing multiple RAMs on one data bit.

FIG. 27 shows a separate I/O configuration. A common I/O configuration would be similar, with data in driven by the crossbar summing gate and data out gated by design output enable and write enable and driving a summing gate input, as in FIG. 25.

When the host interface accesses this memory via the host interface bus, logic configured in the MA chip generates control signals for bus access which are carried from MA via the control bus. When the bus is reading, bus read enable drives the data, selected from the addressed RAM by the multiplexer, onto the host interface bus data bit corresponding to this MD chip. When the bus writes, data from the bus data bit is switched onto the drivers by another multiplexer. It is driven onto the DQ pin of the RAM selected by the same process as normal writes.

Note that this discussion has shown MD chip configurations with a single data bit out of a single design memory's data path width. If called for by the design memory configuration, and the number of MD and RAM chips in the module, more than one data bit may appear in each MD chip, simply by replicating the data paths as appropriate. Additionally, more than one design memory may be implemented using a common set of MD chips by replicating the above data paths and control lines to implement several memories.

Since some L-X paths into the memory module are only connected to MA chips and some are only connected to MD chips, the design conversion interconnection process is built to only interconnect nets connected to design memories using the appropriate L-X paths.

1.3.1.3 Design Conversion for Design Memories

Design memories are specified in the input design by using a design memory RAM primitive corresponding to one of the available configurations in the original design file. The design conversion method is based on a set of pre-defined partial netlist files, one for each of the memory module's logic chips, with statements for all the logic and data paths to be configured for the particular memory configuration specified, as shown above.

The pre-defined files are complete, except for I/O pin number specifications for the module I/O pins which are used to connect the design memory address, data and control connections with the interconnect. The method follows:

Normal methods are used for design conversion, as described in the design conversion sections, with special exceptions for design memory as follows:

The design reader reads the memory primitive for the specified vector memory into its design data structure, the data specifying which configuration to use is stored in the data structure record for the memory.

The conversion stage checks to see that the configuration is available and the pins correspond to the configuration correctly.

The partitioner is told by the user which Lchip positions on which boards have memory modules installed. Based on that data, it selects a memory module for the memory according to its normal partitioning algorithm. Alternatively, the user can assign the memory to a particular module by associating that data with the primitive in the original design file, which is included in the memory's primitive record by the design reader.

The interconnector then assigns nets and pins connected to the memory to specific L-X interconnect paths. It does this subject to the constraints that address and control nets may only be assigned certain paths which connect to the MA chip, and data nets may only be assigned to paths which connect to the MD chip. These constraints are applied during interconnection when determining each crossbar chip set's ability to interconnect the net, rejecting those sets and not scoring or using those paths which do not connect to the required MA or MD chip.

When the netlist files for each logic chip in the Realizer system are being written out, each design memory net connection is netlisted by:

1) Determining which MA or MD connects to the path chosen for the primitive by the interconnection procedure.

2) Deriving the logic chip I/O pin number from the path number and MA/MD chip number using a procedure similar to that described for deriving ordinary logic chip I/O pin numbers.

3) Choosing a pre-defined address, data or control connection from ones on this MA/MD chip which are unassigned to other nets so far.

4) Appending a statement to the netlist file for this logic chip, specifying that this logic chip I/O pin number is to be used for connecting to the pre-defined design memory connection.

The netlist files are processed into configuration bit patterns by the netlist conversion tool and loaded into the logic chips just like the netlist files for Lchips and Xchips.

1.3.1.4 A Specific Memory Module Design

Figure 28:
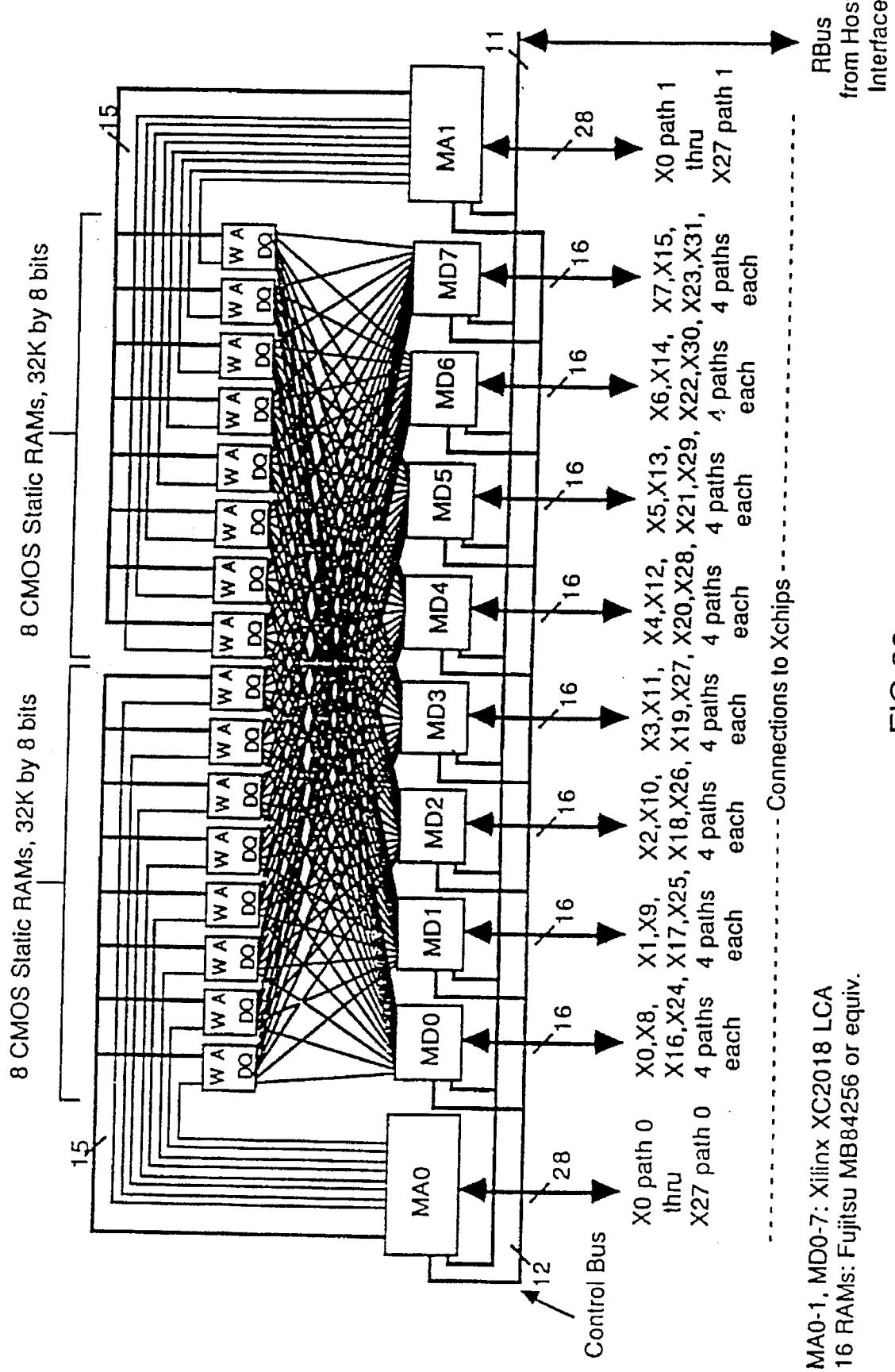
FIG. 28 is a schematic block diagram of a preferred embodiment of a memory module.

FIG. 28 shows the design of the memory module used in preferred embodiment. Note that it is architected according to the organization described above and shown in FIG. 23. It is designed to be plugged into an Lchip socket in place of an XC3090 LCA logic chip. Thus there are 128 L-X paths, 4 paths to each of 32 Xchips.

32K by 8 bit static RAM chips with common I/O are used, in two banks of 8 RAMs each. Each bank has its own MA chip, an XC2018 LCA. Each MA chip controls its RAMs with 15 address paths and 8 write enables. It is connected to the control bus common to all MA and MD chips in the module, and to the host interface bus. The remaining pins connect to the crossbar. 28 L-X paths, each to a different Xchip, are provided. MA chip 0 uses one set of paths, path 0, and MA1 uses path 1, allowing separate address and control nets for two independent design RAMs. Fewer than the full 32 L-X paths are connected only because of pin limitations in the XC2018. During design conversion, the path elements in the interconnecter's L-X path table corresponding to the missing L-X paths on this module are marked unavailable, so nets are not interconnected through them.

Eight MD chips, all XC2018 LCAs, are used. As there are 32 Xchips, each MD chip connects with 32/8=4 different Xchips (according to the method described above). Each chip has 2*M/n=8 paths used for design memory data bits, two to each Xchip. An additional two paths to each Xchip are provided to allow the module to be used as a 128 bit vector memory, as discussed below.

The host interface bus implemented in the preferred embodiment is called the Rbus, which connects to all Lchip positions via additional pins, and which is described in the host interface section.

Five different design memory configurations are available in this module. In the following chart, and in FIG. 28, "path 0" means one set of L-X paths, one from each Xchip, "path 1" means another set, etc.

1. 1 memory, 512K by 8: 19 address and 2 control (WE,OE) via L-X paths 0 & 1 (duplicated to reach both MA0 and MA1), 16 data (DI/DO or driver/receiver) via L-X paths 2 & 3. Each MD chip has one data bit, connected to 16 RAMs.
2. 1 memory, 256K by 16: 18 address and 2 control via L-X paths 0 & 1, 32 data via L-X paths 2 and 3. Each MD chip has two data bits, each connected to 8 RAMs.
3. 1 memory, 128K by 32: 17 address and 2 control via L-X paths 0 and 1, 64 data via L-X paths 2 and 3. Each MD chip has four data bits, each connected to 4 RAMs.
4. 2 memories, 256K by 8: each has 18 address and 2control via L-X path 0 for one memory (MA0) and path 1 for the other (MA1), each has 16 data via paths 2 and 3. Each MD chip has one data bit, connected to 8 RAMs, for each memory.
5. 2 memories, 128K by 16: each has 17 address and 2 control via L-X path 0 for one memory and path 1 for the other, each has 32 data via paths 2 and 3. Each MD chip has two data bits, connected to 4 RAMs, for each memory.

The control bus consists of 12 paths connected to all MA and MD chips in common. 12 paths are required to support the maximum control configuration, which is 3 address bits, design write enable, and design output enable signals for each of two 256K by 8 bit design memories, plus the bus write enable and bus read enable.

1.3.2 Stimulus and Response

Many uses of the Realizer system depend on the host computer sending stimulus signals and collecting response signals to and from the design. When this is done in batch form, that is sending and collecting a large body of signals at once, vector memories are used. When it is done one signal at a time, stimulators and samplers are used.

1.3.2.1 Vector Memory for Providing Stimulus

Figure 29:
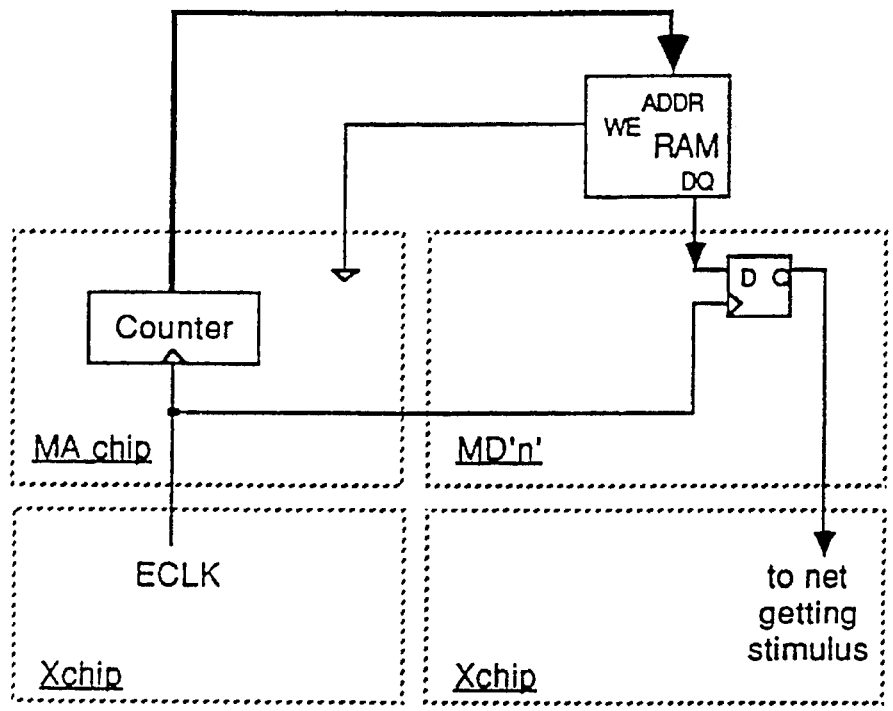
FIG. 29 is a schematic block diagram of a stimulus vector memory.

It is sometimes necessary to provide a continuous and repeatable stream of stimulus to a set of nets in the realized design for high-speed repetitive application of test vectors, such as in a simulation application. This is done by interfacing a memory to nets in the realized design, writing the stimulus vectors into the memory from the host computer, and finally sequentially reading the memory, one time through or several, to issue stimulus to the design. Since a continuous, linear series of memory locations is to be read, the address stream is provided by a binary counter. FIG. 29 shows a means of accomplishing such a stimulus vector memory.

A regular clock signal, ECLK, controls the process. ECLK is cycled, that is brought high and then low, once for each stimulus vector. A binary counter provides the sequence of addresses. When ECLK is brought high, the counter counts up to the address of the next stimulus vector, which is read by the RAM during the ECLK cycle. When ECLK is next brought high, the stimulus vector value just read is clocked into a D flip-flop. The output of the flip-flop drives the net to be stimulated with the stimulus vector value. The flip-flop provides a clean transition between vectors, which is necessary since the RAM output may fluctuate during its read cycle before it stabilizes at the correct value. This process is repeated to present the series of stimulus vectors to the realized design.

This structure is repeated to provide stimulus to many nets. The interface to the host computer, which is used to write the stimulus vectors into the RAM(s) is not shown, for clarity, but is shown in more detailed figures cited below.

1.3.2.2 Vector Memory for Collecting Response

Figure 30:
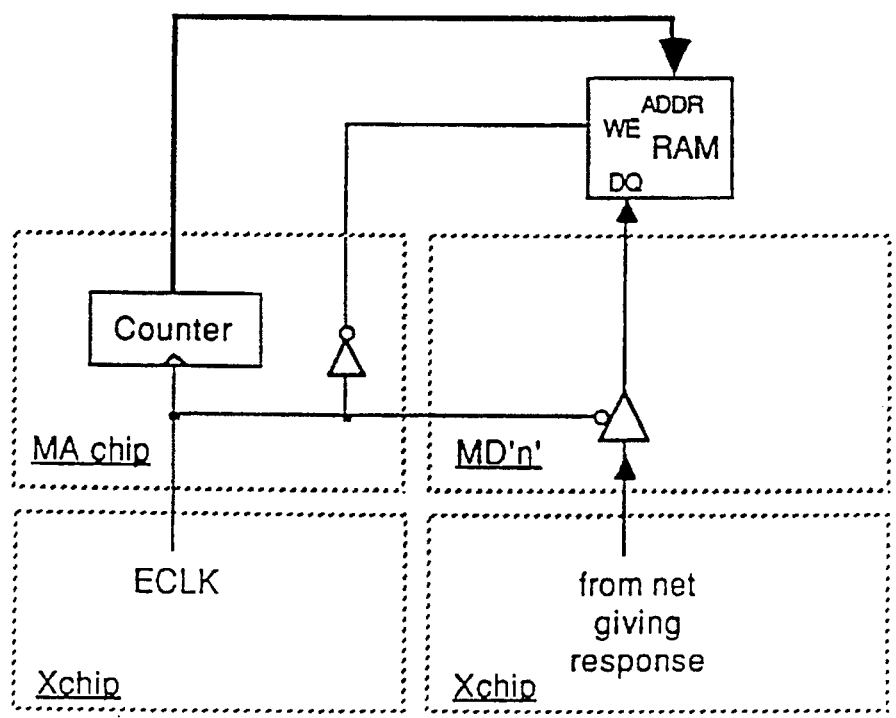
FIG. 30 is a schematic block diagram of a response vector memory.

Likewise, one mode of collecting response from the realized design is to collect a continuous stream of samples, or vectors, from a set of nets, as a logic analyzer does from actual hardware devices. This is done by interfacing a memory to nets in the realized design, sequentially writing vectors from the nets into the memory as the realized design is operated, and finally reading the collected response vectors back into the host computer for analysis. Since a continuous, linear series of memory locations is to be read, the address stream is provided by a binary counter, as before. FIG. 30 shows a means of accomplishing such a response vector memory.

As in the stimulus mechanism, a clock signal ECLK, controls the process. ECLK is cycled once for each response vector. The binary counter provides the sequence of addresses. When ECLK is brought high, the counter counts up to the address of the next vector. When ECLK is brought low, the response vector value is driven onto the RAM DQ data pin by the tri-state driver and the RAM is enabled for writing. When ECLK is brought high again, the value is written into the RAM location, the RAM write enable and tri-state driver enable are disabled, and the counter advances to the address for the next vector. This process is repeated to record the series of response vectors from the realized design.

This structure is repeated to provide stimulus to many nets. The interface to the host computer, which is used to write the stimulus vectors into the RAM(s) is not shown, for clarity, but is shown in more detailed figures cited below.

Typically the realized design is also being stimulated to produce these responses, if the stimulus is coming from a stimulus vector memory, then both vector memories will use the same ECLK signal. The ECLK signal should be high for long enough for the new address to pass from the counter, address the RAM, and for data to be read and set up on the stimulus D flip-flop inputs. It should then be low for long enough for the stimulus to affect the realized design and for all responses of that effect to stabilize, and for those responses to be written into the RAM. If the stimulus is coming from elsewhere, then the response vector memory's ECLK signal should be synchronized with the realized design so as to sample the response nets correctly.

1.3.2.3 Vector Memory for Stimulus and Response

Figure 31:
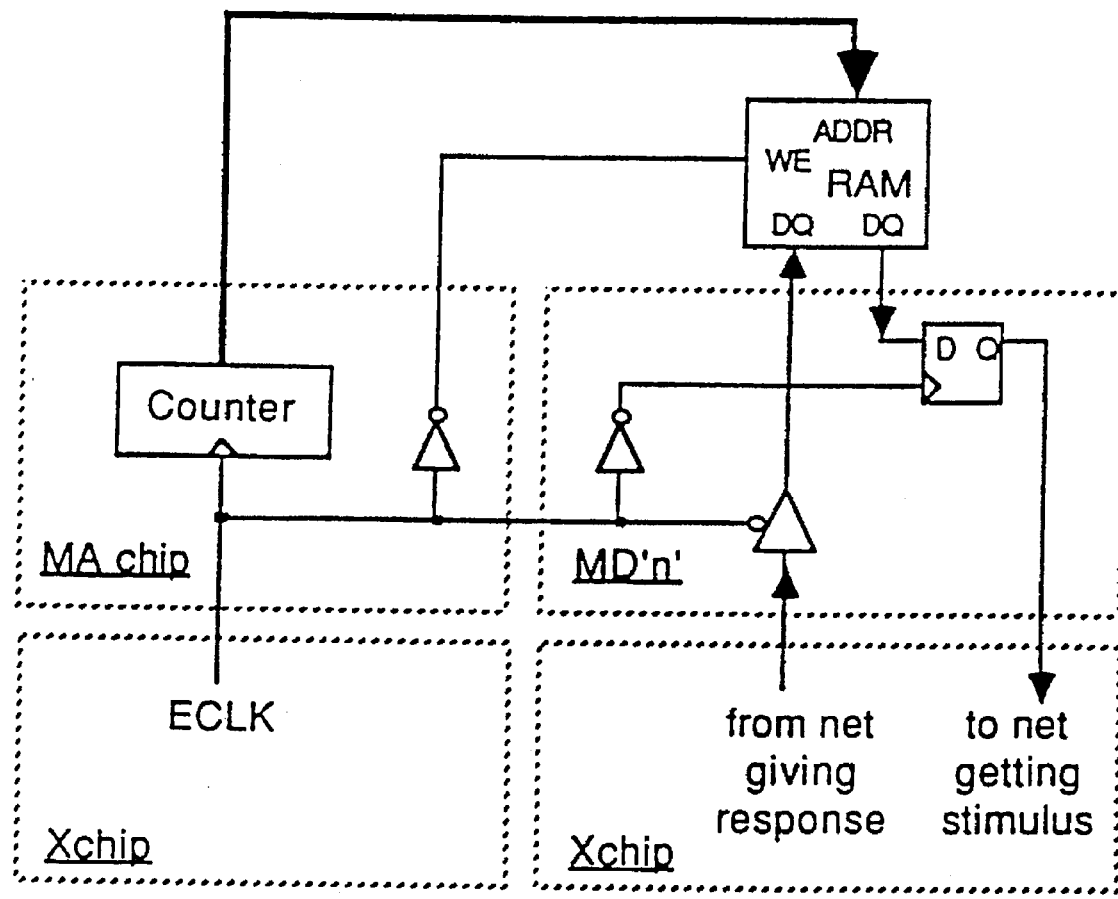
FIG. 31 is a schematic block diagram of a vector memory for stimulus and response.

It is possible to combine the features of the stimulus and response vector memories defined above in a stimulus and response vector memory system, as in FIG. 31. RAM bits may be freely assigned to either stimulus or response, even if they are on the same RAM device, because the stimulus reading function occurs when ECLK is high, and the response writing function follows when ECLK is low. By connecting both the tri-state response driver to the same RAM DQ data pin as the stimulus D flip-flop input, one bit can be used for both stimulus and response. An important difference between the simple stimulus vector memory and the combined stimulus/response vector memory is that the stimulus vectors may be read out of the RAM only once, since each memory location is written to in the low half of the ECLK cycle, even when the RAM bit issued for stimulus only. This can be avoided only if all bits of a RAM chip are used for stimulus, and the write enable is not asserted by ECLK.

The preceding figures show the realization of vector memories in a general way. In addition, the dotted lines show how the vector memory logic functions may be realized by configuring logic chips ("MA chip" and "MD 'n'") which are suitably connected to RAM chips and to the Realizer interconnect (Xchips).

Vector memories, and the conversion of stimulus from software to electrical form and back again, is detailed in U.S. Pat. No. 4,744,084, the disclosure of which is incorporated herein by reference.

1.3.2.4 Vector Memories for Fault Simulation

The Realizer Fault Simulation System is discussed in the section on that topic. In fault simulation, response is not collected in vector memories, but instead is compared with pre-determined good-circuit response by a fault-response vector memory. It is the same as a simple stimulus vector memory, as shown above, with the following additions: Instead of driving the net with the MD chip's flip-flop's output, the output is compared against the value of the net by an XOR gate. The XOR gate is connected to a set flip-flop clocked by ECLK, such that if it ever goes high, indicating a difference between the net and the memory, the flip-flop is set. This set flip-flop is readable by the host through the host interface to see if a difference has been detected.

1.3.2.5 Interconnecting Vector Memory with the Realized Design

Many ways of connecting vector memory to the realized design are possible. Realizer systems can be built with the vector memory connected directly to one or more logic chips and/or connected to any or all of the interconnect paths. For example, vector memories can be installed on the logic board along with the Lchips and Xchips, and connected to the X-Y paths coming off the board. Another possibility is to install vector memories on the Y-level crossbar's Ychip board, connected to the X-Y and Y-Z paths.

Another technique is to install the vector memory in an Lchip location, in place of a logic chip, connected to the L-X paths that serve the Lchip location. In this case, these L-X paths are connected only between the vector memory and the Xchip. Connection to nets in the realized design is made by configuring the Xchips to connect the vector memory to the nets as they pass through the X-level interconnect. Replacing logic chips with vector memory modules can be done in a modular way, allowing the Realizer hardware to be configured with as many or as few vector memories as necessary. Since Realizer design memory modules also are installed in place of one or more logic chips in Lchip locations, using this technique allows the a common hardware memory module to be used as a design memory module or as a vector memory module. The choice of function is made by configuring the logic chips in the memory module and the Realizer system interconnections appropriately. This is the vector memory architecture used in the preferred embodiment.

1.3.2.6 A Specific Vector Memory Design

In the preferred embodiment, a common memory module is used for both design memory and vector memory applications. Its general architecture and design are discussed in the section on design memory and will not be discussed here. The details of how the module is configured for vector memory use follow.

The following two figures show the way logic in the MA and MD chips are configured for a combined stimulus/response vector memory, with full read/write access from the host interface. When the host interface is inactive, all operation is according to the same techniques shown in the simplified examples above.

Figure 32:
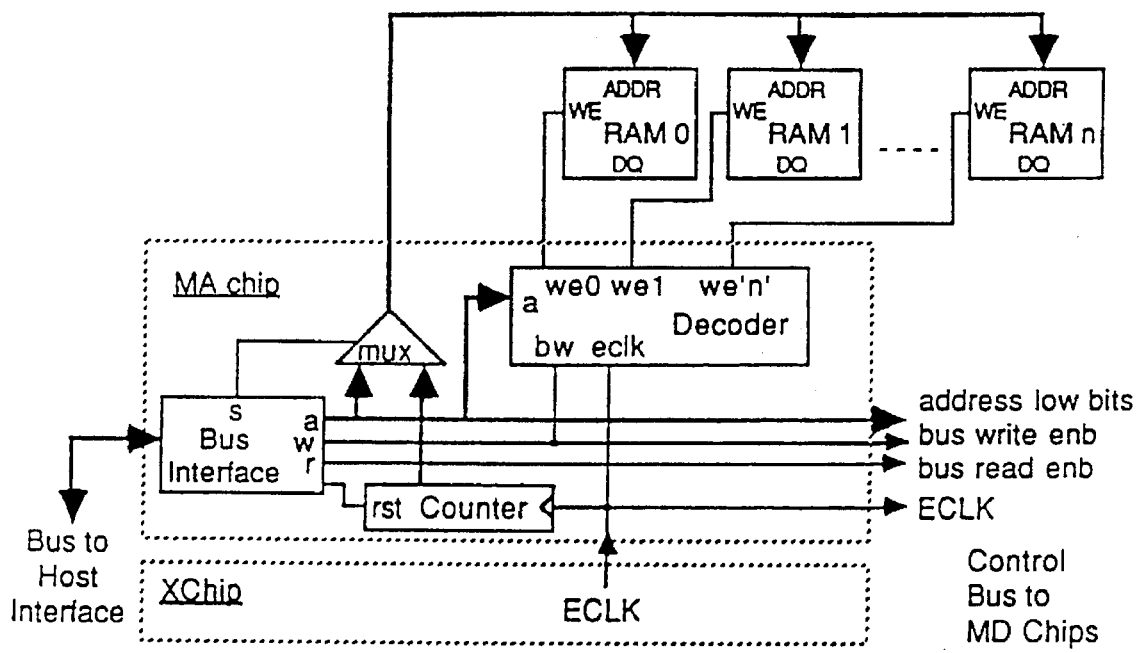
FIG. 32 is a schematic block diagram of a preferred embodiment of a vector memory address chip.

In FIG. 32, the ECLK signal, generated by the host via the host interface, is interconnected into the MA chip(s) via the interconnect. It clocks the address counter, which is configured in each MA chip. As there are more than one MA chip in a module, each controlling a subset of the RAMs, each MA chip has its own copy of the vector memory address counter. Since all counters get the same controls (ECLK, and a reset signal from the Bus Interface), each will always issue the same address as the others. Normally (when the bus interface is inactive), the address is passed from the counter out to address the RAMs. When ECLK is low (write response phase), the decoder logic asserts all RAM write enables, as in the previous examples. ECLK is also driven onto the Control Bus to drive logic on the MD chips.

Figure 33:
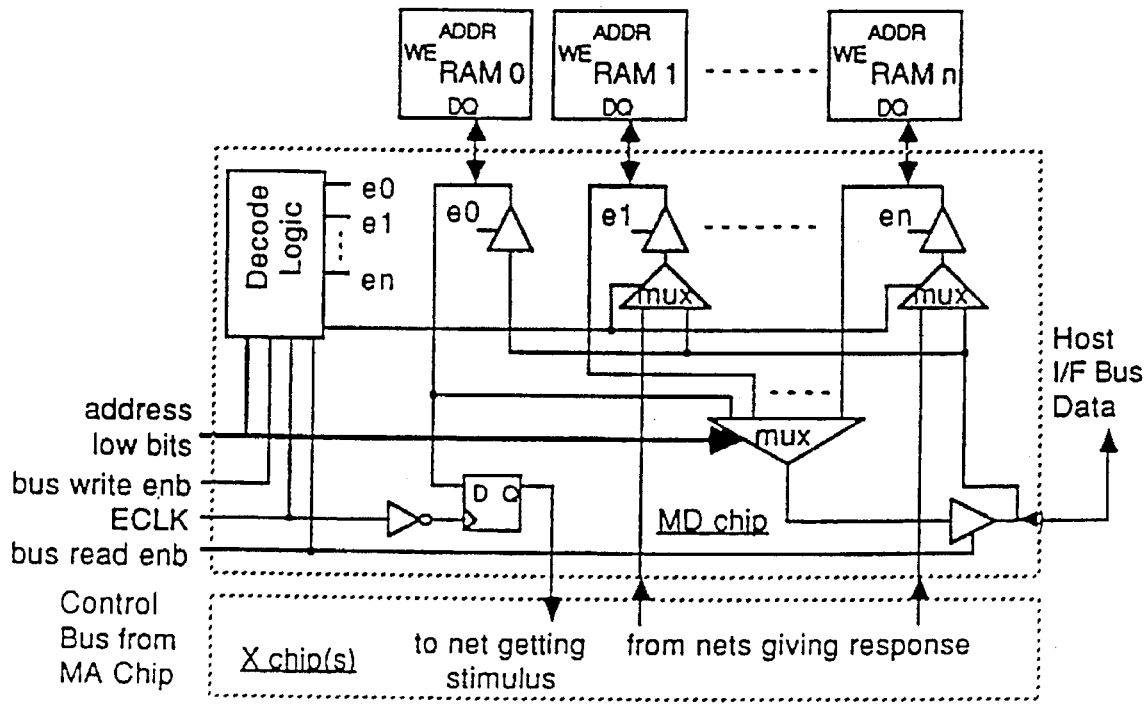
FIG. 33 is a schematic block diagram of a preferred embodiment of a vector memory data chip.

The MD logic handles the stimulus and response vector values themselves (FIG. 33). Normally (when the bus interface is inactive), when ECLK is high the RAMs are reading out stimulus vector values, and as ECLK falls they are clocked into flip-flops, one for each net to be stimulated (one shown), as above. The stimulus is then driven onto the nets via the interconnect's Xchips. When ECLK is low, all tri-state enables (e0, e1, ... en) are asserted so as to drive the response values coming in from the nets via the interconnect (two shown) onto the RAM DQ data pins, through the multiplexers.

When the host computer accesses this memory via the host interface bus (specifically the RBus, in the preferred embodiment), the bus interface logic configured in each MA chip becomes active. It switches the address multiplexer (mux) so that the bus addresses the RAMs. If the bus cycle is to write the RAMs, the decoder logic uses the address bits to decode which RAM is to be written and asserts the appropriate write enable signal. The address bits needed to select RAMs and the read and write control signals are also passed across to the MD chips via the Control Bus. On the MD chips, if the bus is doing a read cycle, the decode logic disables all tri-state RAM DQ pin drivers, address bits are used to select the addressed RAM's DQ data output through the read multiplexer, and the bus read enable signal drives the data value onto the host interface bus' data line for this bit. On a bus write cycle, the decode logic uses the write multiplexers to select the data value coming in from the host interface bus' data line instead of the nets giving response, and enables the tri-state RAM DQ driver for the addressed RAM, driving the data onto the RAM input.

1.3.2.7 Design Conversion and Specification of Vector Memories

To specify that a net is to be connected to a vector memory, the user marks the net with a special property in the input design, specifying a particular vector memory, and whether the connection is for stimulus or response. The design conversion method is based on a set of pre-defined partial netlist files, one for each of the module's logic chips, with statements for vector memory stimulus and response connections, vector memory data paths and control logic, and bus interface logic, as shown above.

This method assumes the ERCGA netlist conversion tool will not configure logic and interconnections for primitives and nets in the netlist file which are not usefully connected, such as inputs unconnected to any outputs or I/O pins, and outputs not connected to any inputs or I/O pins. There is logic provided for a stimulus connection and a response connection for each vector memory bit. Only the one for which interconnections are issued to the netlist will actually become configured; the other will not because it will not be usefully connected in the netlist.

The pre-defined files are complete, except for I/O pin number specifications for the module I/O pins which are used to connect the vector memory stimulus and response connections with the interconnect. The number of stimulus and response connections in each file is determined by how many I/O pins are available in the file's logic chip, and by how much logic can be accommodated each chip and by the module as a whole. The method follows:

Normal methods are used for design conversion, as described in the design conversion sections, with special exceptions for vector memory as follows:

The design reader reads the property information from the input design file identifying nets marked for vector memory connections, and puts one or more vector memory primitives, connected to the nets but not to the bus interface logic, into its design data structure. It also creates the ECLK net, connected to the host interface clock generator and to all vector memory primitives.

The partitioner is told by the user which Lchip positions on which boards have memory modules installed. Based on that data, it partitions the vector memory primitives into the memory modules in the normal way.

The interconnector treats the vector memory primitives identically to other logic chip primitives, determining L-X paths which connect them with the other primitives on their nets.

When the netlist files for each logic chip in the Realizer system are being written out, each vector memory net connection is netlisted by:

1) Determining which logic chip connects to the path chosen for the primitive by the interconnection procedure.

2) Deriving the logic chip I/O pin number from the path number and logic chip number using a procedure similar to that described for deriving ordinary logic chip I/O pin numbers.

3) Choosing a pre-defined stimulus or response vector memory connection from the ones on this logic chip which are unassigned to other nets so far.

4) Appending a statement to the netlist file for this logic chip, specifying that this logic chip I/O pin number is to be used for connecting to the pre-defined vector memory connection.

The design conversion system also issues a correspondence table file, relating net names with vector memories and vector memory bit positions, for use during operation.

The ERCGA netlist conversion tool only configures the logic and interconnections for the vector memory stimulus and response inputs which are used.

1.3.2.8 Stimulators

A stimulator is a single bit of storage, controlled by the host computer and driving a net in the design. It is used by the host to provide input signals to the design.

Figure 34:
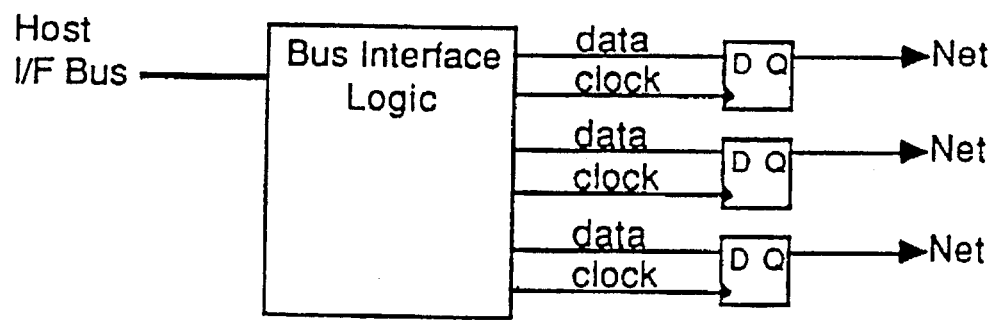
FIG. 34 is a schematic block diagram of random-access stimulators.

There are two types of stimulator: random-access and edge-sensitive. The random-access stimulator is simply a flip-flop whose output drives the design net into which data can be loaded on demand by the host, via the host interface bus. It is used for stimulating nets which may change value any time relative to other stimulated nets without changing the operation of a design. An example of such a net is the data input to a register. Each stimulator has a unique bus address, and when the host writes data to that address, the bus interface logic applies the data to the D input and cycles the stimulator flip-flop's clock input (FIG. 34).

Figure 35:
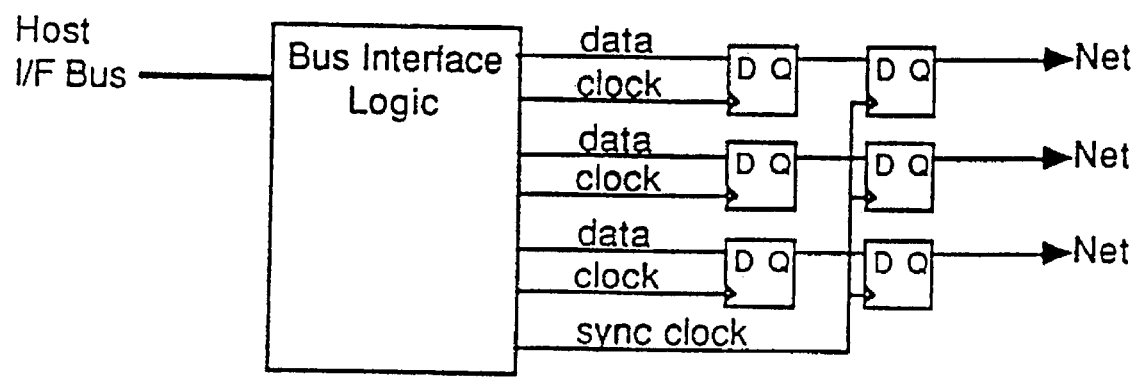
FIG. 35 is a schematic block diagram of edge-sensitive stimulators.

The edge-sensitive stimulator is used for stimulating nets whose changes must be synchronous with other such nets for correct operation of a design, for example, the clock inputs to registers. A second flip-flop is interposed between the output of a random-access stimulator and the design net. All such flip-flops in a group of stimulators which must be synchronized are connected to a common clock. To enter a new set of net values, the host loads new values into the first flip-flop of each stimulator via the host interface bus in any order, as above. When the new values are all to be applied to the design, the host cycles the common 'sync clock,' loading all values into the second flip-flops at once, thus driving all nets at once (FIG. 35).

1.3.2.9 Samplers

A sampler is a single bit of storage, controlled by the host computer and receiving a net in the design. It is used by the host to collect output signals from the design.

Figure 36:
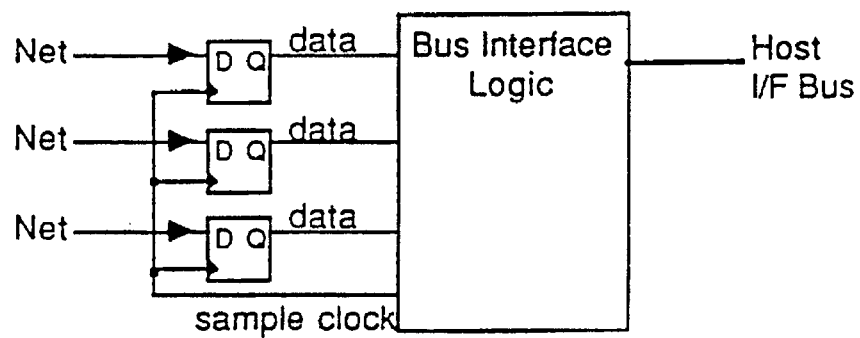
FIG. 36 is a schematic block diagram of samplers.

The simplest form of sampler is a flip-flop which receives the design net on its D input, and which can be clocked and read on demand by the host, via the host interface bus and bus interface logic. Usually many samplers are connected to a common 'sample clock'. Sampler data outputs have unique bus addresses, as does the 'sample clock' output. The host cycles the clock to take a group of samples, and then reads the sampled data values one by one (FIG. 36).

Figure 37:
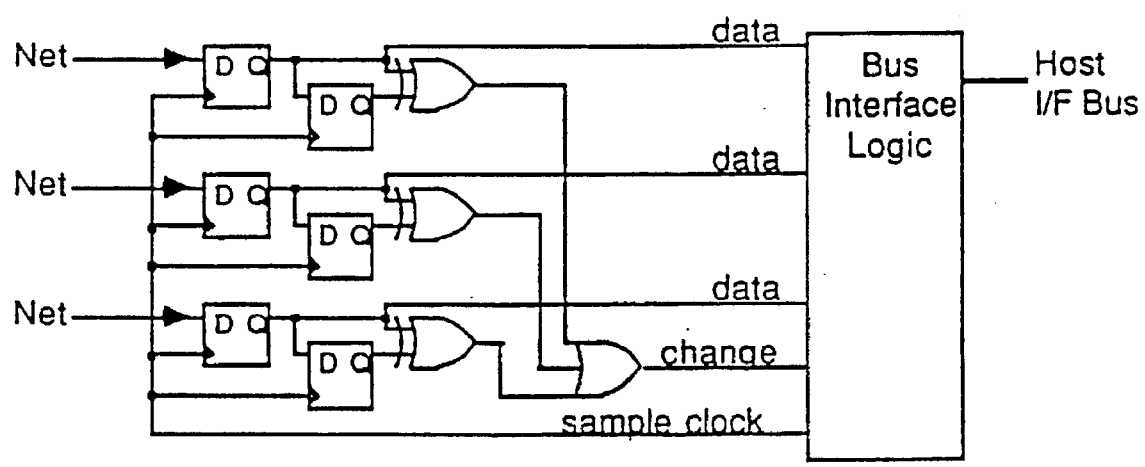
FIG. 37 is a schematic block diagram of change-detecting samplers.

To cut down on the amount of host I/O required, a second flip-flop is optionally added to make a change-detecting sampler. The second flip-flop is connected to the same clock as the sampling flip-flop, and its input is connected to the sampler's output. As a result it contains the value the sampler had before the most recent clock cycle. The two flip-flop outputs are compared by an XOR gate, which will output a high value when the two flip-flops differ because of a change in sampled value. All XOR outputs from a group of samplers are summed together by an OR gate, which is readable by the host. After sampling the nets by cycling the 'sample clock', as above, the host checks this OR gate 'change' value first to see if any values in the group have changed. If not, it does not need to read any of those sampler values (FIG. 37).

1.3.2.10 Design Conversion and Specification of Stimulators and Samplers

The sampler and stimulator flip-flops, logic gates and bus interface logic are realized in Realizer system logic chips. To specify that a net is to be connected to a sampler or stimulator, the user marks the net with a special property in the input design, specifying the specific type of stimulator or sampler and group identification. A general methodology for the design conversion software system to use for configuring the stimulators and samplers and connecting them to the rest of the design and to the bus interface is as follows:

Normal methods are used for design conversion, as described in the design conversion sections, with special exceptions for stimulators and samplers as follows:

The design reader reads the property information from the input design file identifying nets marked for stimulators and/or samplers, and put stimulator and sampler primitives, connected to the nets but not to the bus interface logic, into its design data structure.

The system partitioner has a data base of how many gate-equivalents each such primitive accounts for in a logic chip. It also has a gate-equivalent figure for the bus interface logic. Based on that data, it assigns the stimulators and samplers to logic chips according to its normal partitioning algorithm, with the additional condition that it lowers it logic capacity limit by the size of the bus interface logic, to account for the fact that each logic chip with one or more stimulators and/or samplers must have a bus interface logic block.

The interconnector treats the stimulator and sampler primitives identically to other primitives.

When the netlist files for each logic chip in the Realizer system are being written out, each sampler or stimulator primitive is netlisted with the following procedure:

2) The primitive statements for the gates and/or flip-flop(s) which make up the sampler or stimulator are issued to the netlist file for the logic chip it was partitioned into. Net names for the additional nets beyond the net which is being sampled or stimulated are derived from its name, according to a method similar to that described for interconnect primitives.

2) If this is the first stimulator or sampler netlisted to this particular logic chip file, a pre-defined netlist file segment for the bus interface is used to issue the primitives and nets that will configure the bus interface into the logic chip. The bus interface net connections which are used only once per interface are given standard names defined in that file segment. Those which are connected to the stimulator or sampler logic are given derived net names coordinated with the names used when issuing the primitives in step 1.

A simpler but less general methodology realizes stimulators and samplers only in the logic chips of a memory module or user-supplied device modules. It assumes the ERCGA netlist conversion tool will not configure logic and interconnections for primitives and nets in the netlist file which are not usefully connected, such as inputs unconnected to any outputs or I/O pins, and outputs not connected to any inputs or I/O pins. It is based on a set of pre-defined partial netlist files, one for each of the module's logic chips, with statements for the following:

1) A number of edge-sensitive stimulators, all connected to a common 'sync clock'.
2) A number of change-detecting samplers, all connected to the same 'sample clock'.
3) Bus interface logic for all of the above.

The pre-defined files are complete, except for I/O pin number specifications for the module I/O pins which are used to connect the samplers and stimulators with the interconnect. The control bus is used to distribute common signals, such as the sync and sample clocks, among the logic chips. The number of stimulators and samplers in each file is determined by how many I/O pins are available in the file's logic chip, and by how much logic can be accommodated each chip and by the module as a whole. The method follows:

Normal methods are used for design conversion, as described in the design conversion sections, with special exceptions for stimulators and samplers as follows:

The design reader reads the property information from the input design file identifying nets marked for stimulators and/or samplers, and puts stimulator and sampler primitives, connected to the nets but not to the bus interface logic, into its design data structure.

The partitioner is told by the user which Lchip positions on which boards have memory modules and user-supplied device modules installed. Based on that data, it assigns memory and USD primitives to the modules first, then partitions stimulator and sampler primitives into the remaining such modules according to its normal partitioning algorithm, up to the limit of the number available per module.

The interconnector treats the stimulator and sampler primitives identically to other logic chip primitives, determining L-X paths which connect them with the other primitives on their nets.

When the netlist files for each logic chip in the Realizer system are being written out, each sampler or stimulator primitive is netlisted by:

1) Determining which logic chip connects to the path chosen for the primitive by the interconnection procedure.
2) Deriving the logic chip I/O pin number from the path number and logic chip number using a procedure similar to that described for deriving ordinary logic chip I/O pin numbers.
3) Choosing a pre-defined stimulator/sampler from the ones on this logic chip which are unassigned to other nets so far.
4) Appending a statement to the netlist file for this logic chip, specifying that this logic chip I/O pin number is to be used for connecting to the pre-defined sampler/stimulator.

The ERCGA netlist conversion tool only configures the logic and interconnections for the stimulators, samplers and related bus interface logic which are used.

In both methods, the design conversion system also issues a correspondence table file, relating net names with specific stimulator and samplers and corresponding addresses on the host interface bus, for use during operation.

1.3.3 User-Supplied Devices

Since the input design is realized in actual working hardware in the form of configured logic and interconnection chips, it is practical and desirable to connect other actual hardware devices to the Realizer system. These may be any devices with digital inputs and outputs, such as microprocessor or other VLSI IC chips, digital/analog converters, display devices, input keyboards and switches, storage devices, computer input/output busses, etc. These may also be parts of digital systems, such as circuit boards or larger scale components, of which the realized design is a part.

These devices represent the part of the input design to be realized which cannot be implemented in the Realizer system's logic gates, flip-flops and memories, either for physical reasons, such as a display, because of a lack of sufficient Realizer system resources, such as a mass storage device, or because the logical description is not available, such as a standard microprocessor. Alternatively, they may represent devices which the user does not want to realize with Realizer system resources, such as a semi-custom gate array chip which has been fabricated and is known to be correct, because there is no need to consume Realizer system resources to implement it, or because the user wishes to test whether the realized part of the design operates correctly with it. Since they are not part of all Realizer systems, but instead are supplied by the user according to the needs of his designs, these devices are called "user-supplied devices" (USD).

There is such a variety of possible USDs that it is useful to provide a Realizer system with a standard means for a user to connect such devices to the Realizer system hardware. This means is the user-supplied device module (USDM).

1.3.3.1 User-Supplied Device Module

The user-supplied device module:

1) Provides a means of physically connecting user-supplied hardware devices.
2) Provides connections between the USDs and Realizer system logic and/or interconnection chips. Since the USDs fulfill roles in the design similar to logic chips, it is expedient to interconnect USDMs in the same way as logic chips.
3) Provides the ability to freely assign USD pins to interconnect pins, as the logic chips normally installed in the LChip location do.

Figure 38:
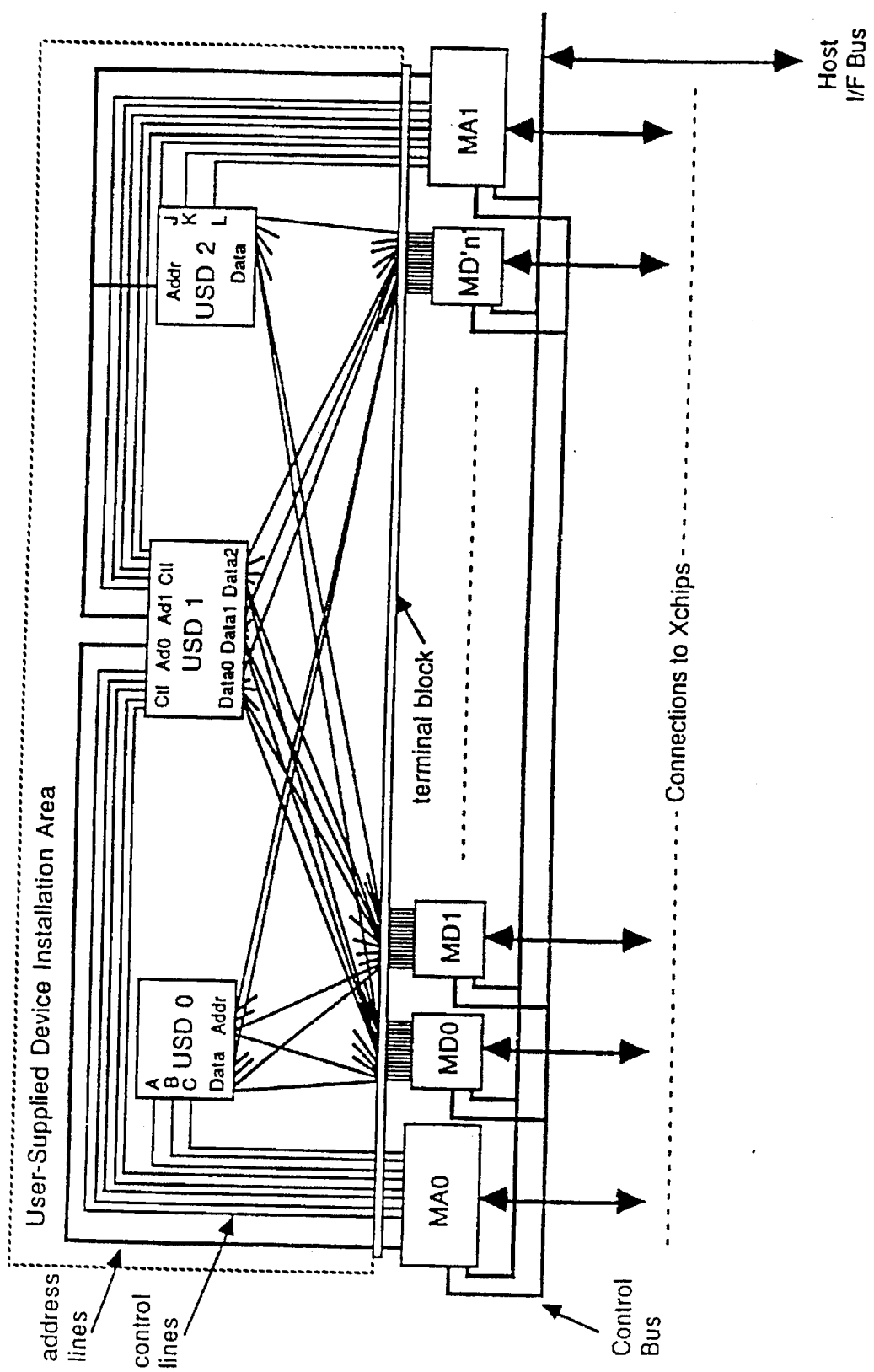
FIG. 38 is a schematic block diagram of a user-supplied device module architecture.

Since it should provide capabilities similar to what a memory module provides for its RAM chips, the architecture of the USDM is similar to that of a memory module. FIG. 38 shows the USDM architecture. Devices are installed on the user-supplied device installation area, which can be an area of the USDM printed circuit board, a removable daughtercard plugged into the USDM, or another such area connected via cable in the manner common in microprocessor emulator instruments. A terminal block provides a means for making electrical connections between device input and output pins and the USDM logic chips, through a connector, terminal strip, set of printed circuit board pads, or other such means. It also may provide electrical power for the devices. One or more devices may be installed as physical and terminal block pin capacity permits. Alternatively, devices may be connected remotely via cabling and repeated devices in the common manner.

Each MA and MD logic chip has some I/O pins connected to the terminal block, and some connected to the interconnect. These chips are connected to the interconnect in the same manner described for memory module address and data path logic chips. Optionally, they may also be connected to the host interface bus and/or a common control bus, for purposes similar to their uses in memory modules, as shown.

USD address and data busses are normally connected to the MD chips in a manner such that the bus data bits are distributed across the MD chips, and thus across the interconnect. The MA chips are used for USD control lines and optionally for USD address lines. The figure shows three hypothetical user devices connected to illustrate possibilities. USD0 has its data and address busses connected via the MD chips and its control lines, A, B and C, connected via MA0. USD1 has three data busses connected to the MD chips, and address and control connections through both MA chips. USD2 uses MA1 for addressing and the MD chips for data. In any particular case, the realizer system user can connect their USDs in a manner appropriate to their design and usage.

Bi-directional USD connections are interconnected in the same way as the bi-directional RAM DQ pins are in a memory module MD chip, as shown in that section. A difference is the requirement that a net in the input design should be specified as the output enable control. This net will be connected to the interconnection logic in the same way as the "design output enable" is shown in the memory module FIGS. 25 and 26, to control the MD chip's bi-directional drivers. If a suitable output enable control net is not ordinarily present in the input design, the user should create one.

1.3.3.2 Preferred Embodiment USDM

Figure 39:
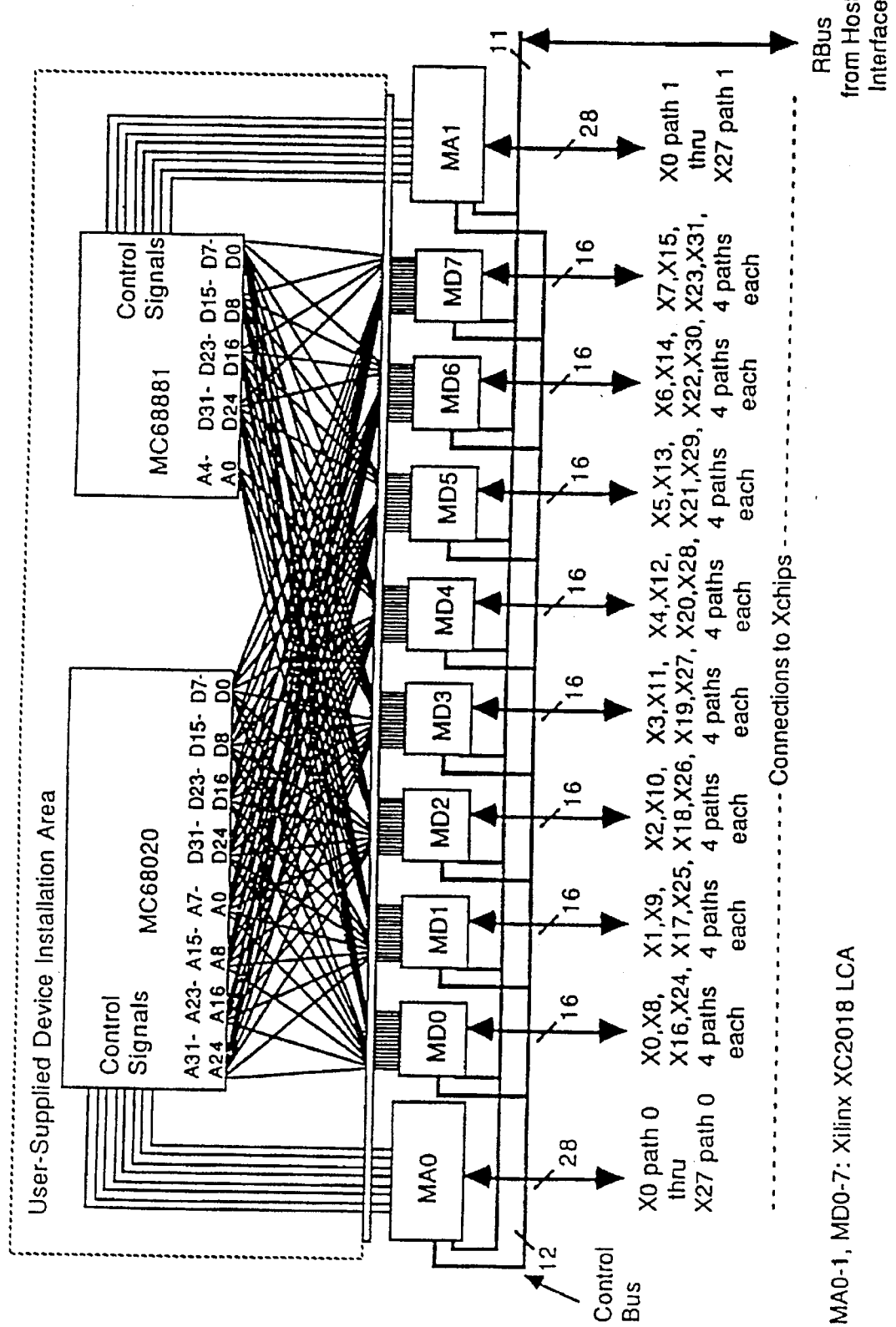
FIG. 39 is a schematic block diagram of a preferred embodiment of a USDM with devices installed.

In the preferred embodiment, shown in FIG. 39, the USDM is identical to a Realizer memory module, with an area for installing USDs taking the place of the RAM chips. Each of the eight MD chips interconnects up to 16 USD pins, and each of two MA chips interconnects up to 23 USD pins.

The figure shows two actual VLSI devices installed, a Motorola MC68020 32-bit microprocessor ("MC68020 32-Bit Microprocessor User's Manual", Motorola, Inc., Phoenix, 1984), and a Motorola MC68881 floating point coprocessor ("MC68881 Floating Point Coprocessor User's Manual", Motorola, Inc., Phoenix, 1985). These devices are good examples of USDs, as they are commonly used in digital system designs, and their logic network representations are not available to the user. They have the following input/output pins, details about which may be found in the references:

MC68020
Data: D31-D0, bi-directional. Output enable condition: When R/W indicates "write" and DBEN is true, D31-D0 are driving outputs, else they are receiving inputs.
Address: A31-A0, output.
Cntrl Inputs: CLK, DSACK0, DSACK1, AVEC, CDIS, IPL0-IPL2, BR, BGACK, RESET, HALT, BERR.
Cntrl Outputs: R/W, IPEND, BG, DS, DBEN, AS, RMC, OCS, ECS, SIZ0, SIZ1, FC0–FC2.

MC68881
Data: D31-D0, bi-directional. Output enable condition: When R/W indicates "read" and DSACK0 and/or DSACK1 are true, D31-D0 are driving outputs, else they are receiving inputs.
Address: A4-A0, input.
Cntrl Inputs: CLK, SIZE, RESET, AS, R/W, DS, CS.
Cntrl Outputs: DSACK0, DSACK1.

The data and address busses are interconnected by the MD chips. Bus data bits are sliced across the crossbar as shown to facilitate interconnection, as discussed in the memory datapath section. Control signals are interconnected by the MA chips.

The output enable control signals are generatsed by special logic connected to the control signals as specified above, which is included by the user in the input design and realized in the Lchips with the rest of the design. Since each MD chip connects to a different set of L-X paths, and since output enable controls are usually common to an entire bus, the design conversion system connects those nets to one of the MA chips, and configures the MA and MD chips to use the USDM control bus to connect the net to those MD and MA chips that must connect to it.

1.3.3.3 Design Conversion for User-Supplied Devices

A USD is represented in the input design by a special primitive. It carries property data which identifies a USD specification file, created by the user. This file identifies in which LChip location the USDM with this device is installed, and lists the USD's I/O pins, using the pin names used in the input design's USD primitive. For each pin, it lists the USDM logic chip and pin number that pin is connected to, and whether the pin is an input, an output, or bi-directional. If it is bi-directional, the name of the output enable control net in the input design is also listed.

The design conversion software system generates the netlist files which will configure the USDM and connect it to the rest of the design. The normal methods are used, with exceptions for the USDs, as follows:

The design reader reads the USD primitive into its design data structure. It uses the file property to read in the USD specification file, and stores that information associated with the primitive record for later use. The primitive record is given an extra pin connected to each different output enable control net.

The conversion stage checks to see that the configuration is available and the pins correspond to the configuration correctly.

The system partitioner assigns the USD to the LChip location specified in the USD specification file.

The interconnector assigns nets connected to USD pins to specific L-X interconnect paths. It does this subject to the constraints that nets connected to USD pins may only be assigned paths which connect to the MA or MD chip specified in the USD specification file, and enable control net pins may only be assigned paths which connect to an MA chip.

To issue the netlist files for a USDM:

For each output enable control net controlling the USD(s) on this USDM:
Issue primitives to this net's MA chip's netlist file for:
An input buffer receiving the L-X path used for this net, driving the input of an output buffer which drives a control bus line allotted to this net.

For each net connected to the USD(s) on this USDM:
If it drives a USD input pin, issue primitives to this pin's logic chip's netlist file for:
An input buffer from the receiving path used for this net, driving the input of an output buffer which drives the terminal block pin used for this USD pin.
If it receives a USD output pin, issue primitives to this pin's logic chip's netlist file for:
An output buffer to the driving path used for this net, receiving the output of an input buffer which receives the terminal block pin used for this USD pin.
If it's connected a USD bi-directional pin, issue primitives to this pin's logic chip's netlist file for:
An input buffer from the receiving path used for this net driving the data input of a tri-state output buffer which drives the terminal block pin used for this USD pin.
An output buffer to the driving path used for this net, receiving the output of a 2-input AND gate, with one input driven by an input buffer which receives the terminal block pin used for this USD pin.
An input buffer from the control bus line allotted to this pin's output enable control net, driving the enable input of the tri-state output buffer and the other input of the AND gate.

1.4 Configuration

As described in the section on logic and interconnect chip technology, the configuration bit patterns for each chip are generated by the ERCGA netlist conversion tool. The final stage of the Realizer design conversion system collects the data from the configuration files generated for all chips into a single binary configuration file for the design, which is permanently stored in the host computer.

Before each use of the Realizer system, its logic and interconnect chips are configured for the design to be used, by reading data from the configuration file, transferring it into the Realizer hardware through the host interface, and loading it into the chips. Configuration connections are provided between the host interface and all logic and interconnect chips in the system. Once the chips are configured, the total of all their logic functions and interconnections matches that specified by the input design, and operation of the design can proceed.

In the preferred embodiment, Xilinx LCAs are used as logic and crossbar chips. The LCA is configured by loading its binary configuration bit pattern into the LCA configuration memory's serial shift register one bit at a time. Each bit is applied to the configuration data input (DIN), and loaded by cycling the configuration clock (CCLK) once.

A unique configuration connection between each LCA and the host interface is not provided, as a system can have up to 3520 total logic and crossbar chips. Instead, there is a configuration bus, consisting of a multi-bit data path and a configuration clock, which is connected to all boards which have LCAs. Logic and crossbar chips are grouped for the purposes of configuration, with as many chips per group as there are bits in the data path. All chips in one group are configured in parallel.

Figure 40:
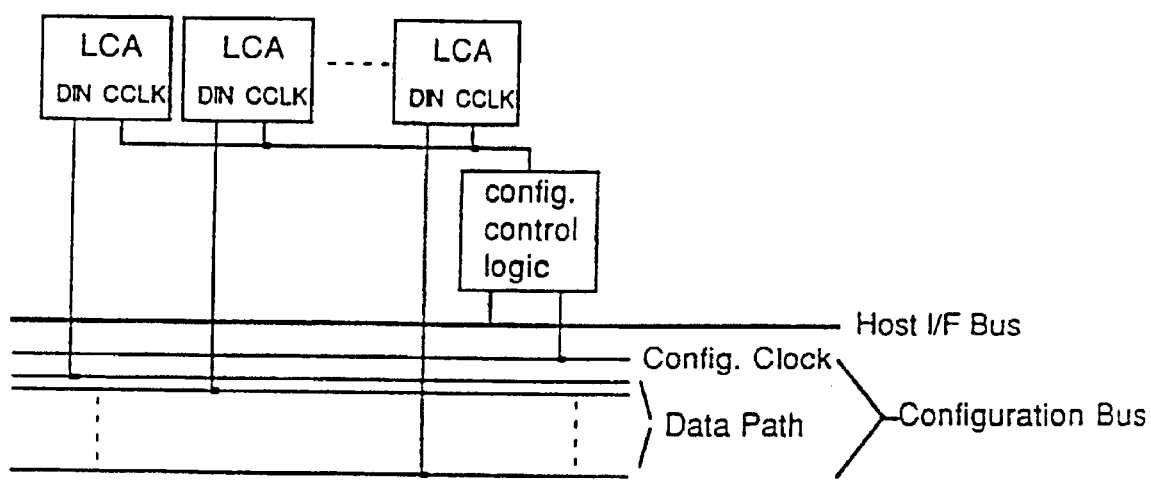
FIG. 40 is a schematic block diagram of a configuration group.

As shown in FIG. 40, each LCA in a group has its configuration data input connected to a different bit of the bus data path. A configuration control logic block for each group is connected to the host interface bus, the bus configuration clock, and the clock inputs of all LCAs in the group. These control logic blocks are selectively enabled, by host commands via the host interface bus, to cause only the group of LCAs for which the data on the bus is intended to receive clock signals and become configured.

This is the procedure followed by the host computer to configure the Realizer system. The control actions and data transfers are all made via the host interface:

To configure all logic and crossbar chips:
For each configuration group:
Direct the control logic block for this group to pass the configuration clock to its chips.
For as many cycles as there are configuration bits in one LCA:
Load one configuration bit for each chip in this group onto the bus data path.
Cycle the bus configuration clock once.
Next cycle.
Direct the control logic for this group to no longer pass the configuration clock.
Next group.

1.5 Host Interface

The Realizer system operates as a peripheral under control of the host computer. The host computer configures the Realizer system's logic and interconnect chips according to a design, using the configuration bit pattern stored in the design's configuration file. It controls the subsequent operation of the design by controlling its external reset and clock signals. It then interacts with the design by controlling stimulators, samplers and vector memories, and by reading and writing the contents of vector and design memories. The host computer does all this via the Realizer system host interface, which controls the Realizer system's host interface and configuration busses.

1.5.1 Host Interface Architecture

Figure 41:
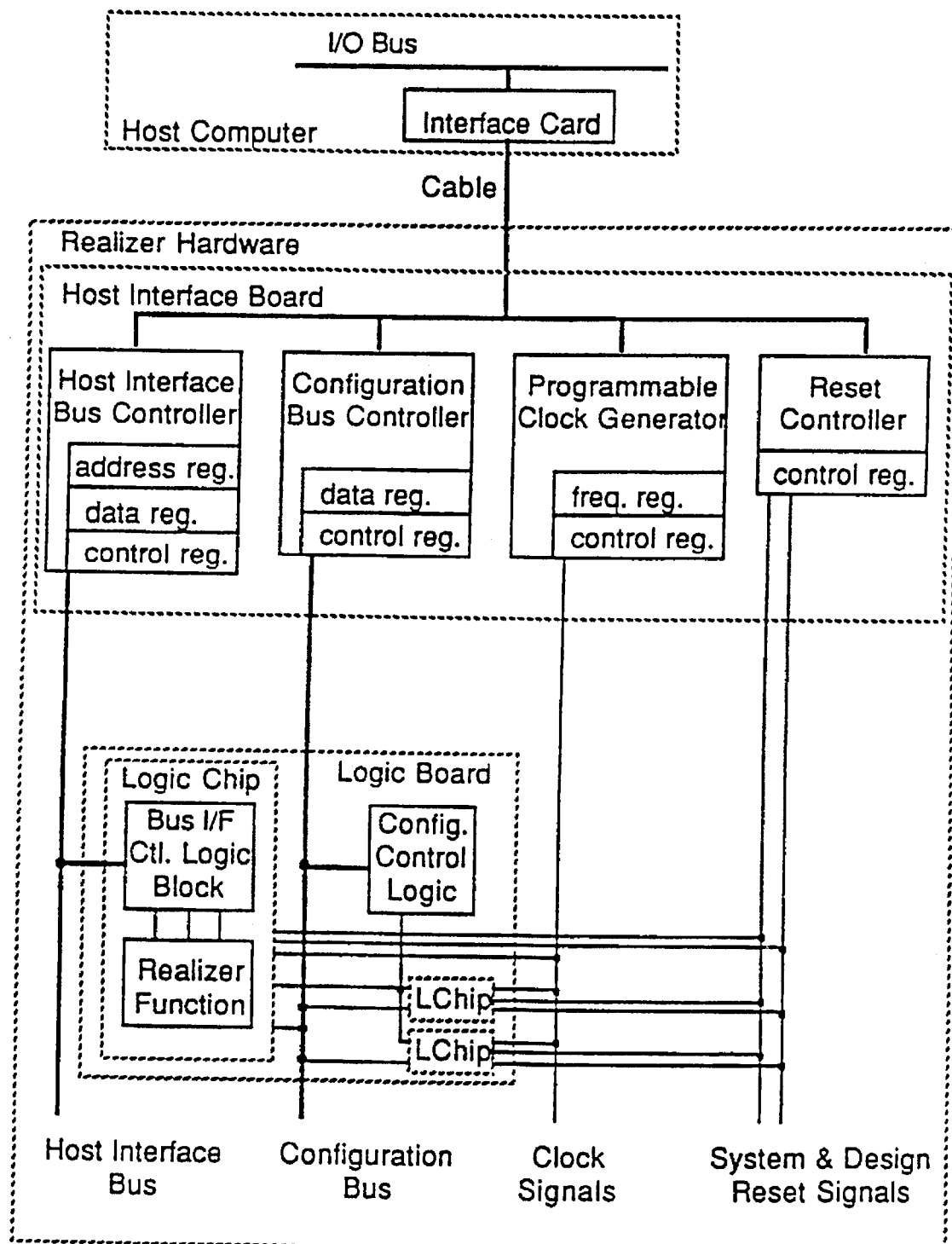
FIG. 41 is a schematic block diagram of a host interface architecture.

The Realizer system host interface is built along entirely conventional lines (FIG. 41). It consists of the host interface bus controller, the configuration bus controller, the clock generator and the reset controller, each of which is described below. The interface is built on a board or boards in the Realizer hardware chassis, and is connected to the host computer's I/O bus through a cable and an interface card. Host interface control functions are mapped into either the host computer's memory address space or input-output bus space, according to the requirements of the particular computer.

1.5.2 Host Interface Bus

The host interface bus is connected to I/O pins of some or all regular logic chips and memory module logic chip in the Realizer system. It has an address space to which Realizer system control and data access functions are assigned. The host is the only bus master, and issues addressed read and write commands to the bus via the host interface bus controller, which transfers data between Realizer system functions and the host.

Host interface control logic blocks are programmed into the main logic chips and memory module logic chips to allow Realizer system functions to be controlled via this bus. Specific examples of functions controlled by this bus are samplers, stimulators, vector memory addressing, operation, and host data access, and design memory host data access. Since these control blocks are all programmed into logic chips, their specific functions and locations in the bus address space are all defined by logic chip programming and can be changed to suit the particular needs of any given design or mode of operation.

The particular design of the host interface bus depends on the data access speed and hardware pin availability of a particular Realizer system implementation. In the preferred embodiment, an 11-pin host interface bus, called the RBus, is connected to dedicated I/O pins on all Lchips. Its hardware has eight bidirectional lines used for data and address, a clock, two control lines. The RBus has a 32-bit address space and an eight-bit data width, allowing the host to read or write eight bits of data to or from up to four billion unique locations. It is interfaced to the host computer through an address register, a data register and a control register, which are made by the host interface bus controller to appear in the memory or input/output space of the host computer in the conventional manner.

Examples of functions connected to the Rbus are:
1) A group of eight samplers, whose sample clock is cycled when one location is written to via the RBus, and whose sampled data values are read from another RBus location, according to host commands.
2) A group of eight random-access stimulators, whose data values are changed when the host writes to a specific RBus location.
3) A design memory, each of whose memory locations are mapped onto unique RBus locations. An RBus read or write operation into that address space causes the addressed design memory location to be read or written by the host, providing host data access.

Other such functions can readily be devised.

Figure 42:
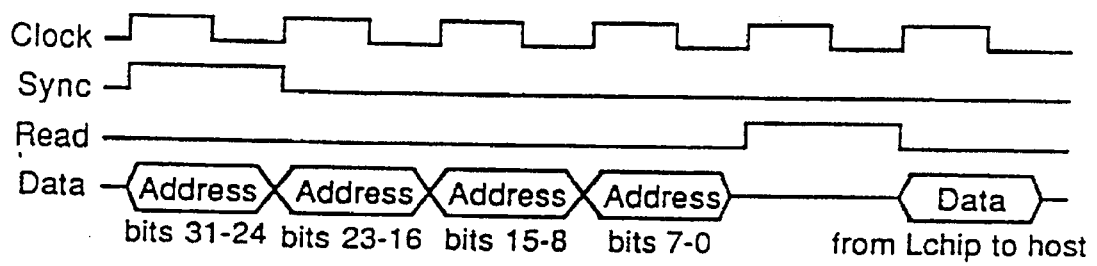
FIG. 42 illustrates RBus read and write cycles.
Figure 42:
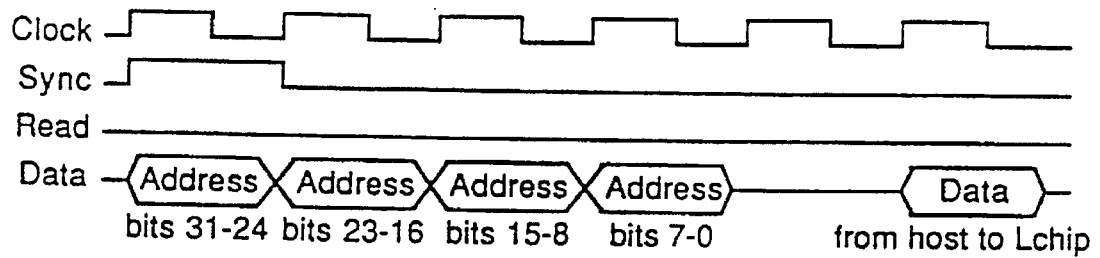

RBus operation is shown in FIG. 42. To read a location, the program running on the host computer which is operating the Realizer system loads the address into the host interface bus address register, and sets the "read" command bit in the host interface bus control register. The host interface bus controller then operates an RBus read cycle. The address is presented on the RBus data lines eight bits at a time, accompanied each time by a cycle of the RBus clock. During the first cycle, the bus controller asserts the "sync" RBus control line to signify that an RBus cycle is starting. Then the "read" RBus control line is and the RBus clock is cycled a fifth time, allowing the bus interface control logic block which was addressed to complete its read operation. The RBus clock is cycled a sixth time, during which the bus interface control logic block which was addressed drives the read data onto the eight RBus data lines. The bus controller captures this data, loads it into the host interface bus data register, and sets the "complete" command bit in the host interface bus control register. The host program, recognizing the "complete" bit has been set, reads the data and clears the "complete" bit.

Writing a location is similar, except that the host program sets the "write" command bit and loads the data to be written into the host interface data register, the bus controller does not assert the "read" Rbus control line in the fifth clock cycle, and drives the data onto the RBus data lines in the sixth cycle, when it is captured by the addressed bus interface control logic block.

The bus interface control logic block configured into a logic chip consists of a finite state machine and data paths which connect the RBus with the controlled function in an entirely conventional manner according to the operation described above.

1.5.3 Configuration Bus

The configuration bus and its use and operation is described in the configuration section. It is controlled by the host computer via the host interface. It is interfaced to the host computer through a data register and a control register, which are made by the host interface hardware to appear in the memory or input/output space of the host computer in the conventional manner. Data loaded into the configuration bus data register by the configuration program running on the host computer is driven onto the configuration bus data path. When the host computer writes to the configuration bus control register, the host interface hardware cycles the configuration bus clock one cycle.

1.5.4 Reset Controller and Clock Generator

The Realizer system reset controller generates two reset signals. The system reset signal is connected to the reset input pins of all logic and interconnect chips. When asserted by the host, all chips are put into their reset mode, so as to be ready for configuration.

One or more programmable clock signal generators of conventional design have their output signals distributed to an I/O pin of all Lchips. The host controls its output frequency, and can cause is to stop cycling, cycle once, cycle a specified number of times, cycle continuously, and so forth. It is used as a clock generator for designs implemented in the Realizer system, and controlling the clock signals is a means of controlling design operation. The design reset signal is connected to an I/O pin of all Lchips. It is used as a means of resetting the design implemented in the Realizer system.

These signals are available for connection to the design implemented by the Realizer system. A net in the input design is designated as system reset or a clock by attaching a special property to it in the input design file. The design reader recognizes this property, and marks the net as a reset or clock net in the design data structure. The interconnection and netlisting part of the design conversion system assigns this net to the I/O pin connected to the design reset signal or clock signal in the hardware.

2 Realizer Design Conversion System

Figure 43:
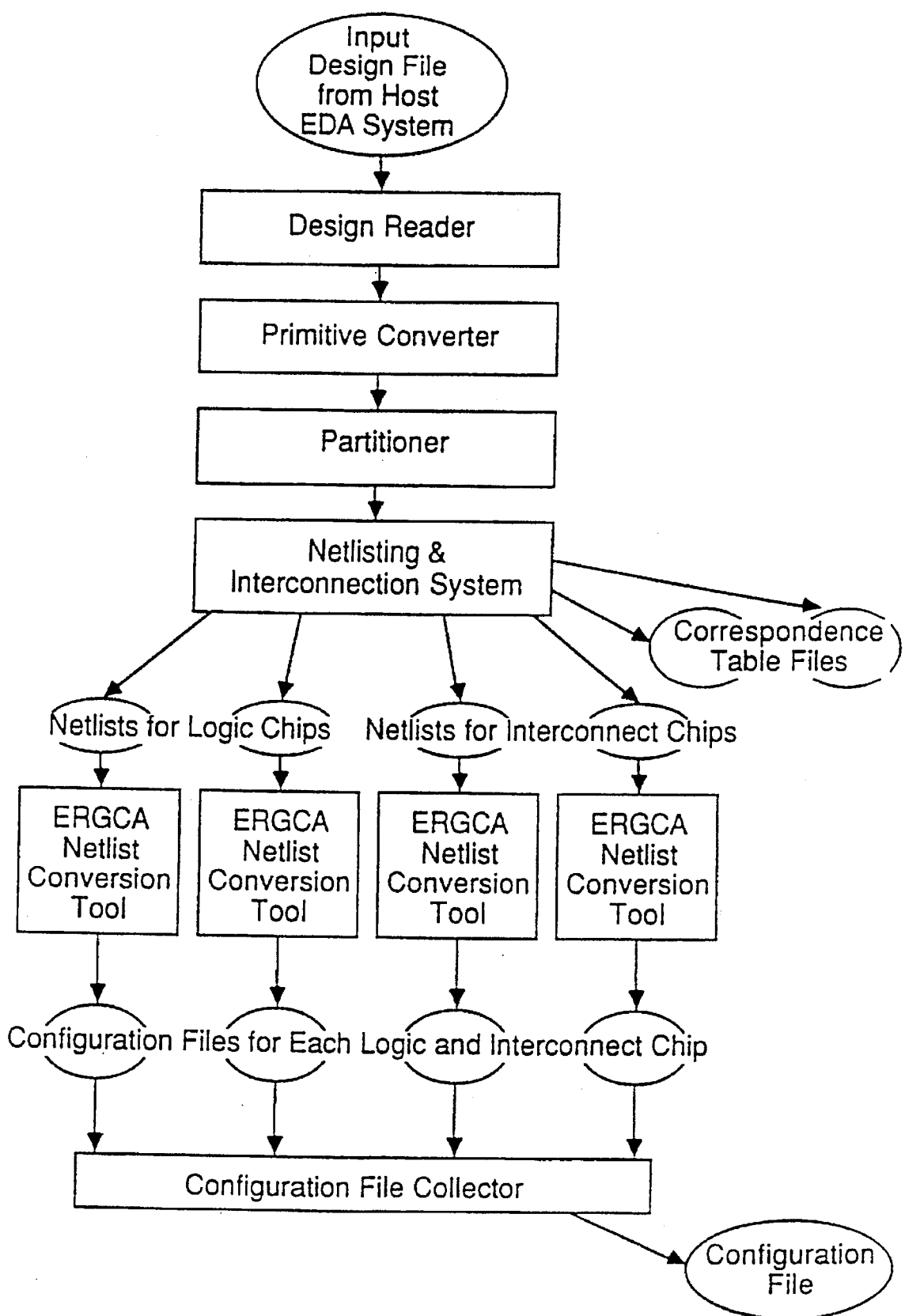
FIG. 43 is a schematic block diagram of a Realizer design conversion system.

The Realizer Design Conversion system consists of the design reader, primitive convertor, partitioner, netlisting & interconnection system, ERCGA netlist conversion tool, and configuration file collector (FIG. 43). It takes the input design file as input, and creates a configuration file and correspondence table file as output, which are used by the various applications to configure and use the Realizer hardware.

To convert an input design:

1) Read the design into the memory data structure with the design reader.
2) Convert the primitives in the design data structure from host EDA system-specific primitives, into logic chip primitives which can be issued in the netlist files compatibly with the ERCGA netlist conversion tool.
3) Use the partitioner to determine which logic chip each primitive will be configured into.
4) Use the netlisting & interconnection system to generate netlist files for each logic and interconnect chip in the Realizer hardware system.
5) Use the ERCGA netlist conversion tool repeatedly, converting each netlist file into a corresponding configuration file.
6) Use the configuration file collector, which is a simple method which collects the configuration data from each logic and interconnect chip's configuration file into a single configuration file for this design, which is used to configure the Realizer hardware.

The method for design conversion described here applies to converting the combinational logic gates and flip-flops in the input design, except as noted. Variations of these method are used to convert the special-purpose element primitives. These variations are described in those sections.

2.1 Design Reader

The design reader reads the input design file and builds the corresponding design data structure.

2.1.1 Requirements for Input Design File

The input design file created by the host EDA system contains descriptions of primitives and their input and output pins, and of nets which interconnect two or more pins with each other and with input and output terminals of the design. It also contains information related to the primitives, pins and nets, such as names, etc.

The input design file should be in primitive form to be read by the Realizer design conversion system. A "primitive" is a basic logical element, such as a gate, flip-flop, or memory device. Higher-level structures which may have been specified by the designer, and which are defined in terms of primitives, should be resolved down to their constituent primitives by the EDA system before it is read by the Realizer system. An example of a set of primitives which are allowable in an input design is the following subset of Mentor Graphics QuickSim primitives, read by the preferred embodiment:

Simple gates (BUF, INV, AND, OR, NAND, NOR, XOR, XNOR) with up to 25 inputs.

Special gates (DEL, a delay element; RES, a resistor; NULL, an open circuit).

Unidirectional transfer gate (XFER), which is a tri-state output.

Storage devices (LATCH, a level-sensitive flip-flop, or REG, a clocked flip-flop)

Memory devices (RAM or ROM).

2.1.2 Design Data Structure

The design reader builds the design data structure, which will be used to convert the primitives into a form suitable for logic chip netlisting, to partition the primitives into logic-chip-sized partitions, to determine how the logic chips will be interconnected, and which will finally be read out into netlist files for each of the Realizer logic chips. The data structure consists of a record for each primitive, each pin, and each net in the design. Each record contains data about its entity, and links (i.e. pointers) to other records according to their relationship.

A "primitive" is a basic logical element, such as a gate, flip-flop, or memory device.

Each primitive is represented by a primitive record, containing data about the primitive, such as its type and an object i.d., and containing links to other primitives.

Primitive records are in a doubly-linked list.

A "pin" is an input or output connection of a primitive.

The pins of a primitive are represented by a series of pin records which are located contiguous with the primitive record, and which contain data about the pin, such as its name, whether it is inverted, its output drive, etc.

Each primitive has only one output pin, which may be any of the pin records.

A "net" is a collection of pins which are interconnected.

Each net is represented by a net record, containing data about the net, such as its object i.d., and containing links to other nets.

Net records are in a doubly-linked list.

The pins of a net are in a singly-linked circular list.

Each pin record also has a link to its net record.

Each net record has a link to one of its pins.

Figure 44A:
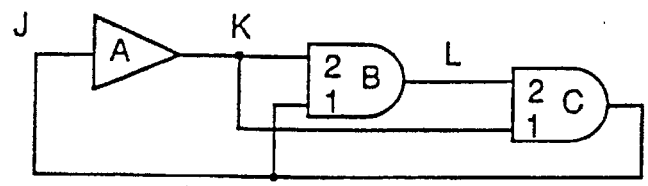
FIGS. 44a and 44b illustrate design data structure used in the present invention.
Figure 44B:
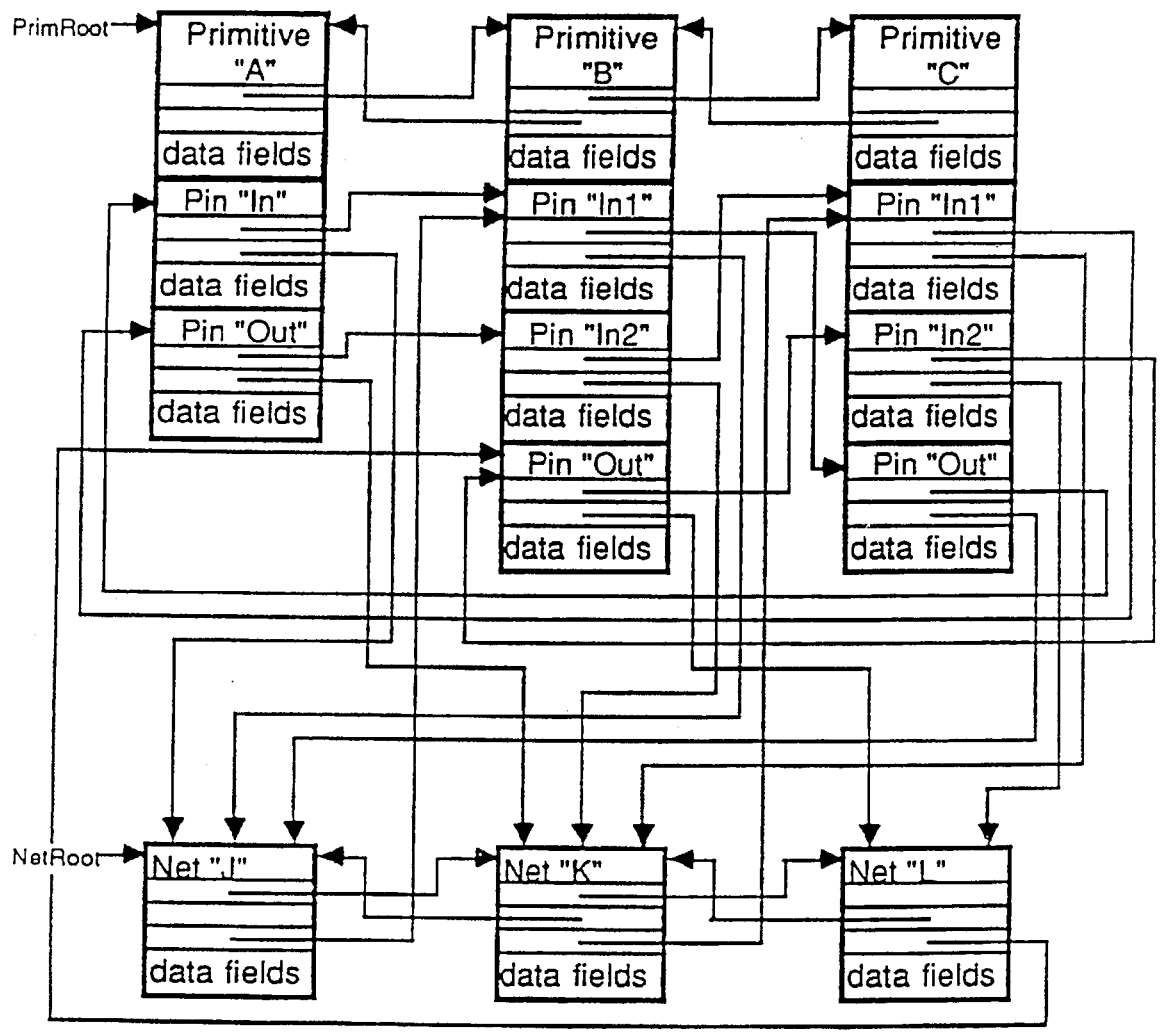

FIG. 44a shows a simple example circuit network, and FIG. 44b shows how it would be represented with the design data structure.

2.1.3 Design Reader Methodology

The purpose of the design reader is to read the design to be realized out of the input design file and build the corresponding design data structure. This description applies to the Mentor Graphics design file; others are similar. The design file has an entry, called an instance, for each primitive in the design. Properties are information about particular aspects of the primitive which are attached to the instance in the design file. The names in parenthesis which follow each step are the names for the actual routines used in the preferred embodiment.

1) Make a record of a primitive and its pins in the in-memory data structure for each primitive in the design file as follows:

For each instance of a primitive in the design file:
Read what type of primitive it is. (get_dfi_model_type)
Get information about user-defined placement of this primitive, if present, from the "lchip" property; use the design file interface to search higher, non-primitive instances which contain this primitive to look for the property there as well. (get_dfi_lchip)
For each pin of the instance:
collect any properties, such as pin name, which are on the pin. (get_dfi_pin_info)
Next pin.
Allocate a record in the in-memory design data structure for this primitive and its pins, (alloc_prim_and_pins) and fill in the primitive record.

For each pin:
   Fill in the pin record. (Remember the connected net's object i.d. number in the design file, keeping track of the maximum i.d. number.)
   Next pin.
Next design file instance.
Allocate a table (net_table) of pointers to pin records (pin pointers), one for each possible net, indexed by object i.d. number, initially NULL. Size the table according to the maximum i.d. number found above.

2) Link the pin records of each net together into a circularly-linked list for each net as follows:
   For each primitive record in the in-memory data structure:
      For each pin record:
         'id' is the connected net's object i.d. number for this pin.
         If net_table[id] has a non-NULL pin pointer, copy it to this pin record's "next_pin" link.
         Put the pin pointer to this pin into net_table [id].
      Next pin.
   Next primitive.

3) Make a net record for each net as follows:
   For each pin pointer in the net_table:
      Allocate a net record.
      Connect it with a link to the pin pointed to by the pin pointer.
      Get information about that net from the design file interface by addressing it with its object i.d. number (dfi_$get_net, get_dfi_net_info).
      For each pin in the circular list of pin records for this net:
         Point it to this net record.
      Next pin.
      Close the circular list: Link the last pin to the first.
   Next pin pointer.
   Free the net_table storage.

4) The in-memory design data structure is now complete, representing all the data about the design to be realized which will be needed by the later stages of the design conversion process.

2.2 Primitive Converter

The purpose of primitive conversion is to convert the primitives in the design data structure from host-specific primitives, such as the Mentor Graphics QuickSim primitives, into logic chip-specific primitives which can be issued in the netlist files, compatibly with the ERCGA netlist conversion tool. Some of this conversion is simple and direct, involving only a replacement of primitive type and pin names. Other conversion is more complex. Specific references made below are to the preferred embodiment, which uses Mentor Graphics QuickSim host-specific primitives as found in the Mentor Graphics input design file, and Xilinx LCA logic-chip-specific primitives.

Figure 45A:
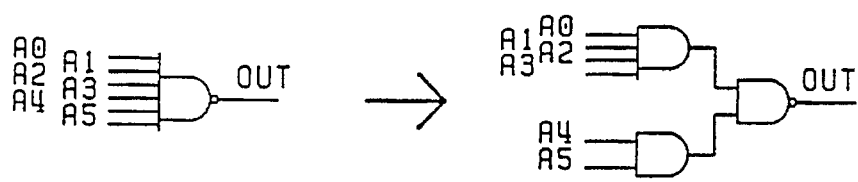
FIGS. 45a, 45b and 45c illustrate primitive conversion used in the present invention.

When a gate in the design has more inputs than is allowed in the logic chip-specific gate primitive, it is replaced by a network of gates, with equivalent functionality, each of which has an acceptable number of inputs. To do such a replacement, the primitive and pin records for the gate are removed and primitive and pin records for the new gates, and net records for the new nets inside the network, are added and linked to the pin and net records for the pins and nets which connected to the replaced gate (FIG. 45a).

When a flip-flop in the design has functions not available in the logic chip-specific flip-flop primitive, it is replaced by a network of gates with equivalent functionality. First, the network is analyzed to see whether the function is connected to a net which is not always a constant value. For example, when the host-specific primitive REG is used with both direct clear and direct set inputs connected to active nets which are not always a constant value, the primitive is replaced in the in-memory design data structure with a network of gates, similar to that used in the 7474 TTL flip-flop logic part, which will function as required. If, however, the direct set input is connected to a net which is always at a logic zero, such as the ground net, or, for example, an AND gate with one input connected to a ground net, then only the direct clear is actually required and the logic chip D flip-flop primitive is substituted instead.

An S_RAM primitive is a random-access memory, with address inputs, a bi-directional data port, a read enable and a write enable. RAM primitives are mapped into one or more Realizer design memory modules. The primitive conversion software converts the S_RAM into one or more X_RAM primitives which directly match available design memory configurations. An S_ROM (read-only memory) primitive is just like an S_RAM, except for the lack of enable inputs and the addition of a file which contains the ROM contents. It is converted into one or more X_ROM primitives which directly match design memory configurations. An X_ROM does have a read enable input, but not a write enable. The pathname for the contents file and its location with respect to the original S_ROM is stored with each X_ROM primitive. When the Realizer hardware is being configured with this design, the pathname is used by the configuration system to fetch the X_ROM contents and load them into the design memory through the host interface. S_RAMs with separate input and output data ports would be handled similarly, but are not in the Mentor Graphics QuickSim primitive set.

Pins and nets in the original design may carry initialization properties, or "inits", to specify that they are to carry some initial values, in some cases permanently. Only the permanent inits of known value (zero or one) are observed by the Realizer system, and they cause the pin or net to be connected to the appropriate "ground" (i.e. logic zero) or "vcc" (i.e. logic one) net. In the specific Mentor Graphics case:

T, X, R and Z initis are ignored:
   Only 0SF (=0=0S) or 1SF(=1=1S) are observed.
   0SF or 1SF on a net, or on any output pin on a net, makes it part of the gnd or vcc net.
   0SF or 1SF on an input pin makes that pin get disconnected and tied to the gnd or vcc net.

Figure 45B:
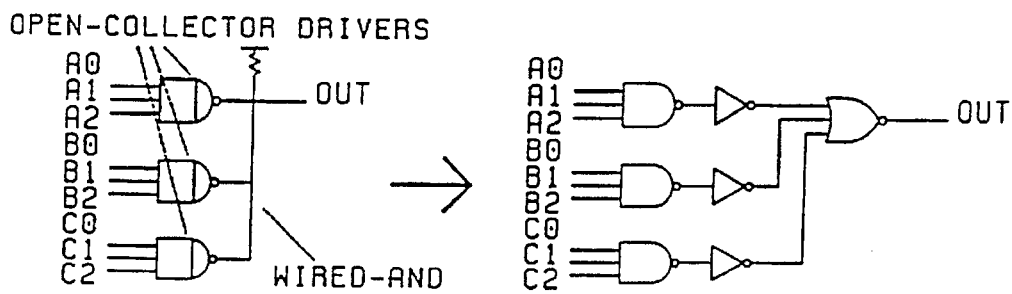
Figure 45C:
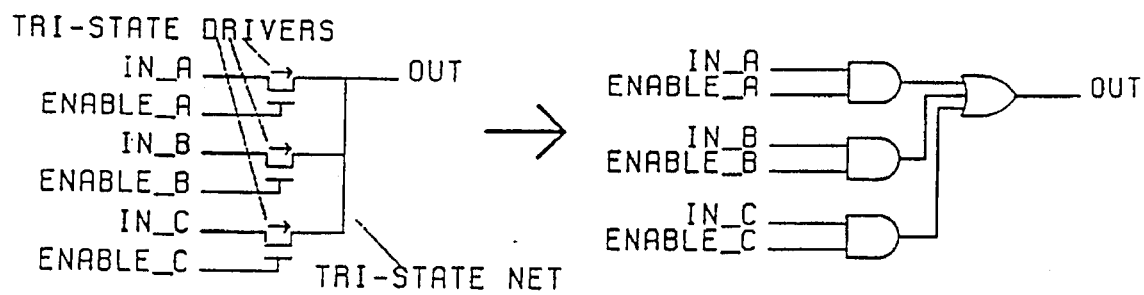

Output pins in the original design may carry different drive strengths, to signify the type of output structure to be modeled by a simulator. The Realizer system observes these strengths to some degree in primitive conversion. If an output is marked to have no drive strength when high and strong strength when low, it is identified as open-collector, and it is legal for it to be connected to other like outputs and to a resistor, as that forms what logic designers call a "wired-and" net (FIG. 45b). Likewise an output which has no drive low and is strong high is open-emitter and is used to form "wired-or" nets. Finally, an XFER primitive's output pin has no drive unless it is enabled, and may be wired with other XFER outputs and a resistor to form a "tri-state" net (FIG. 45c). All of these structures are recognized by the primitive conversion system and are converted into a sum of products logic network with equivalent functionality, as discussed in the section on tri-state nets. In the specific Mentor Graphics case:

X-state drive strength is ignored.
   One or more XFER outputs may be connected to a net, but no other outputs may be connected. An exception is that a RES (resistor) whose input pin is connected to the ground or vcc nets may also be connected. If no XFERs are enabled, the net value will be logic zero, unless a RES connected to vcc is connected, in which case it will be logic one. If more than one XFER is enabled, the result is logical OR.

OC/OE outputs (SZ/ZS) may only drive nets also driven with like drivers. OC nets go high when undriven, OE nets go low, regardless of whether a RES is connected. Primitives with RZ, ZR, RS, SR, or ZZ output drive are eliminated, without error.

The following output network conditions cause fatal errors: more than one strong, strong & resistor, more than one resistor, XFER & strong, XFER & SZ, XFER & ZS, SZ or ZS with no resistor, SZ or ZS with strong, SZ & ZS.

The specific procedures followed to convert primitives in the preferred embodiment with a Mentor Graphics host and Xilinx LCAs are as follows (subroutine name follows each header):

1) Initial conversion of host-specific primitives into LCA primitives (convert_s_to_x). Host-specific primitives are from the Mentor Graphics QuickSim set specified above, and are named with a 'S_' prefix. LCA-specific primitives are from the Xilinx .xnf specification, and are named with a 'X_' prefix.

For each primitive:
 If S_INV replace with X_INV, replace pin names.
 If S_BUF replace with X_BUF, replace pin names.
 If S_RES replace with X_BUF, RR drive, replace pin names.
 If S_DEL merge the in & out nets withgether.
 If S_AND, S_NAND, S_OR, S_NOR, S_XOR, X_XNOR, replace with X_AND, X_NAND, X_OR, X_NOR, X_XOR, X_XNOR, replace pin names.
 (If >25 pins, error.)
 If S_REG replace with X_DFF, replace pin names.
 If S_LATCH replace with X_DLAT, replace pin names.
 If S_XFER leave it for later.
 If S_NULL delete it.
 If S_RAM or S_ROM, leave it for later.
Next primitive.

2) Processing of "initis" (get_inits). Two nets in the in-memory design data structure are special: "gnd" (i.e. logic zero) and "vcc" (i.e. logic one).

For each net:
 If net's init property is 0SF,
  If gnd net has not yet been found, this is it, next net.
  else merge this net with gnd net, next net.
 If net's init property is 1SF,
  If vcc net has not yet been found, this is it, next net.
  else merge this net with vcc net, next net.
 For each output pin:
  If pin's init property is 0SF:
   If gnd net has not yet been found, this is it, next net. else merge this net with gnd net, next net.
  If pin's init property is 1SF:
   If vcc net has not yet been found, this is it, next net. else merge this net with vcc net, next net.
 Next pin.
Next net.

For each net:
 Get pin records into a list.
 For each input pin:
  If pin's init property is 0SF & this isn't gnd net, disconnect pin from net, connect it to gnd net.
  If pin's init property is 1SF & this isn't vcc net, disconnect pin from net, connect it to vcc net.
 next pin.
next net.

3) Check all output pins to remove primitives with ineffective (for Realizer system) drive strengths, and remove XFERs which are always enabled or disabled (clear_drives).

For each primitive:
 If the output pin has no drive, SS, RR, SZ or ZS, next primitive.
 If it has RZ, ZR, RS, SR, or ZZ, disconnect and eliminate it.
 If it's an S_XFER:
  If the E0 (enable) pin is constant low, delete the primitive.
  If the E0 pin is constant high, substitute a BUF.
 Next primitive.

4) Screen out illegal multi-output connections, and identify and convert wired-or, wired-and and tri-state nets and their drivers (wired_nets).

For each net:
 Get pin records into a list.
 Count up XFER output pins, input pins, and non-XFER output pins which are strong, resistive, SZ (opencoll.) or ZA (open-emitter).
 If only one output pin which has strong or no strength, next net.
 If one or more resistors are connected, make sure they all connect to either 'vcc' (pullup) or 'ground' (pulldown), and remember which.
 Error and exit if:
  >1 strong, >1 resistor,
  XFER & strong, XFER & SZ, XFER & ZS,
  SZ or ZS with no resistor, SZ or ZS with strong, SZ & ZS.
 If 1 strong and 1 resistive, delete the primitive with resistive drive.
 If >1 SZ: (open-collector wired-and)
  For each output pin:
   If resistor: make sure it's a pullup, then delete it.
   Else: disconnect pin, make pin's drive strong, create an X_INV, connect its input to the output and its output to the net.
  Next pin.
  Mark the net as a "floating-high" tri-state net so that the interconnecter will configure it with OR/NOR gates.
 If >1 ZS: (open-emitter wired-or)
  For each output pin:
   If resistor: make sure it's a pulldown, then delete it.
   Else: make pin's drive strong.
  Next pin.
  Mark the net as a "floating-low" tri-state net so that the interconnecter will configure it with OR gates.
 If >0 XFERs and either no resistor or pulldown: (tri-state "floating-low")
  For each S_XFER:
   Change S_XFER to an X_AND, with XFER E0 (or ENA) becoming AND I0, and XFER I0 becoming AND I1.
  Next S_XFER.
  Delete any resistor primitive(s).
  Mark the net as a "floating-low" tri-state net so that the interconnecter will configure it with OR gates.

If >0 XFERs and pullup: (tri-state "floating-high")
　If 1 S_XFER primitive:
　　Change S_XFER to an X_NAND, with XFER
　　E0 (or ENA) becoming NAND I0, and XFER
　　I0 becoming NAND I1, inverted.
　If >1 S_XFER primitive:
　　For each S_XFER:
　　　Change it to an X_AND, with XFER E0 (or
　　　ENA) becoming AND I0, and XFER I0
　　　becoming AND I1, inverted.
　　Next S_XFER.
　　Delete the resistor primitive(s).
　　　Mark the net as a "floating-high" tri-state net so
　　　that the interconnecter will configure it with
　　　OR/NOR gates.
Next net.
5) Replace any gates with more inputs than is allowed in the LCA-specific gate primitive, with a network of gates, with equivalent functionality, each of which has an acceptable number of inputs. (wide_gates)
　For each primitive:
　　If it's a gate & inputs >5 & (assuming XC3000 logic chips are used) and inputs <=25:
　　　Create a final output gate of the same type.
　　　Connect its output to the original output & copy properties.
　　　For each smaller input gate required:
　　　　Allocate it (use AND for AND or NAND originals, etc.)
　　　　Connect its output to a final gate input.
　　　　Connect its inputs to the real ones.
　　　Next gate.
　　　Delete the original wide gate.
　Next primitive.
6) Check for flip-flop functionality and replace as needed to match LCA restrictions. When the XC3000 family is used, flip-flops may have direct clear but not direct set, and not both. Since all S_DFFs coming in have pins for set and clear, the primitive should be replaced regardless because it will have fewer pins. Latches should be replaced with equivalent gate networks, as XC3000 does not support latches. (flops_for_3K)
　For each primitive:
　　If it's a DLAT or a DFF:
　　　Remember and disconnect each pin.
　　　Find out if SD and RD are constant low, by checking their nets to see if they are 'ground' or 'vcc', either directly or indirectly through gates.
　　If it's a DLAT:
　　　Build in a network of gates to configure the latch, including the gates for SD and/or RD only if needed.
　　　Delete the original primitive and pin records.
　　Else if it's a DFF:
　　　if SD is constant low, create an X_DFF without SD, and connect it.
　　　Else if RD is low but not SD, create an X_DFF with X_INVs on the input and output and connect it, connecting the X_DFF's RD pin to the SD net.
　　　Else build in a network of six 3-in NANDs and 2INVs which configure a DFF with set & clr like a TTL 7474.
　　　Delete the original primitive.
　Next primitive.
7) Convert S_RAMs and S_ROMs into X_RAMs and X_ROMs.

For each primitive:
　If it's an S_RAM or S_ROM:
　　Determine its height (number of words) by counting address pins (height=2 to the power of pincount), and its width, equal to the number of data pins.
　　For each available design memory configuration:
　　　Divide the S_RAM/ROM height by the design memory height to get the number rows of modules required.
　　　Divide the S_RAM/ROM width by the design memory width to get the number of columns of modules required.
　　　The total number of modules required for this configuration is rows times columns.
　　Next configuration.
　　Choose the configuration which has the fewest modules required.
　　If more than row of modules is required, create primitives and nets for a decoder, with an output for each row of modules, and with inputs connected to the high-order address nets.
　　For each row:
　　　(X_RAM only) Create an AND gate for row write enable, with two inputs: the decoder output for this row and the S_RAM write enable.
　　　Create an AND gate for row read enable, with two inputs: the decoder output for this row and the S_RAM read enable.
　　Next row.
　　For each row of modules:
　　　For each column:
　　　　Create an X_RAM/ROM primitive and store its configuration.
　　　　If X_ROM, store its file name and row and column number.
　　　　Connect its read and write enable pins to the read and write (X_RAM only) enable pins for this row (or the S_RAM enable(s) if only one row).
　　　　Connect its address pins to the lower-order address nets.
　　　　Connect its data pins to the set of data pins corresponding to this column.
　　　Next column.
　　Next row.
　　Delete the original S_RAM/ROM primitive.
Next primitive.

2.3 Partitioner

The Realizer hardware is composed of a hierarchy of units and sub-units: boards containing logic chips, boxes containing boards, racks containing boxes, and so forth. Each unit has its own capcity for logic and for interconnections to other units. Designs to be realized are partitioned (i.e. subdivided) into multiple clusters of primitives according to this hierarchy. There is a set of partitions for boxes, sized according to the logic and connection capacity of each box. Each of those partitions is divided into subpartitions for the boards, and so on, down to partitions small enough to be programmed into a single logic chip. The same partitioning methodology is applied at each level of the hierarchy in turn.

The goals of partitioning are:
1) To assign each primitive to a box, a board and a logic chip.
2) To keep the number of nets connecting to a partition below the interconnect ability of the unit (box, board or logic chip),
3) To keep the amount of logic used by the partition within the limits of the unit, and 4) To minimize the total number of partitions and therefore the number of units used.

2.3.1 Partitioning Methodology

The preferred partitioning methodology described here is based on the process of clustering together logic primitives that are both highly interconnected to one another and have the minimum number of "cut nets" (connections to primitives outside the cluster). Each cluster is a partition corresponding to a box, board or Lchip. The process is based on a prior partitioning methodology of Palesko and Akers (Chet A. Palesko, Lex A. Akers, "Logic Partitioning for Minimizing Gate Arrays", IEEE Trans. on CAD, No. 2, pp. 117–121, April 1983), with substantial improvements, as pointed out below.

There is a "null cluster" composed of the primitives which have not yet been assigned to a cluster, which initially contains all primitives. Each cluster is formed by first selecting a seed primitive from the null cluster, and then repetitively calculating the "advantage" of all null cluster primitives, and choosing the primitive with the highest advantage. The larger a primitive's advantage, the better suited it is to being moved into the logic cluster.

2.3.2 Advantage Function

Advantage is partly based on how the number of this cluster's cut nets would change if this primitive were moved into the cluster. The total number of cut nets of a cluster needs to be counted in order to keep below the maximal interconnectability of the unit. Each net which contains a pin of the primitive is traversed, and classified as either a "enclosed" net, "multiple cut" net or a "singleton cut" net, assuming the primitive were moved into the cluster. A cut net would be a singleton if one and only one connection were inside the cluster, and multiple if more than one connection were inside the cluster. An enclosed net is a net that would be totally contained within the cluster.

Figure 46:
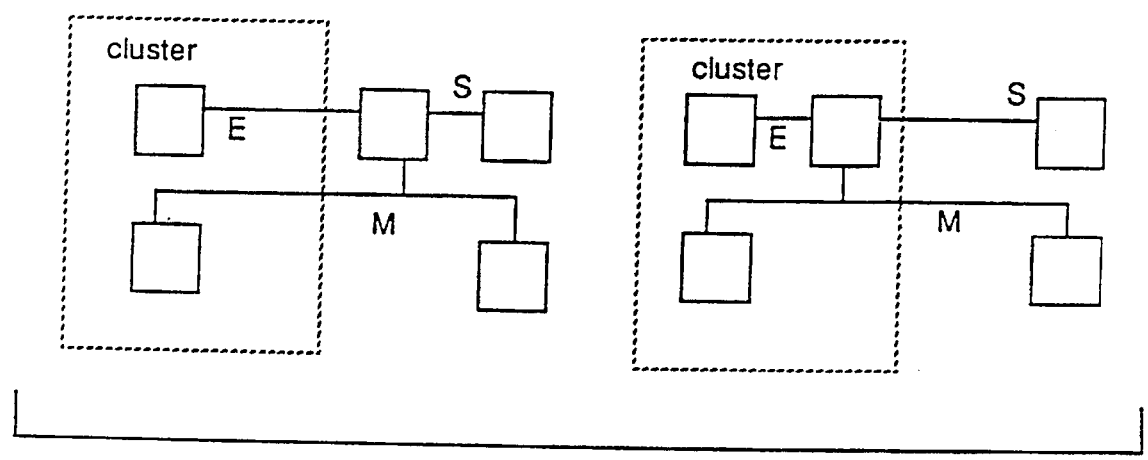
FIG. 46 illustrates moving a primitive into a cluster.

FIG. 46 shows a cluster and five primitives, connected by three nets, S, M and E, and what would happen if the shaded primitive were moved into the cluster. Net S would be a singleton, increasing the cut net count of the cluster by one. Net E would become enclosed, decreasing the cut net count by one. Net M would be a multiple-cut net, neither increasing or decreasing the cluster cut net count and would therefore not be considered. The change in cluster nets is the difference between singleton and enclosed nets:

Change in cluster cuts=singleton cut nets−enclosed nets.

The preferred advantage function quantifies each primitive to determine which would be the best choice if moved into the cluster. The best choice is the most tightly connected primitive with the largest number of pins. The function is based on the initial partitioning advantage function of Palesko and Akers:

If change in cluster cuts>0:

Advantage=primitive's number of pins/change in cluster cuts.

Else:

Advantage=(−(change in cluster cuts)*100)+100+ primitive's number of pins.

If moving this primitive into the cluster increases the number of cluster cuts, the more pins it has and the fewer cut nets it adds, the better. If it will decrease cluster cuts, then the degree of decrease is magnified by 100 and 100 is added, to insure that this advantage value will be greater than the value of any primitive which doesn't decrease cuts. The number of pins is added to break ties in cluster cut decrease, favoring the primitive with more pins.

The improvement used in the preferred methodology is to add a pin number term to the pin number/cut change ratio when there would be an increase in cluster cuts. This change enhances initial seed selection by choosing the primitive with the larger number of pins when their ratios are equal. The ratio is multiplied by ten so it prevails over the pin count alone. This is the preferred advantage function:

If change in cluster cuts>0:

Advantage=((10*primitive number of pins)/change in cluster cuts)+primitive's number of pins.

Else:

Advantage=(−(change in cluster cuts)*1000)+100+ primitive's number of pins.

2.3.3 Building Clusters

Initially all primitives are placed in a null cluster. The user may pre-place primitives into specific clusters by adding properties in the input design to indicate the Lchip, board, etc. of choice. These pre-placed primitives then serve as the seed placement for cluster formation. This permits the user to group timing sensitive or other high priority primitives and alters the partitioning results by bringing together other primitives which are tightly connected to the high priority primitives.

At the beginning of each new cluster, each unplaced primitive's advantage is calculated for the new cluster and stored in the primitive's record. If there are no pre-placements, the maximal advantage primitive (that is, the one with the highest advantage value) is chosen as the initial seed primitive for the cluster.

After each maximal advantage primitive is moved into the cluster, only those primitives with a pin on one of the same nets as the moved primitive will have their advantage recalculated. Since the other primitives were not affected by the move, their advantages for the cluster are unchanged. Then the new maximal advantage primitive is moved into the cluster, and so on, until the cluster is full.

Determining when the cluster is full depends on both logic capacity and interconnections (i.e. cluster cut nets). When a primitive is moved into the cluster, it will always increase the number of gates in the cluster. However, it will not always increase the number of cut nets; it may decrease them. It is possible for the cluster to reach a local maximum at the limit of its interconnections, and still have logic capacity for additional primitives, which may decrease the number of cut nets.

When the methodology of Palesko and Akers reaches the interconnection limit, it allows primitives with less than maximal advantage to be moved in if they don't exceed the logic capacity or interconnection limits, but it does not allow primitives to be moved in beyond a local interconnect maximum. The methodology described here is improved in that it does both:

There is an array of markers, one for each possible move. Primitives are moved into the cluster one by one. After each move, the number of cluster cut nets is checked. If it is below the maximum available interconnect capability for the unit, the move is marked as capable of interconnection. When the maximum logic capacity limit is reached, if the last move was not marked as capable of interconnection, moves are backed out until the last connectable move is found. To partition a unit (rack, box or board) into sub-units (boxes, boards, or Lchips):

Move all primitives which are not pre-placed into the null cluster.

For each cluster:

Calculate and store the advantage for each null cluster primitive.

Zero move counter.

While cluster primitive count<maximum logic capacity

Increment move counter.
Move maximum advantage primitive into cluster.
Record which primitive was moved in move[move counter].
If cluster cut nets<maximum interconnect capacity,
Mark move[move counter]=OK
Else mark move[move counter]=NOT OK.
Calculate advantage of primitives on nets connected to this one.
Next iteration.
While move[move counter]=NOT OK:
Move the primitive recorded in move[move counter] out of the cluster.
Decrement move counter.
Next iteration.
Next cluster.
The partitioning process continues until all primitives are successfully placed within clusters, or until all clusters are full and the process fails.

To partition the entire design in the preferred embodiment:
Partition into boxes at rack level, one cluster for each box, using maximum logic capacity=entire box and maximum interconnect capacity=Y-Z paths per box.
For each box cluster:
Partition into boards at box level, one cluster for each board, using maximum logic capacity=entire board and maximum interconnect capacity=X-Y paths per board.
Next box cluster.
For each board cluster:
Partition into Lchips at board level, one cluster for each Lchip, using maximum logic capacity=Lchip and maximum interconnect capacity=L-X paths per Lchip.
Next board cluster.

2.3.4 Capacity Limits

Defining the maximum logic capacity limit used in this methodology depends on the characteristics of the logic chips used. When Xilinx LCAs are used for logic chips, they are based on configurable logic blocks (CLBs). Each CLB can implement many gates and flip-flops. How many depends on the gate and flip-flop functions, how many of them there are and how many pins they have, and on how they are interconnected. If the design is converted into CLB form before partitioning, then CLBs are the primitives partitioned, and the logic capacity limit is based on the number of CLBs in the LCA. If not, then gates are the primitives partitioned, and the limit is based on the number of gates which can be expected to fit into the LCA. The gates are weighted according to the degree to which they use up capacity, to improve the partitioning results.

The limits used to build each cluster need not all be the same. When there are differing logic and interconnect capacity characteristics among units, the appropriate limits are used for building the clusters for those units.

2.3.5 Realizer Partitioning

The result of the partitioning process is a three number box/board/chip location for each primitive in the design, which is stored in the primitive's record in the design data structure. This permits the tracing of each primitive of a net in the design across Lchips, boards and boxes. Net timing can be estimated by tracing a net across the system and summing the delays through the interconnect crossbar chips and the logic chips.

During the interconnection phase, the net list is ordered based on the total number of different box/board/chip primitive combinations contained within the net. Then interconnection ensues from the most to least complex net.

Finally, since the primitives of a net and the net record contain information which specifically maps the net across Lchips and crossbar chips, local schematic logic changes do not need to be repartitioned, and only the chips that contain the altered nets need to be updated. This results in the ability to incrementally change the design without the need to repartition the design.

2.4 Netlisting and Interconnection System

The object of the Realizer netlisting and interconnection conversion system is to create netlist files for each logic and crossbar chip in the Realizer system which will be used to configure the Realizer hardware according to the input design. The determination of how the partial crossbar interconnect is to be netlisted is done as an integral part of this three stage process.

Stage 1: Statements are issued to the logic chip netlist files for all logic primitives in the design data structure, primitive by primitive.
Stage 2: Statements for the summing gates for tri-state nets which are entirely contained within a single logic chip are issued, net by net.
Stage 3: The interconnections for nets which pass between more than one logic chip are netlisted. Cut net by cut net, statements for all interconnect buffers for this net in all chips, and summing gates for t his net in crossbar chips are issued. The determination of specifically how the net is to be interconnected is made as part of this process, which itself has four stages:
Stage 3a: A tree is constructed which shows how the net will pass through each crossbar and where logic chip drivers and receivers are located.
Stage 3b: Each set of crossbar chips is evaluated for its ability to interconnect the net.
Stage 3c: The best set of crossbar chips for interconnecting this net is chosen.
Stage 3d: Based on the set choice and the tree structure, the interconnect is netlisted by issuing statements for the buffers and summing gates to the logic and crossbar chip netlist files.

This section consists of discussions of the techniques used at each stage, followed by a detailed definition of the entire interconnection and netlisting procedure, and two detailed example nets.

2.4.1 Simple and Tri-State Net Interconnect Structures

Simple nets are those with only one driver. The source Lchip which contains the driver drives the signal up the hierarchy to the crossbar chip which spans all receivers. Paths for driving receivers are connected down the hierarchy to drive all receiving Lchips. FIG. 47, which will be discussed in detail below, shows the interconnect for a simple net.

A tri-state net is one driven by two or more tri-state, open-collector or open-emitter drivers. It is represented in the design data structure as a single net with two or more drivers (output pins), each of which is one of the AND gates into which the drivers were transformed during primitive conversion, and one or more receivers (input pins). "Floating low" nets, those which are zero when no drivers are enabled, are realized by AND gates driving one or more summing OR gates. "Floating high" gates have inverted data inputs on the AND gates, and the final summing gate is a NOR. The same topology and basic method applies in both cases.

Tri-state nets are implemented as a sum of products with normal unidirectional connections and one or more summing OR gates. Drivers are collected in summing OR gates as their paths converge going up the interconnect hierarchy from X to Z. The highest-level summing OR gate output is the true value of the logical net, its source, which is connected down the interconnect hierarchy to drive all receivers. Consequently some chip pairs (L-X, X-Y and/or Y-Z) will require two paths, one for the driver into the summing OR gate(s) and another for the result out to receivers. FIG. 48, which will be discussed in detail below, shows the interconnect for a tri-state net.

2.4.2 Naming

Interconnections within a logic chip are defined in the netlist file by the use of nets with unique names. These nets are not to be confused with the nets in the design data structure. Each design net will have its counterpart net in the logic chip netlist files, and the same actual net names used in the input design file are used in the netlist files. Nets which are added to the design data structure during primitive conversion are given artificially generated names.

Nets which do not appear in the design data structure are issued to logic chip and crossbar chip netlist files to specify the interconnect. The nets between the logic or crossbar chip's I/O buffer and the I/O pins, the nets between the AND gates and the summing gate(s) of a tri-state sum of products, and the nets passing up and down the interconnect when crossbar summing is used, all are related to a single net in the design, but are distinct nets in the netlist files. Variations of the actual net name are used when issuing the interconnect primitives to the netlist files so as to provide distinct net names for each of these interconnect functions.

This chart lists all usages of each name variation. Names with only one use per level of chip are for the nets between an I/O buffer and its pin. They are numbered according to the chip at the other end of the connection to provide uniqueness. Names with more than one use per level of chip define crossbar chip internal connections. This is only one example of many such possible naming systems. The letter 'N' is used in place of the actual net name in the chart. For example, if the net being interconnected were named 'ENABLE', the net between the Input Buffer input receiving from logic chip 6 and its I/O pin would be named 'ENABLE_D_6'.

Input pins are connected to their true net names when the source for the net is in the same logic chip, which is always true for enclosed nets (nets which are not cut), and is true on the drive Lchip of cut nets. If this Lchip is not the source, input pins are connected to their parent receiver input buffers. Output pins are connected to their true net names, except when they will be connecting to a summing gate on the logic chip, in which case unique net name variations are used.

2.4.4 Stage 2: Netlisting the Logic Chip Summing Gates

Statements for the summing gates for tri-state nets which are entirely contained within a single logic chip are issued, net by net. The inputs are connected using the net name variants mentioned above, and the output drives the true net name. The appropriate output sense (OR or NOR) is used according to whether the net is "floating high" or not.

2.4.5 Stage 3: Determining and Netlisting Cut Net Interconnections

The interconnections for nets which pass between more than one logic chip (cut nets) are netlisted. Cut nets are processed one at a time, going through stages 3a, 3b and 3c for each.

2.4.5.1 Stage 3a: Building the Interconnect Tree

A temporary tree data structure is built to guide the interconnection process. It represents the structure of the net, by showing the Lchips which have primitives on this net, the X, Y and Zchips which will implement their interconnect, and the interconnect requirements of each.

Each node at each level of the tree corresponds to a logic or crossbar chip in the system, has branches to the child nodes beneath it, and stores data about the node and the interconnect path to its parent as follows:

| Level | Chip | Interconnect Path |
|---|---|---|
| Root: | Zchip | none |
| First-level: | Ychip | Y–Z path |
| Second-level: | Xchip | X–Y path |
| Third-level: | Lchip | L–X path |

Each Lchip involved in the net is represented by only one node in the tree no matter how many primitives on the net it has.

| | | |
|---|---|---|
| 'N': | Lchip: | True net value when this Lchip is the net's source. Tri-state driver when there's only one on this Lchip. |
| | X, Y, Z chips; | Input Buffer output pin from child when there's one child driver. Output Buffer input pin to child, when this chip is net's source. |
| | All chips: | Output Buffer input pin to parent. Summing gate output. |
| 'N_R': | Lchip: | True net value when this net's source is elsewhere. |
| | X, Y, Z chips: | Output Buffer input pin to child, when this chip is not the net's source. |
| | All chips: | Input Buffer output pin from parent. |
| 'N_R_c': | X, Y, Z chips: | Output Buffer output pin to child, where 'c' is the chip number of the child. |
| 'N_P': | All chips: | Input Buffer input pin from parent. |
| 'N_D': | All chips: | Output Buffer output pin to parent. |
| 'N_D_c': | X, Y, Z chips: | Input Buffer input pin from child. |
| 'N_OR_i' | Lchip: | Tri-state driver when there's more than 1 on this Lchip, where 'i' distinguishes among many such drivers. |
| | X, Y, Z chips: | Input Buffer output pin from child when there's more than one child driver. |
| | All chips: | Summing gate input. |

2.4.3 Stage 1: Netlisting the Logic Primitives

Statements are issued to the logic chip netlist files for all logic primitives in the design data structure, primitive by primitive. Naming of nets which connect to primitive pins is done so as to match up with the naming used for interconnect buffers in stage 3d, below.

Each node has the following entries:

Chip number: Which Lchip on the board, which board in the box, or which box in the rack. Initially NULL.

D and R counts: Number of drivers (D) and receivers (R) needed for this node's path. Initially zero.

D and R path: Which path number (out of the several available for each L-X, X-Y or Y-Z path) is used for the driver going up the tree from this node and the receiver coming down. Initially NULL.

Top sum: Marked true if this node has the summing gate which contains all drivers beneath it. This is used to control the last gate in a multi-gate sum of products, so that the "floating-high" case gets its output inversion. Initially false.

If a net does not span multiple boxes, the root node will have a null entry and only one first-level node. If it does not span multiple boards, that first-level node will have a null entry and only one second-level node. If it does not span multiple Lchips, it does not need interconnection and will not have a tree.

The tree is built up by scanning the net in the design data structure, according to the locations of the primitives assigned by the partitioner. If a net does not span more than one box or board, then the nodes for unneeded crossbar levels are marked null. Then the number of driving outputs and receiving inputs on each Lchip is counted and stored in the Lchip nodes, to identify the Lchips' interconnect needs. The number of Lchips that have drivers and the number that have receivers is counted up for each Xchip node, to identify what interconnect must be provided by each Xchip. Likewise driving and receiving Xchips are counted for each Ychip, and Ychips for the Zchip.

Finally, the tree is analyzed to determine the point from which the true value of the net, its source, is driven out to receivers. For simple nets, the source is in one of the Lchips. It can be a crossbar chip for a tri-state net, since crossbar summing is used. Normally, if a crossbar chip has receivers among its child chips, it is netlisted to pass the true value down from its higher-level parent chip. However, if a chip or the chip below it in the hierarchy has the source, then it receives the true value from itself or from below. To make this so, the crossbar nodes are scanned, and if a node or its descendant is the source, its receiver count is set to zero.

2.4.5.2 Stage 3b: Determining Each Set's Ability to Interconnect

Since each Zchip connects to the same Ychip(s) in each box, and each Ychip connects to the same Xchip(s) on each board, the interconnected X, Y and Z chips form a set. In the preferred embodiment of the Realizer system, there are 64 sets, each composed of 1Zchip, the 8 Y chips, one in each box, which have Y-Z paths with the Zchip, and 64 Xchips, one on each board, which have X-Y paths with each Y chip. Each pair of sets has the same Xchips in this case, but that is acceptable because only one set will be chosen to interconnect the net.

Each pair of interconnected chips, such as an Lchip and an Xchip, is connected by a group of wires, called paths. The paths in each crossbar are listed in a path table. The L-X path table has an element for every path in every L-X crossbar in the entire system. For each board in each box, there is an L-X crossbar, and for each crossbar there are a set of paths for each Lchip and Xchip. Thus the L-X path table has five dimensions: LX[boxes][boards][Lchips][Xchips][paths]. Likewise, there is an X-Y path table: XY[boxes][boards][Ychips][paths], and a Y-Z path table: YZ[boxes][Zchips][paths]. Each element in the table is marked "free" or "used" by the interconnection procedure. A table element is used if its path has been used by the I/O pin of an input or output buffer which has been issued to a netlist file.

Each set's ability to interconnect the net is determined by collecting its free path counts for each path to be interconnected. First, the Y-Z paths between Ychips in boxes and the Zchips, are considered. For each box in the net, the number of free paths in the Y-Z path table for the Zchip and this box's Ychip in this set is counted and recorded. Second, X-Y paths between Xchips on boards and Ychips in boxes: For each board in the net, the number of free paths in the X-Y path table for this box's Ychip and this board's Xchip in this set is counted and recorded. Third, L-X paths between Lchips and Xchips on boards: For each logic chip in the net, the number of free paths in the L-X path table for this Lchip and this board's Xchip in this set is counted and recorded. At any point, if there are not enough free paths to complete the interconnect, this set is marked as a failure and the process proceeds with the next set.

The result is a collection of path counts for each path in the interconnect, for each set of crossbar chips which can successfully accomplish the interconnect.

2.4.5.3 Stage 3c: Choosing the Set

Since many sets may be able to interconnect the net, one is chosen so as to maintain a balance of paths used. This insures that the full capability of the interconnect is exploited.

A simple set-choosing technique would be to choose the set with the greatest total of all path counts. However, this ignores local conditions. It is better to choose the set with the greatest minimum path count among the path counts at all levels. For example, supposed two sets with these path counts:

| Path:  | YZ | YZ | XY | XY | LX | LX | LX |
|--------|----|----|----|----|----|----|----|
| Set A: | 4  | 4  | 4  | 3  | 1  | 3  | 4  |
| Set B: | 3  | 3  | 3  | 3  | 3  | 3  | 3  |

Set A has the greatest total (23 vs. 21), but choosing it would mean taking the last available L-X path from one Lchip-Xchip pair. Set B has the greatest minimum (3 vs. 1), and would not close off any Lchip-Xchip pair. In case of ties, eliminate one minimum from each set from consideration and choose the set with the greatest remaining minimum, and so on, until one set is chosen. If all sets really are the same (as will be the case for the first net), just pick one. This is the method used.

A special consideration applies when a set for a tri-state net is being considered. Since some pairs of chips must have two paths used for the same net, one for an input going up the hierarchy to the summing gate, and the other bringing the true value back down, the set chosen must have at least two free paths for those cases. Such a case is detected when the path's tree node (i.e. Xchip node for L-X path, etc.) has non-zero D and R counts and a non-NULL parent.

2.4.5.4 Stage 3d: Netlisting the Interconnect

Given the set choice and the tree structure, the interconnect is netlisted by issuing statements for the buffers and summing gates to the logic and crossbar chip netlist files. This is done level by level, logic chips first, then X, Y and Zchips. Each chip's interconnections and directions are determined by using the data in the tree. Each connection is netlisted by issuing statements for the connection's buffers and nets to a netlist file.

The chip's connections to child chips (if present) are netlisted first. Each child chip is considered in turn. If the tree shows it is driving this chip, an input buffer is netlisted, using the pin number which connects to the child chip's driver. If this chip has more than one driver, distinct net names are used for each one so they can be collected by the summing gate netlisted later. If the tree shows the child is receiving this chip, an output buffer is netlisted, using the pin number which connects to the child chip's receiver. If this chip is itself a receiver from its parent, a different net name is used, so that it connects to the parent receiver.

If this chip has more than one driver among its children, the summing gate is netlisted, connecting to the driver nets defined above. Finally the connections to the parent chip (if present) are netlisted. If this chip or any descendant has a driver, an interconnect path for the driver is taken from the path table entry for this pair of chips and the set that was chosen, and an output buffer is netlisted to drive the parent via the path just taken. If this chip is a receiver from the parent, a path is taken from the path table and an input buffer is netlisted using that path.

2.4.6 Detailed Definition of the Interconnection and Netlisting Procedure

First some general definitions:
There are four classes of nets:

Simple enclosed: Net has one driver, all primitives are in the same Lchip.

Simple cut: Net has one driver, primitives are in multiple Lchips.

Tri-state enclosed: Net has >1 driver, all primitives are in the same Lchip.

Tri-state cut: Net has >1 driver, primitives are in multiple Lchips.

A net's 'source' is the chip that drives its actual logical value:

For simple nets, that's the Lchip that has the driver.

For tri-state nets, that's the chip that has the top-most summing gate.

To determine it:

Scan the net to see where the output pins are located.

If they are all on the same Lchip, that's the source.

Else, if they are all on the same board, it's the Xchip on that board.

Else, if they are all in the same box, it's the Ychip in that box.

Else, it's the Zchip.

An output pin's index number is which output pin it is on its net's circular list of pins, starting from the pin pointed to by the net record, and counting by ones from zero.

Stage 1: Issue all primitives in the design data structure:
For each Lchip in the design data structure:
Open this Lchip's netlist file, if it isn't already open.
For each primitive on this Lchip:
Issue the primitive header statement to the file.
For each pin on this primitive:
Get the name of the connected net (using the net's object i.d. to get it from the input design file), and call that 'N'.
If input pin:
If this Lchip has the net's source, issue statement for input pin connected to net 'N'.
Else issue input pin statement on net 'N_R'.
Else (output pin):
Get this output pin's index number, call that 'p'.
If simple net, issue pin on net 'N'.
If tri-state enclosed net, issue pin on net 'N_OR_p'.
If tri-state cut net:
If this is the only output on this net on this Lchip, issue pin on net 'N'.
Else issue pin on net 'N_OR_p'.
Next pin.
Next primitive.
Next Lchip.

Stage 2: Issue all enclosed net summing gates:
For each tri-state enclosed net:
Get the name of this net, call that 'N'.
Open this Lchip's netlist file, if it isn't already open.
Count how many outputs are on the net, call that 'i'.
Issue statements for an 'i'-input gate:
NOR if this net is 'floating-high', else OR, with inputs connected to nets 'N_OR_j', (for all j from 0 thru i–1),
and output connected to 'N'.
Next net.

Stage 3: Issue the buffers which interconnect cut nets, and issue all cut net summing gates:
Mark all elements of all interconnect path tables "free."
For each cut net (simple or tri-state), choosing cut nets in order of hierarchy, multi-box nets first, etc., and within that order, largest first:
Stage 3A: Build the tree:
For each primitive on the net:
If there is not a tree node for this primitive's box, add one.
If there is not a tree node for this primitive's board in this box, add one.
If there is not a tree node for this primitive's Lchip on this board in this box, add one.
If this primitive's net connection is an output pin (i.e. driving), increment the D count on this Lchip's node.
Else, if this Lchip is not the source for this net, increment the R count on this Lchip's node.
Next primitive.
Once all primitives on this net are represented in the tree, if there is only one Xchip node, mark the Ychip node NULL. (I.e. the net stays on board.)
If there's only one Ychip node, mark the Zchip node NULL. (Net stays in box.)
For each non-NULL crossbar level, first Xchip, then Ychip, then Zchip:
For each node at this level:
D=the number of child nodes which have non-zero D counts.
R=the number of child nodes which have non-zero R counts.
If this node or a descendant is this net's source, set this node's R=0.
If this node is the source and the net is tri-state, set its 'top sum' flag true.
Next node.
Next level.
Stage 3B: Determine each set's ability to interconnect:
For each set, determine its ability to interconnect by collecting path counts for each path to be interconnected:
Allocate storage for path counts for this set:
Y-Z path counts: one for each box,
X-Y path counts: one for each board,
L-X path counts: one for each Lchip.
If there is only one box in this net (Z-level interconnect not needed):
Leave a null (not zero) Y-Z path count for this box.
Else:
For each box:
Count the number of free paths in the path array YZ[this box][this set][paths].
If this box's tree node has a non-NULL parent, and D>0, and R>0:

This box's path is "double": it has both a driver
and a receiver.
If there are <2 free paths, this set can't connect
this net.
Else, if there are no paths, this set can't connect this net.
If this set can't connect, mark it unusable and proceed
with next set.
Else, save the total as the Y-Z path count for this box.
If there is only one board in this net (Y-Z interconnect not
needed):
Leave a null (not zero) X-Y path count for this board.
Else:
For each board:
Count the number of free paths in the path array
XY[this box][this board][this set][paths].
If this path is a "double" and there are <2 paths, or
if there are no paths, this set cannot connect this
net:
Mark this set unusable and proceed with the next
set.
Else, save the total as the X-Y path count for this
board.
For each Lchip:
Count the number of free paths in the path array
LX[this box][this board][this Lchip][this set]
[paths].
If this path is a "double" and there are <2 paths,
or if there are no paths, this set cannot connect
this net:
Mark this set unusable and proceed with the next
set.
Else, save the total as the L-X path count for this
Lchip.
Next board in this box.
Next box.
Next set.
Stage 3C: Choose the set:
For each set which can connect the net:
Find the minimum path count among all path counts for
this set.
Next set.
Find the greatest of all those minimum path counts.
Eliminate from consideration all sets with path counts less
than the greatest minimum.
If there are no sets left, then this net cannot be interconnected.
If there is one set left, then that set has been chosen for this
net.
If there is more than one set left,
Find the next greatest minimum among all minimum path
counts.
Eliminate from consideration all sets with path counts less
than that.
Repeat this until either one set is left or all remaining sets
have the same path counts.
Choose any one of the remaining sets for this net.
Free the storage for all the path counts for all the sets.
Stage 3D: Netlist the interconnect:
Definitions of procedures used below:
To get and reserve a driver (or receiver) path:
1) Choose a path from a free element in the path table for
this level, this node's chip number, and the parent
node's chip number.
2) Mark the path's table element used.
3) Store which path was used as path number in the driver
(or receiver) path number entry for this node.

To derive an I/O pin number:
1) Determine the identities of this node's and the child
node's chips (or parent's node's chips, as the case may
be) from the two nodes' chip numbers and the set
number. This identifies the specific path involved (such
as L4-X5, or Board3-Y7).
2) Recall that the path number designates one path of the
several that connect a pair of chips. Given the chip, the
path, and the path number, read the pin number which
connects to this path out of the lookup table which
holds I/O pin number information.
To issue a buffer (input or output) using a path:
1) Get the path number from this node, or, if a child's path
is specified, get it from the child's node. Get the driver
or receiver path number as directed.
2) Derive this buffer's I/O pin number, using the path
number.
3) Issue primitive statements to the netlist file for this
node's chip, according to whether it is an input or
output buffer, using input and output net names as
directed, and using the drived pin number for its I/O
pin.
Procedure to netlist the interconnect:
Get the name of this net, call that 'N'.
For each non-NULL level, first Lchip, then Xchip, Ychip,
and Zchip:
For each node at this level across the entire tree:
Open the netlist file for this node's chip if it isn't
already.
If level is X, Y or Z: For each child node below this
node:
Set a counter, 'i', to zero.
If the child's D>0: (Child is Driver)
If this node's D=1:
Issue an Input Buffer, from 'N_D_c' to 'N',
(where 'c' is the child node's number) using
the child's driver path.
Else, this node's D>1:
Issue an Input Buffer from 'N_D_c' to
'N_OR_i', using the child's driver path, and
increment 'i'.
If the child's R>0: (Child is Receiver)
If this node's D>0 and this node's R=0:
Issue an Output Buffer from 'N' to 'N_R_c',
using the child's receiver path.
Else:
Issue an Output Buffer from 'N_R' to 'N_R_c',
using the child's receiver path.
Next child node.
If this node's D>1: (node has Summing Gate)
Issue an 'i'-input gate:
NOR if this net is 'floating-high' and this node's
'top sum' flag is true, else OR,
with inputs connected to 'N_OR_i', (for all j
from 0 thru i–1),
and output connected to 'N'.
If this node's D>0, & has a non-NULL parent: (Node
is Driver)
Get and reserve a driver path.
Issue an Output Buffer from 'N' to 'N_D', using the
driver path.
If this node's R>0: (Node is Receiver)
Get and reserve a receiver path.
Issue an Input Buffer from 'N_P' to 'N_R', using
the receiver path.
Next node at this level.

Next level.
Next cut net.
Close all open netlist files.

2.4.7 Two Example Nets

FIG. 47a shows the original input design for a simple net, named 'BX', with one driver and three receivers, spanning two logic chips on one board and one logic chip on another board in the same box.

The interconnect tree built by stage 3a for this net is shown in FIG. 47b. Note how there is a node for each logic chip, each board, and one for the box. The logic chip nodes correspond to specific logic chips. The board nodes correspond to Xchips, one on each board, and the box node corresponds to a Ychip. A Zchip is not needed for this net. Exactly which X and Ychips are used depends on which set is chosen, and is not shown in the tree. The D and R values are shown with each node. Note how L0 has D=0, even though it has a receiver, since it is the source node for this net and does not need to receive the value from above, as the others do. The node for board 2 shows that its R count was initially one, counting L4's receiver, but was set to zero because the source is a descendant. Likewise for the box node.

The actual gates and buffers issued to the netlist files for each logic and crossbar chip, and how they interconnect, is shown in FIG. 47c. 'IBUF' and 'OBUF' signify input and output buffers. The net names issued are shown with their nets. Observe how the structure of the actual interconnect reflects the structure of the tree and the D and R counts in each node.

Figure 48A:
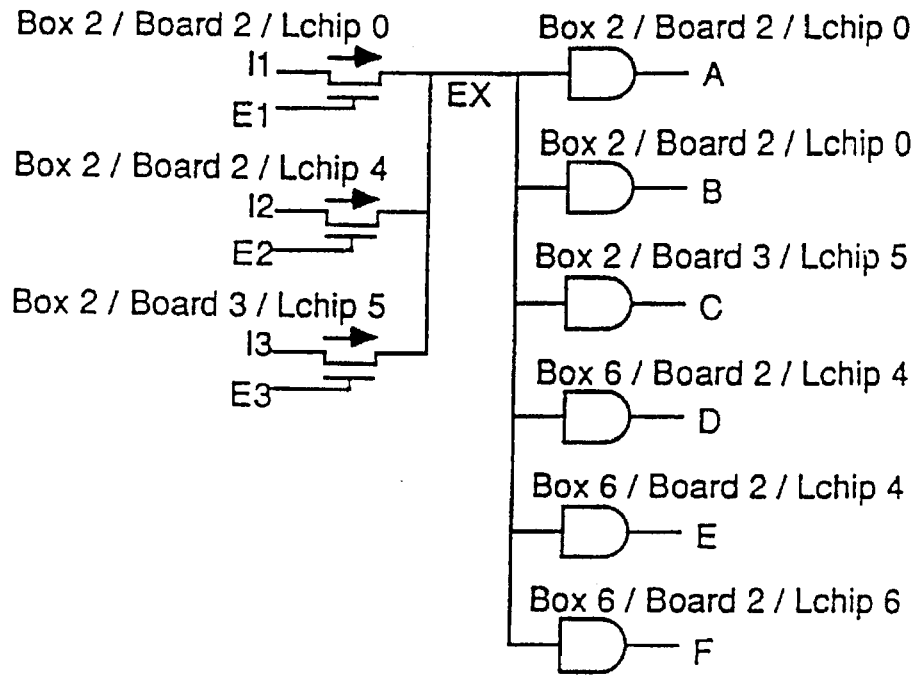
FIGS. 48a, 48b and 48c illustrate tri-state net interconnection.

FIG. 48a shows the original input design for a tri-state net, named 'EX', with three tri-state drivers spanning two logic chips on one board and one logic chip on another board in the same box, and six receivers, spanning four Lchips on three boards in two boxes.

Figure 48B:
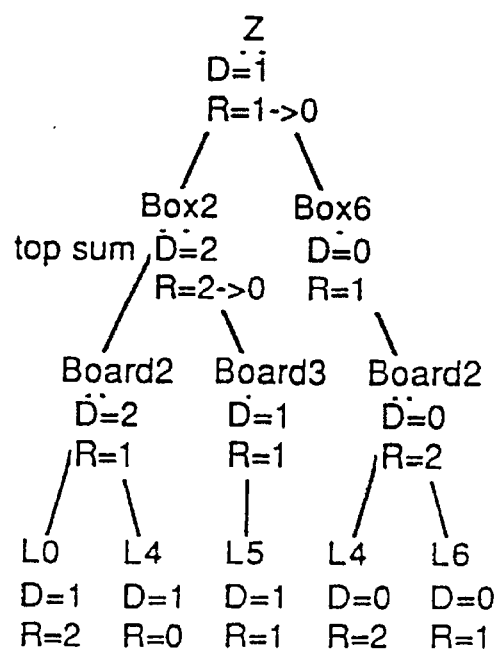

The interconnect tree built by stage 3a for this net is shown in FIG. 48b. Since this net spans boxes, the Z-level crossbar is used. Note how board 2's node has D=2, as it has two of the tri-state drivers, so that Xchip will have a summing gate, collecting terms from the Lchips on board 2. Likewise box 2's node, which is the source of the net, and is marked "top sum." Its Ychip will have the top-most summing gate, collecting terms from boards 2 and 3. It, and its Z parent node, have the source, so their R counts were zeroed.

Figure 48C:
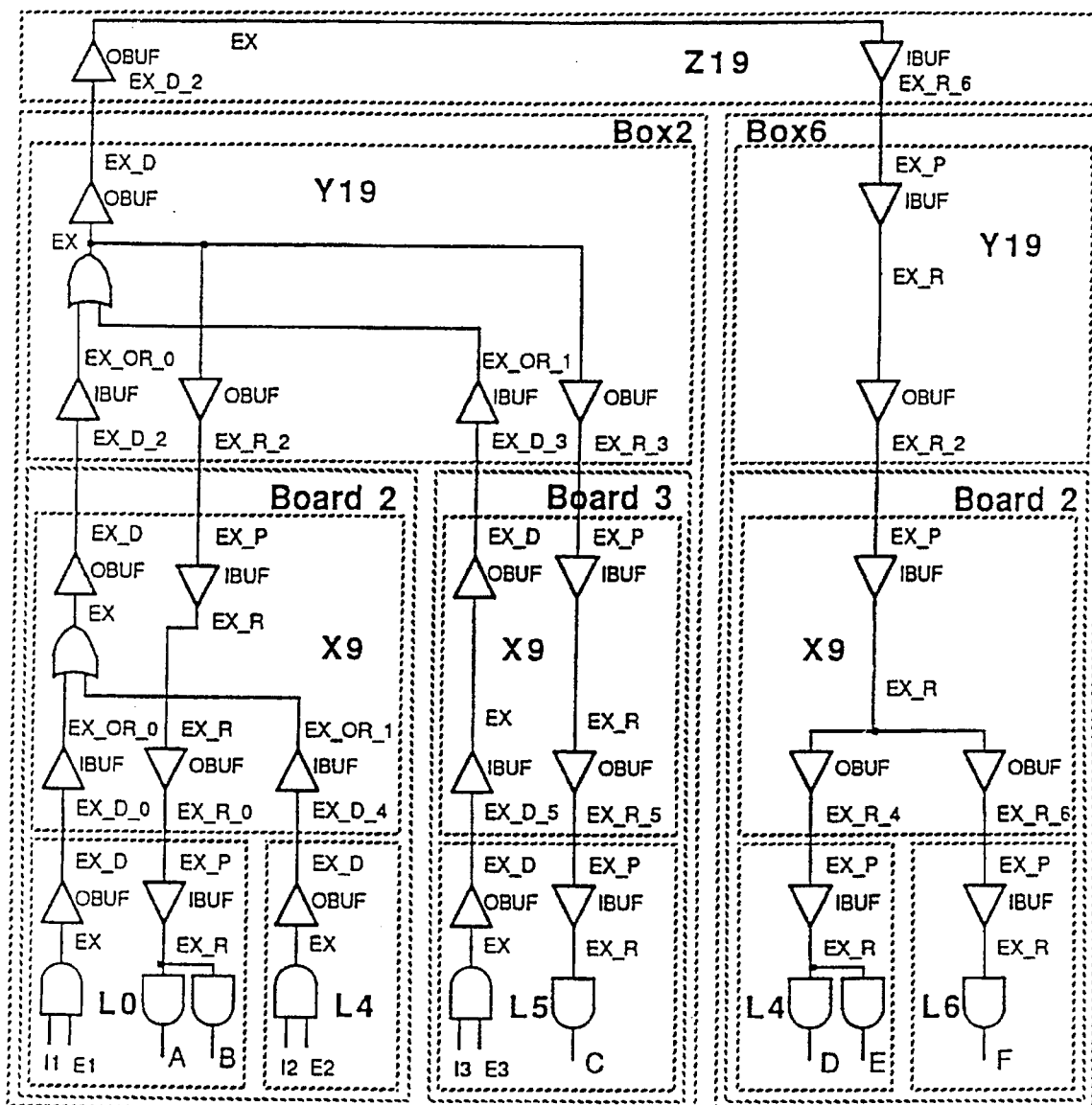

The actual gates and buffers issued to the netlist files for each logic and crossbar chip, and how they interconnect, is shown in FIG. 48c. Note how the tri-state drivers were each converted into AND gates by the design conversion. Those outputs are collected by summing gates at the X and Y levels. The receiving inputs are driven from that "top sum" node, the Ychip in box 2. Receivers in box 2 are driven by paths coming back down the interconnect. Receivers in box 6 are driven via the Z-level crossbar chip.

3 Realizer System Applications

3.1 Realizer Logic Simulation System

A logic simulator is a system, implemented in hardware or software, which receives an input design, a set of stimulus to the design and a direction to simulate for a period of time, and produces a set of responses which predict those that a real implementation of the input design would produce given the same stimulus. The stimulus and responses are in the form of logic state transitions of specified design nets at specified times. An important characteristic is that the simulator user provides only the description of a design in the form of the input design file, so the design may be changed and re-simulated in a short period of time.

Current software logic simulator design practice is to use a computer software program, executing a sequential algorithm which predicts the design's operation ("An Introduction to Digital Simulation", Mentor Graphics Corp., Beaverton, Oreg., 1989). Either the event-driven or compiled code algorithms, which are well known, are used. Current hardware logic simulator design practice is to build hardware which executes the same event-driven or compiled code sequential algorithms used in software simulators. The hardware gains its performance advantage only by exploiting parallelism in the algorithm and/or directly implementing special algorithmic operations, which are not possible for a general-purpose computer executing software. Current hardware logic simulators operate by executing an sequential algorithm which predicts the input design's responses.

A new means of building a logic simulator is based on the Realizer system. The Realizer logic simulator system receives an input design, which it converts into a configuration of the Realizer hardware's logic and interconnect chips, using the Realizer design conversion system. It receives a set of stimulus to the design and a direction to simulate for a period of time, applies that stimulus to the realized design via vector memories, and collects a set of responses from the realized design via vector memories. The responses correspond to those that a real implementation of the input design would produce given the same stimulus, because an actual hardware realization of the design is observed responding to that stimulus.

This differs fundamentally from all current logic simulation systems, in that they execute a sequential algorithm which predicts the design's responses to stimulus, while the Realizer logic simulator operates an actual realization of the design to determine the design's responses to stimulus. The primary advantage is that the realized design generates responses many orders of magnitude faster than a sequential algorithm can predict responses.

Figure 49:
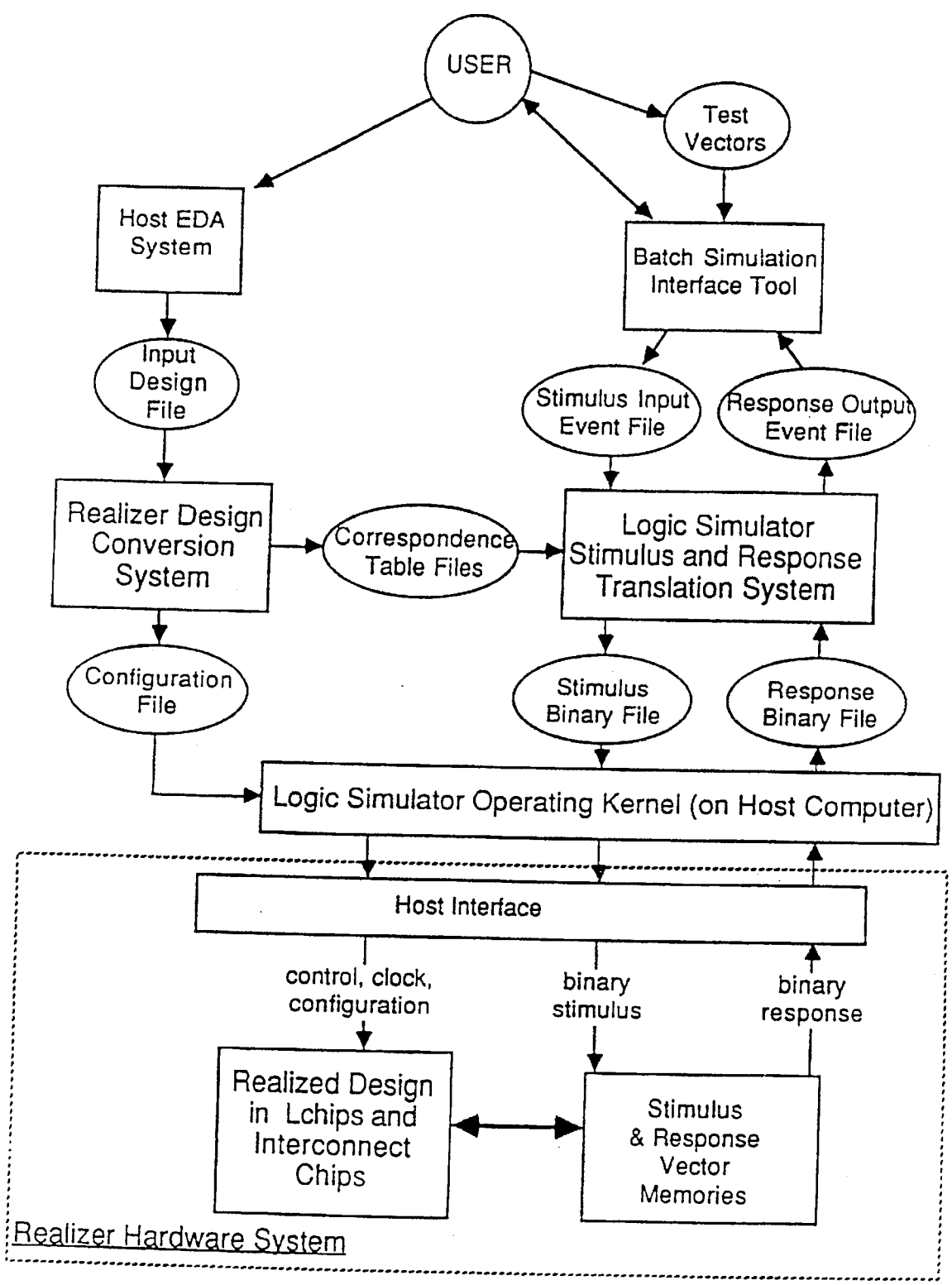
FIG. 49 is a schematic block diagram of a Realizer logic simulation system.

The Realizer logic simulation system consists of the Realizer design conversion system (described elsewhere), the logic simulator stimulus and response translation system, and the logic simulator operating kernel, along with the Realizer hardware system and host computer (FIG. 49).

3.1.1 Logic Simulator Stimulus and Response Translation System

This system converts from a user-generated stimulus event input file into a binary file containing stimulus data which can be loaded directly into vector memories, and converts responses from the file containing binary response data read out of vector memories into a user-readable response event output file. Stimulus and response events consist of a net name, a time, and a new net state value. The conversion is one between net names and vector memory bits, and between simulation 'real time' and vector memory locations. The time conversion is made by mapping each unique time with stimulus events into a vector memory location, and reporting response events at that vector memory location as having occurred at that time.

In the preferred embodiment, the stimulus input event file and response output event file are Mentor Graphics Logfiles ("QuickSim Family Reference Manual", Mentor Graphics Corp., Beaverton, Oreg., 1989), which are text files containing a series of times, net names, and new net state values. The stimulus input event file is created and the response output event file is interpreted by the batch simulation interface tool in the EDA system. In the preferred embodiment, that tool is Mentor Graphics' RSIM tool.

This description assumes all primitives are simulated with zero delay, as discussed later in this section. To convert the stimulus event input file into the stimulus binary file:

1) Read the stimulus input event file. Order the stimulus events according to increasing time, and determine how many different times have events.
2) Read the correspondence tables for each vector memory in this design that were generated by the design conversion system.
3) Each vector memory location will correspond to a time which has one or more stimulus events. If there are not enough vector memory locations for each different stimulus event time, then repeat steps 5 and 6 as many times as necessary, generating enough stimulus binary files for all such times, each file containing stimulus which will fit into memory.
4) Allocate storage for vector arrays "V0", "V1", etc., each corresponding in number of locations and net width with a vector memory used in the design to be simulated. Allocate storage for a time array "T", with the same length as a vector array. Allocate "last vector" buffers, "B0", "B1", etc., one for each vector memory and each as wide as its net width, and initialize them to zero.
5) Set a vector array index counter 'v' to zero.
   For each time which has one or more stimulus events, earliest first:
   Write the contents of each B0, B1, etc. into V0[v], V1[v], etc.
   For each stimulus event at this time:
      Locate the vector memory 'n' and vector memory bit position 'i' for this net, using the correspondence table entry for this event's net
      Write the new value for this event into Vn[v]bit i, & Bn bit i.
   Next event.
   Write the contents of each V0[v], V1[v] etc. into B0, B1, etc.
   Store this time in T[v].
   Increment v.
   Next time with a stimulus event.
6) Write the vector assays V0, V1, etc., the time array T, and the cycle count 'v' into the stimulus binary file.

To convert the response binary file into the response event output file:
1) Read the vector arrays V0, V1, etc., the time array T, and the cycle count 'v' from the response binary file. Each vector memory location will correspond to a time which has one or more stimulus events. If there were not enough vector memory locations for each different stimulus event time, then repeat steps 1–4 as many times as necessary, reading all the response binary files into these arrays.
2) Read the correspondence tables for each vector memory in this design that were generated by the design conversion system.
3) Allocate "last vector" buffers, "B0", "B1", etc., one for each vector memory and each as wide as its net width, to zero.
4) Set vector array index counter 'v' to zero.
   For each location in the vector arrays:
   Compare the V0[v] with B0, V1[v] with B1, etc.
   For each difference between a bit in Vc[v] and Bn:
      Locate the name of the net corresponding to this bit's vector memory and vector memory bit position, using the correspondence table for this memory.
      Write a new response event into the output file, using the net name, new bit value, and time T[v].
   Next event.
   Write the contents of each V0[v], V1[v], etc., into B0, B1, etc.
   Increment v.
   Next location.

3.1.2 Logic Simulator Operating Kernel

The operating kernel configures the Realizer system for the design to be simulated, applies the stimulus, and collects the response. It executes on the host computer. It configures logic and interconnect chips, reads and writes vector and design memories and controls clock generators and reset generators via the host interface, as described in those sections.

To operate the simulation:
1) Read the design's configuration file and use it to configure all Realizer logic and interconnect chips, as described in the configuration section. Read initial design memory data from files and write it into design memories.
2) Read the stimulus binary file. Store the vector array contents in the corresponding vector memories, via the host interface. Read the time array "T" and cycle count 'v'.
3) Clear all vector memory counters in the vector memory modules. Cycle the design reset generator to initialize the realized design.
4) Enable the ECLK net's clock generator for 'v' cycles. This causes the vector memories to issue their stimulus data, operating the realized design according to that stimulus, and causes the vector memories to collect response data, as described in the stimulus/response section.
5) Read the vector memory contents, and store them with the time array "T" and the cycle count 'v' in the response binary file.
6) If there is more than one stimulus binary file, due to insufficient vector memory capacity, repeat steps 2–5 for each file.
7) Save design memory contents in files for user examination.

3.1.3 Using the Realizer Logic Simulation System

To simulate an input design with the Realizer Logic Simulator:
1) Prepare the input design using the EDA system's design creation tool by marking nets to be stimulated and nets to collect response from with properties which will indicate vector memory connections. Prepare initial design memory data files, if needed. Prepare the stimulus event input file using the EDA system's batch simulation interface tool.
2) Convert the input design with the Realizer design conversion system, generating a configuration file and a vector memory net correspondence table file.
3) Run the stimulus and response translation system, converting the stimulus event input file into stimulus binary file(s).
4) Run the operating kernel, which conducts the simulation and generates response binary file(s).
5) Run the stimulus and response translation system, converting the response binary file(s) into the response vent output file.
6) Interpret the response vent output file using the EDA system's batch simulation interface tool.
7) Make any necessary changes in the input design, initial design memory files and/or stimulus event input file, as indicated by the simulation results, and repeat steps 2–6 as necessary.

An interactive variation of the Realizer Logic Simulation System uses stimulators for stimulus and samplers for response. Composition and operation is similar, except that an interactive simulation interface tool is used instead of the batch simulation interface tool, communicating with the stimulus and response translation system directly instead of via files, and the stimulus and response translation system communicates with the operating kernel directly instead of via files, with the interactive simulation interface tool operating concurrently. Each timestep with events is mapped into one 'sync clock' cycle of edge sensitive stimulators, instead of a vector memory location.

3.1.4 Realization of More than Two Logic States

It is practical to realize two logic states directly in a Realizer system: logic high (H), or true, and logic low (L), or false, by directly realizing each net in the input design with a single signal in the Realizer system.

It is sometimes desirable to represent more than two states of a logic signal in a logic simulation environment. For example, a third state, "unknown (X)" may be used to represent an uninitialized logic variable, or an ambiguous logic situation. A high-impedance state (Z) may be useful in realizing wire-tied buses, such as tri-state buses.

High-impedance states, can be realized directly in some embodiments of the Realizer system. For example, if a tri-state bus is called for in the design, it can be realized by a tri-state bus in the Realizer system, so long as the logic chip(s), and any interconnect required, have the ability for tri-state bus facilities to be configured into them. Alternatively, arbitrary logic states are realized by encoding one net into more than one signal as follows: The number of states are to be realized is established. The number of binary bits required to minimally encode all states uniquely is established, and called 'n'. A net in the design is realized by 'n' actual binary logic signals. For example, when 3 states, (H,L,X) are needed, two actual binary signals are used to realize a single design net in the Realizer system. This transformation is made during the primitive conversion stage, and these new binary signals are entered into the design data structure, replacing the original design net.

Figures 50A, 50B, 50C:
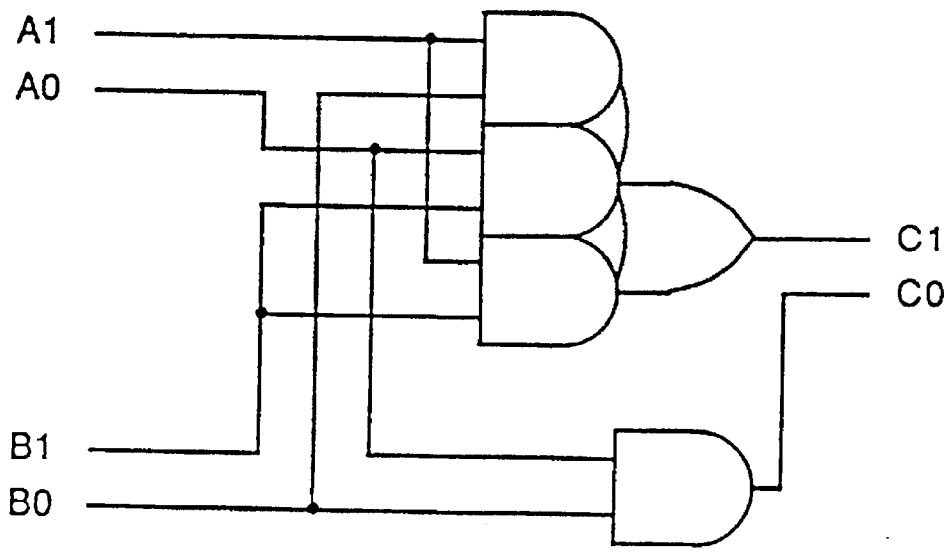
FIGS. 50a–c schematically illustrate Realizer system configuration of multi-state logic.

Further, logic primitives in the design are realized by logic networks which operates according to the multi-state logic function. For example, when 3 states (H=high, L=low, X=unknown) are used, a 2-input AND gate in the design is realized by a logic network which operate according to the 3-state AND function (FIG. 50a). The logic function operates as it would in a 3-state simulator, with the X state produced on the output when either input is X and no inputs are L (FIG. 50b). This network has two 2-bit inputs and one 2-bit output (FIG. 50c).

This multi-state realization technique can be used across the entire input design, or only in parts of the design, as called for by the design analysis requirements. Nets which are to be simulated in more that two states are marked as such in the input design file, the design reader notes this in the design data structure, and the primitive converter makes the above substitution of network for primitive and multiple nets for one. When a logic primitive has a mix of two-state and more-than-two state net connections, a logic network which operates according to the net requirements is used. Otherwise simulation operates as described above.

3.1.5 Realizer Representation of Delay

The time delay for a signal to pass through a logic element is modeled in many ways in modern logic simulators. Since the logic in the realizer's logic chips is actual hardware, its delay characteristics cannot be defined with complete accuracy, so logic delay may not be modeled directly. It is modeled by using special methods in the simulator operating program, and/or by inserting extra logic functions for modeling delay during the design conversion process. Delay can be modeled in a realized simulation as zero delay, unit delay or real delay. The choice is made by the user and is specified to the Realizer logic simulator system.

3.1.5.1 Zero Delay

Zero delay means the simulation operates without modeling real time delay, treating it as if it were zero. For example, when a stimulus event occurs at time 't' on an input which is connected directly through combinational logic only to an output, the response vent on that output will be reported as occurring at time 't'.

No extra logic functions are inserted by the design conversion system for zero delay. The simulation operates according to the methodology described in the main Realizer logic simulation system discussion above.

3.1.5.2 Delay Dependent Functionality

Figure 51A:
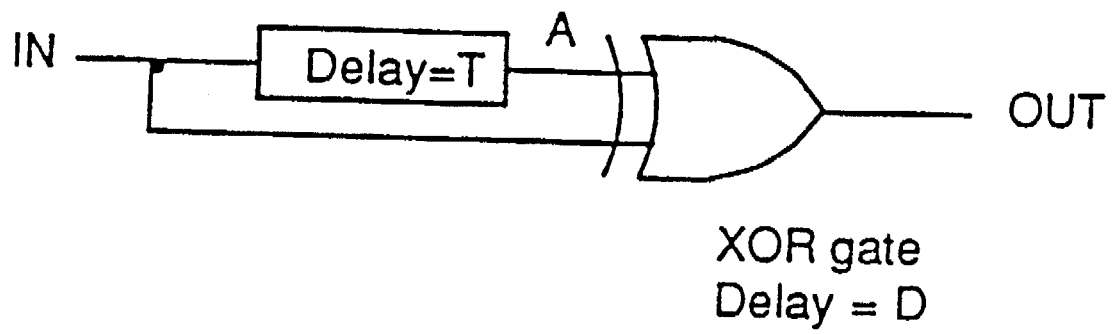
FIGS. 51a–b schematically illustrate a delay-dependent functionality example.
Figure 51B:
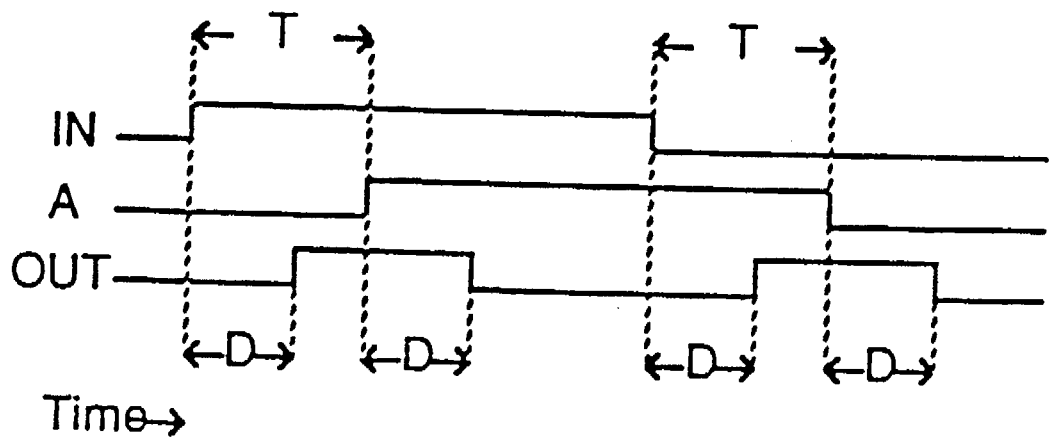

When there is any delay-dependent functionality in the design, complications arise. The zero delay timing model falls short that case. If there is closed-loop functionality, i.e. asynchronous feedback, as in cross-coupled gates, then there may be implicit storage. The functionality of the storage may depend on the relative delays. The other form of delay-dependent functionality is when delay is used in an open-loop function. An example of this is a exclusive-or gate with a delay element connected across its inputs (FIG. 51a). The exclusive-or output is high during the time required for a signal to propagate through the delay element. Any transition applied to this network will produce a pulse at the output (FIG. 51b).

Since actual Realizer logic delays are non-zero, if not directly controllable, delay-dependent functionality operates correctly in most closed-loop cases, such as cross-coupled gates, and some open-loop cases.

However, a user may require certainty that the realized design is operating as intended. Modern timing analysis tools automatically find and report instances of asynchronous feedback, and detect open-loop delay dependent behavior. The Realizer design conversion system conducts timing analysis, if requested by the user, by using a timing analysis tool. The preferred implementation uses the Mentor Graphics QuickPath timing analysis tool ("QuickPath User's Manual", Mentor Graphics Corp., Beaverton, Oreg., 1989). As the operation and capabilities of such tools are well established, they will not be described further here. The analysis operates according to the following method:

1) As part of the design conversion process, the ERCGA netlist conversion tool generates estimates of internal interconnect and logic delays, which are issued to report files.
2) After all netlists have been converted, read the data from the report files, and enter it into the design data structure, with each delay estimate associated with its primitive or net.
3) Write the design data structure out into a design file.
4) Apply the timing analysis tool to the design file. Report any possible anomalies detected by the timing analyzer to the user, who will evaluate and modify the input design file as appropriate.

3.1.5.3 Unit delay

A unit delay model is one where each logic primitive is modeled as having a delay of one unit. Such modeling is often used on designs with delay-dependent behavior, to assure correct operation. The user specifies unit delay primitives, which may be mixed with zero delay primitives, by attaching appropriate properties to the primitives in the input design file.

Figure 52A:
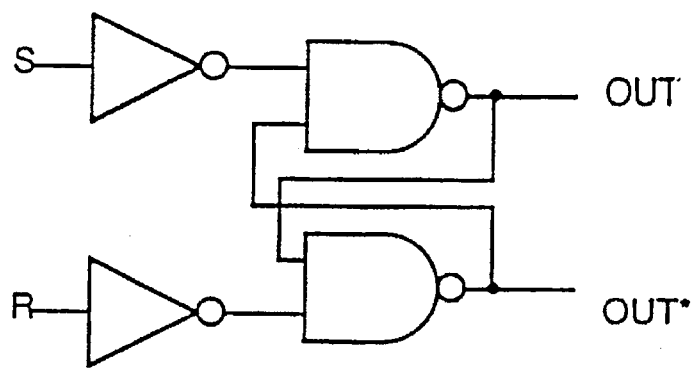
FIGS. 52a–c schemataically illustrate a unit delay configuration example.
Figure 52B:
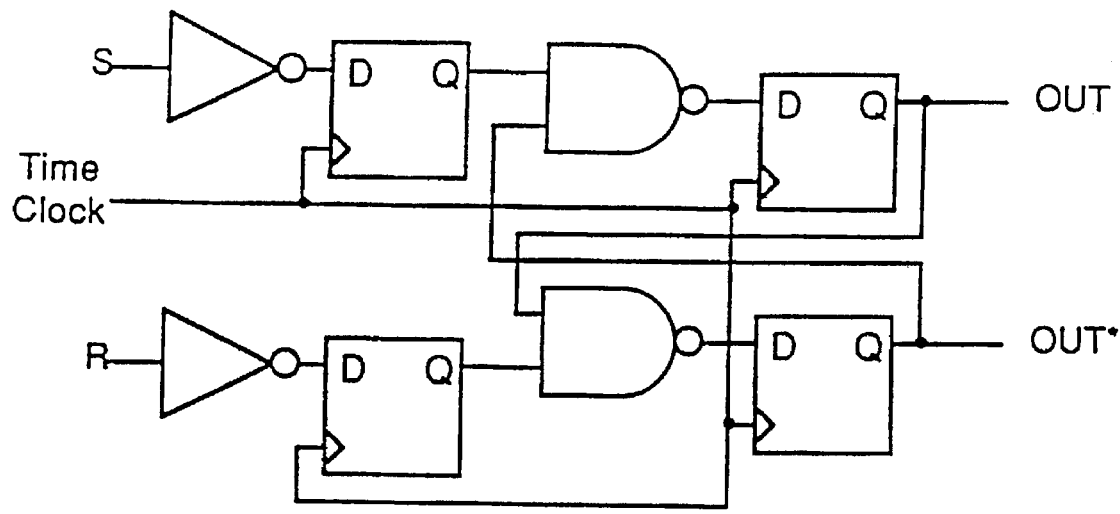
Figure 52C:
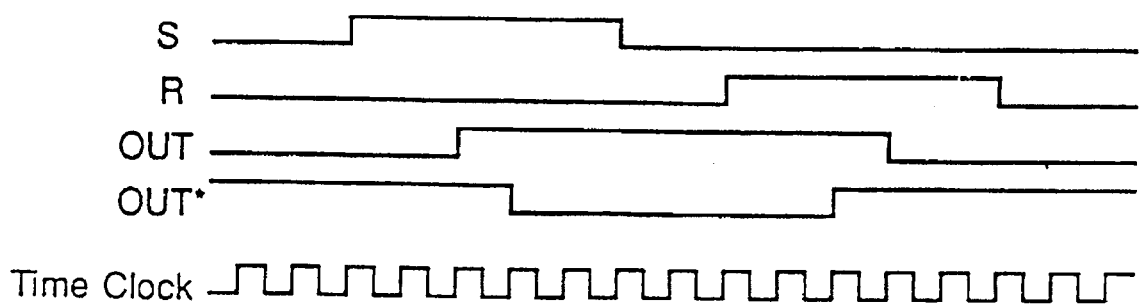

Unit delay modeling is realized by automatically including a flip-flop on the output of every unit-delay logic element. These flip-flops are connected to a common clock, which is cycled once for each unit of time in the simulation by a second clock generator. These flip-flops and their 'time clock' net are added to the design data structure by the primitive conversion process. An example logic design network to be simulated with unit delay is the flip-flop made with cross-coupled gates (FIG. 52a). Each gate is configured with a unit-delay flip-flop made with cross-coupled gates (FIG. 52a). Each gate is configured with a unit-delay flip-flop on its output (FIG. 52b). The resulting operation, given a continuous time clock and input signals, is that of a flip-flop with unit-delay gates (FIG. 52c).

The Realizer logic simulator for a unit delay simulation operates according to the same methodology as for zero delay, with the following variations:

The user specifies how much time is to correspond to one unit.

The stimulus and response times are restricted to the user-specified multiple 'M' of a time unit.

Each vector memory location corresponds to M time units, regardless of whether there are any stimulus events at that time.

The stimulus and response translation system uses these specifications to map between events and vector memory locations according to that correspondence.

Consequently a time with no stimulus events will be represented by a vector memory location with contents identical to the previous location.

The operating kernel sets the frequency of the 'time clock' clock generator to be M times the frequency of ECLK, and specifies that they operate synchronously with one another. During operation, there is one ECLK, and thus one set of stimulus and response, for every M time units.

3.1.5.4 Real delay

Figure 53A:
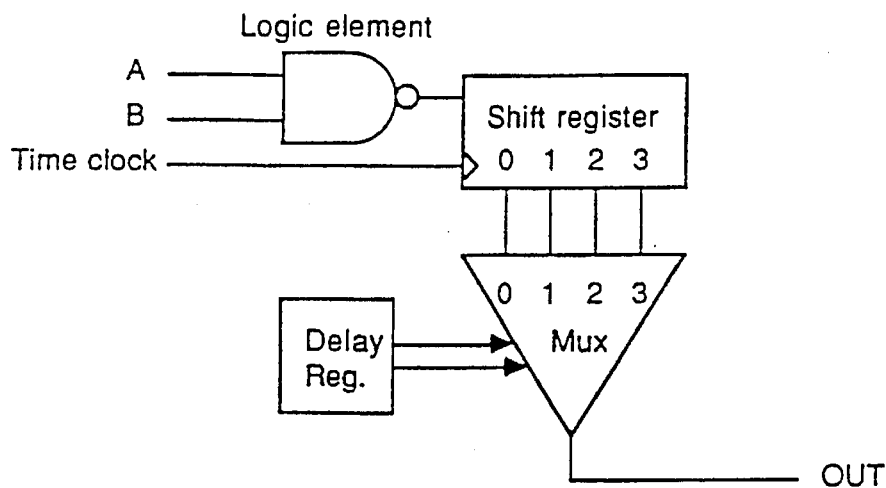
FIGS. 53a–c schematically illustrate a real delay configuration.

Real delay, or delay by variable units of time, is realized by using special hardware constructs in the logic chips, which are automatically inserted into the design data structure for every real-delay logic element during design conversion. There are several techniques:

A serial shift register is configured in series with every logic primitive output. Its length is configured to correspond to the number of units of delay required in each case. All shift registers are clocked by a common 'time clock', cycled once for each unit of time. Thus the shift register acts as an 'n' unit real delay, where 'n' is the length of the register (FIG. 53a, chosen via a multiplexer according to the value in the delay register).

Figure 53B:
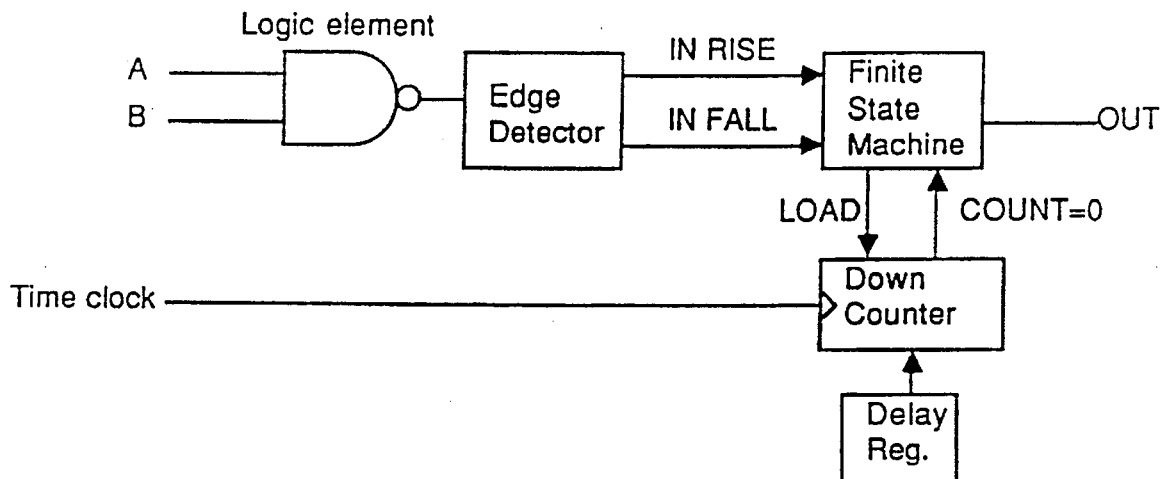
Figure 53C:
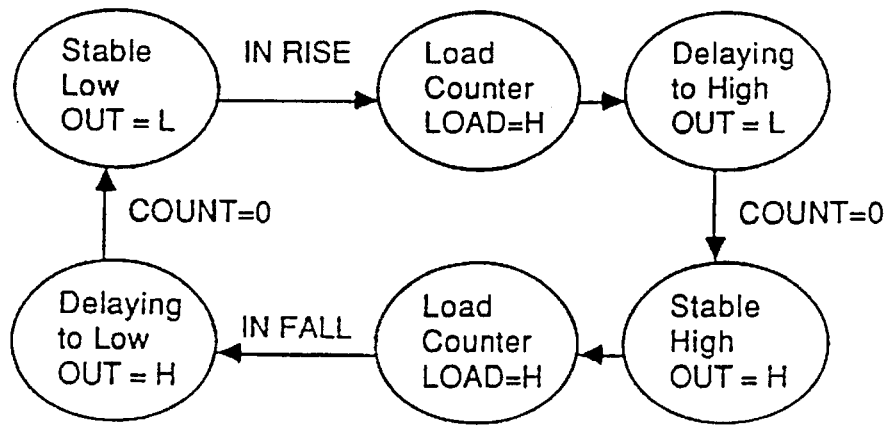

Alternatively, a finite-state-machine (FSM) and a counter with storage for one or more starting counts is configured in series with every logic primitive output (FIG. 53b). The FSM detects logic primitive output state transitions. For each state transition, the counter is loaded by the FSM with the starting count appropriate to the particular kind of state transition that occurred (rising or falling). All counters are clocked by a common 'time clock', cycled once for each unit of time. When the count reaches zero, the output state transition is passed by the FSM to the delayed output for propagation to its connected inputs (see FIG. 53c).

In both techniques, simulator operation is identical to the unit delay method above. The only difference is that logic primitives will exhibit more than one unit of delay, because of the above structures.

3.1.6 Transferring State from a Realizer Simulator into Another Simulator

The Realizer logic simulation system has advantages of extreme speed and thus the ability to process orders of magnitude more test cycles than software or other event-driven simulators. It has the disadvantages that delays and other time-related details may not be represented, and not all nodes in the design may be observed. Conventional event-driven software simulators, while far slower, may have the advantages of representation of detail and access to all network nodes for stimulus and observation. However, since they are so slow, it is not practical to put the simulated design into an erroneous state, which may be many millions or billions of cycles away from the initial state. Finding that erroneous state may be impossible in practice.

If a Realizer system is built with logic chips (such as the Xilinx LCAs) which have the ability to read out their internal state, that is the values of the internal flip-flop and logic gate outputs, then a realized simulation may be stopped and the state of the entire design may be read out. A Realizer logic simulator and another simulator are coupled to allow the state of the simulated design (that is, the values of all internal storage in the design and all inputs to the design) to be transferred from one to the other, according to the following method:

1) The same design is loaded into both simulators.

2) The design in the Realizer logic simulator is simulated for some number of cycles, such as the number of cycles it takes to put the design into a state which is shortly before an error or other condition to be observed in detail occurs.

3) At that time, the Realizer stimulus clocks are stopped, and the entire state of the design is read out from the logic chips.

4) The design represented in the other simulator is then initialized to match the state read out from the Realizer-based simulator.

5) Simulation proceeds in the other simulator.

Thus, the extreme speed of the Realizer logic simulator is used to uncover errors which take too long to uncover any other way, and then the detail and visibility of another simulator may be used to analyze the cause of the error.

3.2 Realizer Fault Simulation System

Fault simulation is a variation of logic simulation used to develop and qualify test vectors, that is, sets of stimulus which are used to test the correctness of a design, typically an integrated circuit, after it has been fabricated. A faulty version of the user design is simulated using test vector stimulus, and compared with the good version, to see if the test vector stimulus will cause any different response than the good version's response. If it does, then the test vector stimulus is proven to cause that fault to be detected. This is repeated for a large set of faults. The object is to develop a set of test vectors which detect as many faults as possible. Normally two faults are simulated for each net in the input design, one where the net is constantly low, called "stuck-at-low", and one "stuck-at-high." Since input designs commonly have thousands of nets, and thousands of test vectors, and fault simulation is repeated for each new version of the test vectors, it is a very time-consuming task.

A new means of building a fault simulator is based on the Realizer system. The Realizer logic simulator methodology is used, with modifications for fault simulation. The serial fault simulation technique ("QuickSim Family Reference Manual", Mentor Graphics Corp., Beaverton, Oreg., 1989) is used: For each fault:

1) Modify the realized design so as to introduce the fault.

2) Operate the design with the stimulus, comparing the responses with those of the good design, and flagging any difference.

3) Remove the fault, and record whether there was a difference for this fault.

The difference from all current fault simulation systems is that they execute sequential algorithms which predict the faulty design's responses to stimulus, while the Realizer fault simulator operates an actual realization of the faulty design to determine the design's responses to stimulus. The primary advantage is that the realized design generates responses many orders of magnitude faster than a sequential algorithm can predict responses.

Faults are introduced directly into the design, as configured in the Realizer logic and interconnect chips. To introduce a fault on an input design net:

If the net in the input design has a corresponding net in logic chip(s):

Reconfigure each logic chip connected to the net with a faulty configuration, which is identical to the original configuration except that the inputs connected to the net are connected to a constant high or low, according to the fault.

If not, it has been subsumed into a logic chip logic function:

Reconfigure the logic chip with a faulty configuration, which is identical to the original configuration except that the logic function which subsumed the net is configured to operate as if that net were constantly high or low, according to the fault.

To remove the fault, reconfigure the chip(s) with their original configurations.

Figure 54:
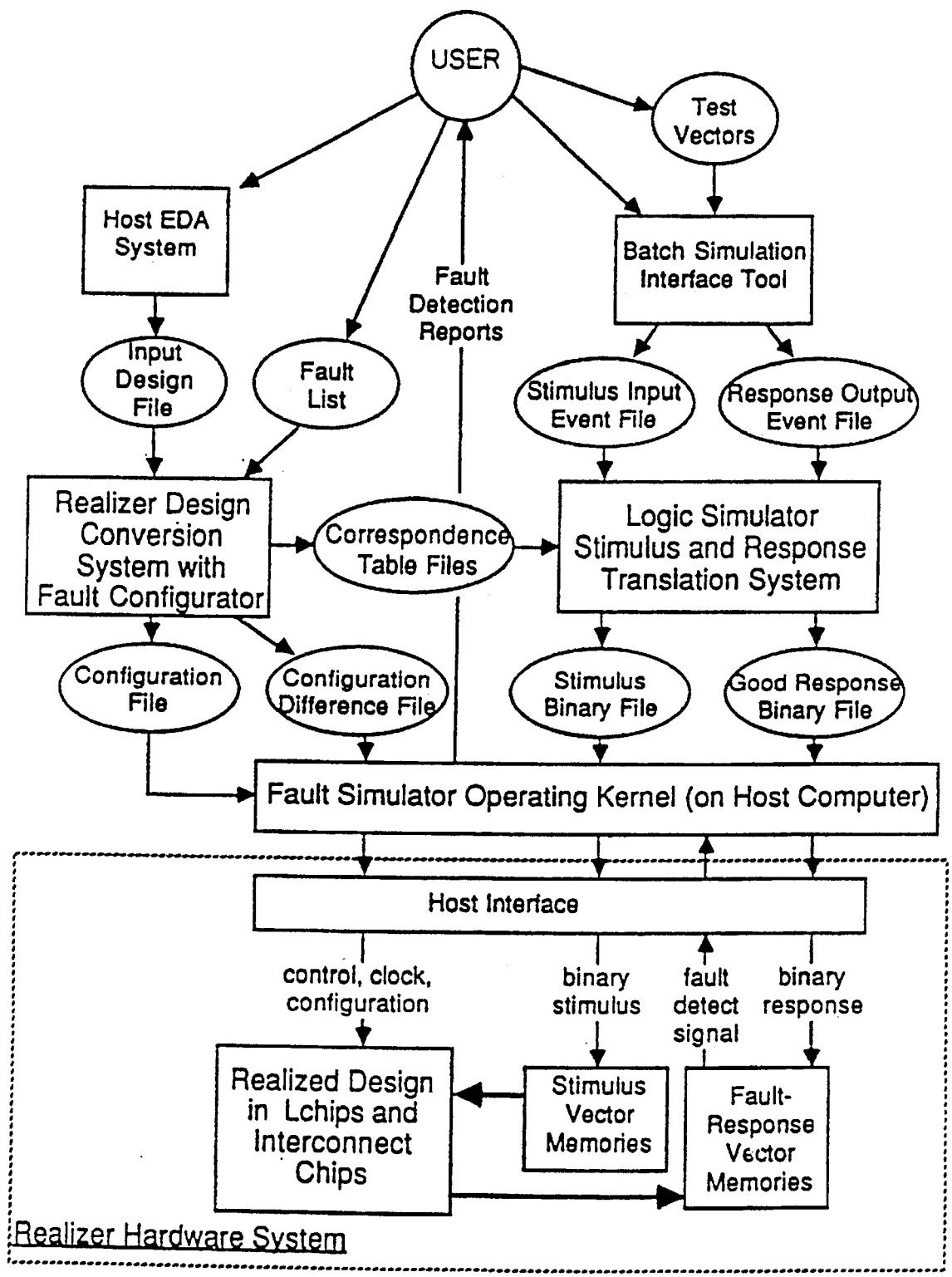
FIG. 54 is a schematic block diagram of a Realizer fault simulation system.

The Realizer fault simulator is essentially similar to the Realizer logic simulator with the following differences (FIG. 54):

It has a fault configurator, which is an additional part of the design conversion system beyond that of the logic simulator. It generates configuration file differences for each fault as follows:

1) Temporarily introduce the fault in the design data structure.
2) Determine which logic chips are affected by the fault design change.
3) Issue netlist files for affected logic chips.
4) Generate configuration files for the affected logic chips with the ERCGA netlist conversion tool.
5) Compare the faulty configuration files with the original ones, and save only the differences in the configuraiton difference file.

Instead of configuring response vector memories onto response nets, the design converter configures fault response vector memories. As described in the stimulus/response section, these compare the response net with the good value stored in memory, setting a flip-flop if a difference is detected.

The operating kernel works differently for fault simulation. To operate the fault simulation (zero delay shown, unit or real delay similar):

1) Read the design's configuration file and use it to configure all Realizer logic and interconnect chips, as described in the configuration section. Read initial design memory data from files and write it into design memories. Read the configuration difference file.
2) Read the stimulus binary file. Store the vector array contents in the corresponding stimulus vector memories, via the host interface. Read the time array "T" and cycle count 'v'. Read the good-circuit response binary file. Store the vector array contents in the corresponding fault response vector memories.
3) Generate the faulty configuration files for the logic chips affected by the first fault using the configuration differences for this fault, and use them to configure the logic chips for this fault.
4) Clear all vector memory counters and difference detection flip-flops in the vector memory modules. Cycle the design rest generator to initialize the realized design.
5) Enable the ECLK net's clock generator for 'v' cycles. This causes the stimulus vector memories to issue their stimulus data, operating the realized design according to that stimulus, and causes the fault response vector memories to compare response data against the good circuit.
6) Check the fault response detection flip-flops and record whether a difference occurred for this fault.
7) Restore the original configurations to the faulted logic chips.
8) Repeat steps 3–7 for each remaining fault.

3.3 Realizer Logic Simulator Evaluation System

Most current conventional simulators in modern EDA systems operate according to either of the well-known sequential algorithms called event-driven or compiled-code simulation ("An Introduction to Digital Simulation", Mentor Graphics Corp., Beaverton, Oreg., 1989). Each primitive in the input design is "evaluated" for every time step in which a net driving an input pin of the primitive has an event, that is, a change of state, in the first algorithm, or for all time steps in the second. An evaluation of a primitive is the operation of determining what the primitive's new output value(s) are as a consequence of the new input value. This occurs many times during a simulation. Normally only small primitives, such as gates, are evaluated with one operation, using table-lookup or other direct techniques. Large logic networks are ordinarily simulated as a composition of small primitives and nets. Many time-consuming internal evaluations are required for each evaluation of the large network.

A logic simulator, external to the Realizer system and executing a sequential simulation algorithm, is coupled to the Realizer logic simulator evaluation system, which uses the Realizer hardware to evaluate one or more large logic networks within an algorithmic simulation. Each large logic network to be evaluated by the Realizer system is represented as a single primitive in the external logic simulator. The advantage is one of speed, since the realized primitive is evaluated nearly instantly. The size of the logic network(s) evaluated by the Realizer system is limited only by the Realizer's logic capacity, and encompasses as much as the entire input design.

Figure 55:
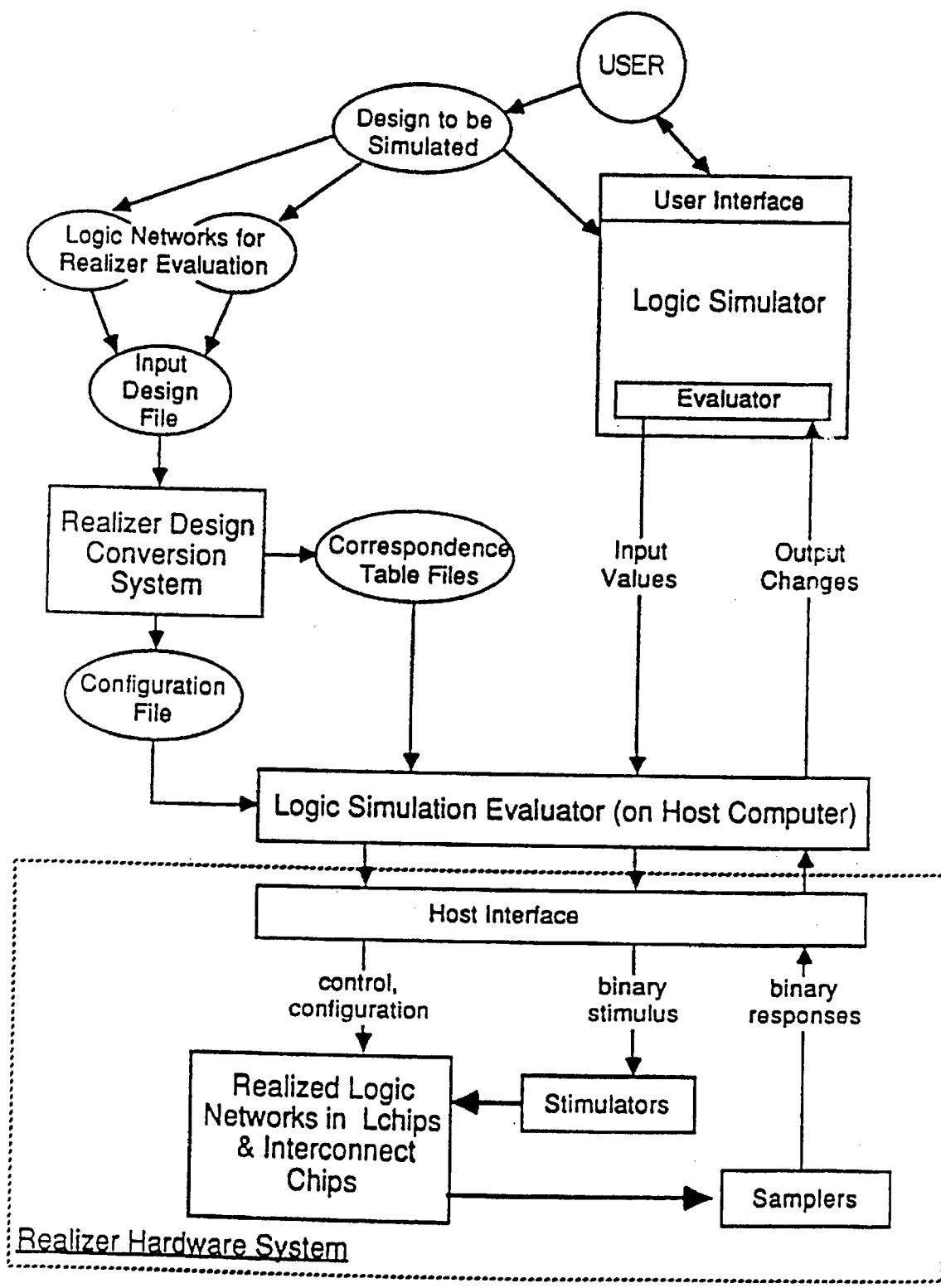
FIG. 55 is a schematic block diagram of a Realizer logic simulator evaluation system.

The Realizer logic simulator evaluation system consists of the Realizer design conversion system (described elsewhere), and the Realizer logic simulation evaluator, along with the Realizer hardware system and host computer (FIG. 55). It is coupled to an external logic simulator operating a sequential simulation algorithm.

To prepare logic networks for evaluation by the Realizer logic simulation evaluation system:

1) Assemble the logic networks to be evaluated by the Realizer system as an input design on the EDA system.
2) Attach properties to the input and output nets of each logic network specifying that they are to be driven by stimulators and samplers, respectively.
3) Convert the input design, using the Realizer design conversion system in the ordinary way, generating configuration and correspondence table files for this collection of logic networks.

To conduct the simulation, jointly operate the external logic simulator, which executes the simulator algorithm, and the Realizer logic simulation evaluator, according to the following method:

1) Organize the external simulator's data structures so that there is a single primitive for each logic network to be evaluated by the Realizer system.
2) Read the design's correspondence table file and associate primitive inputs and outputs with their corresponding stimulators and samplers and their addresses on the Realizer host interface bus.
3) Read the design's configuration file and use it to configure all Realizer logic and interconnect chips, as described in the configuration section. Read initial design memory data from files and write it into design memories. Cycle the design reset generator to initialize the realized logic networks.
4) Initialize all stimulators with initial values.
5) Operate the simulation algorithm in the external logic simulator. The simulation algorithm uses this method to evaluate Realizer-based primitives:
   1) Transfer the values for all inputs to this primitive at this simulation time step to the Realizer logic simulation evaluator, and direct it to load the values into the corresponding stimulators.
   2) Direct the Realizer logic simulation evaluator to check all output samplers for this primitive and transfer any changes as outputs back to the simulation algorithm.
6) Provide the ability for the external logic simulator's user interface system to access design memory contents via the host interface, for use examination and modification, before, during or after simulation.

When the simulation algorithm is being executed in software, it is executed on the Realizer host computer, and it uses the host interface to access stimulators, samplers and design memory. When the simulation algorithm is being executed in hardware, it uses a communications link to the host computer to access stimulators, samplers and design memory.

A variation for hardware simulator systems uses a direct connection between the simulator hardware and the Realizer's user-supplied device (USD) module(s). The method is as above, with these differences:

1) Instead of specifying stimulators and samplers on the primitives' inputs and outputs in the input design, connect them to a USD primitive corresponding to the hardware simulator's evaluation unit.
2) Electrically connect the evaluation unit of the hardware simulator to the Realizer's USDM.
3) When input events occur, apply the new values to the realized primitive by direct connection, and collect output responses by direct connection, instead of via the host. Even higher evaluation speed results.

3.4 Realizer Prototyping System

When an input design is realized, it may be operated directly as a prototype realization of the design. Although the timing delays of the Realizer system do not in general match those of the ultimate hardware realization, and thus the prototype may not operate at full design speed, the Realizer-based prototype allows nearly real-time actual operation of the design. The realized design is stimulated by the Realizer clock generator(s), stimulators controlled via the host, actual user-supplied hardware devices, realized virtual instruments (described below) and/or self-stimulated by internal logic and/or design memory contents. Design operational behavior is monitored and analyzed with samplers controlled via the host, actual user-supplied hardware devices, realized virtual instruments and/or by inspecting design memory contents. The designer interacts directly with the design in real time as in a 'benchtop' environment.

Figure 56:
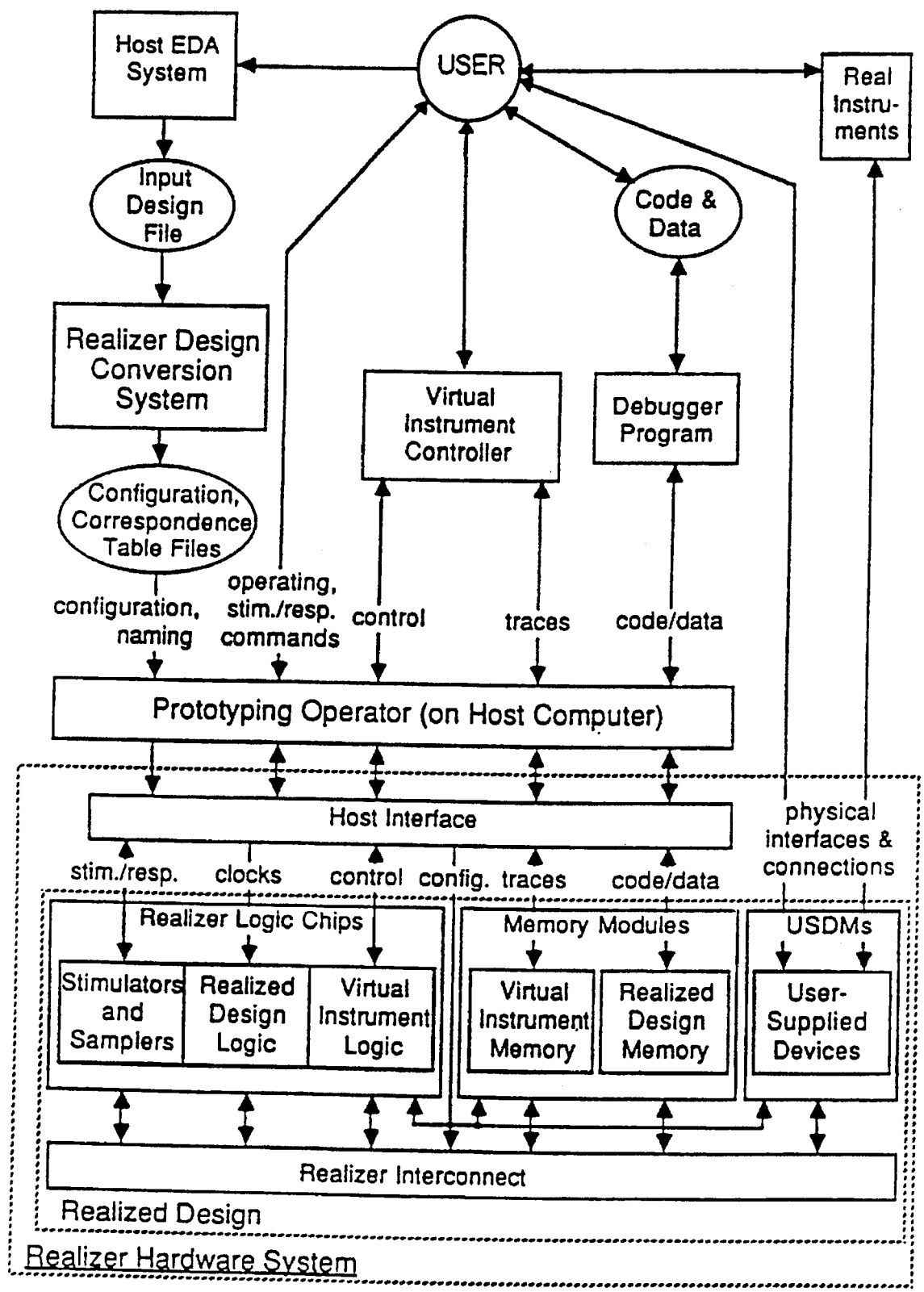
FIG. 56 is a schematic block diagram of a Realizer prototyping system.

The Realizer prototyping system consists of the design conversion system (described elsewhere) and the prototyping operator, along with the Realizer hardware system and host computer (FIG. 56).

The prototyping operator configures the Realizer system for the design to be operated, and supports interactive stimulus and response of the realized design. It executes on the host computer and responds to user commands, either directly or from a control program also running on the host computer.

To operate the realized design:
1) Read the design's configuration file and use it to configure all Realizer logic and interconnect chips, as described in the configuration section. Read initial design memory data from user-supplied files and write it into design memories. Read the correspondence table file and establish correspondences between design net names and stimulators and samplers and their host interface bus addresses.
2) Cycle the design reset generator to initialize the realized design.
3) Continuously provide the following operations on demand:
   Service user commands controlling the clock and rest generators.
   Service user commands to change stimulator data output values, using the correspondence table to relate the user-provided net name to the corresponding stimulator.
   Service user commands to display sampler data input values, using the correspondence table to relate the user-provided net name to the corresponding sampler.
   Service user commands to read and write locations in the design memory modules. Make sure the design is not operating, by checking that clock generators are stopped, before accessing the design memory, so as to avoid improper design memory operation. Advise the user if the design is not stopped.

To use the Realizer prototyping system:
1) Prepare the input design in the host EDA system.
2) Mark design nets which are to be connected to stimulators, samplers and clock or reset generators.
3) Include design primitives, nets and connections to design nets for any virtual instrumentation to be used (see below).
4) Convert the input design with the Realizer design conversion system, generating a configuration file for the design.
5) Operate the design with the Realizer prototyping operator.

Figure 57:
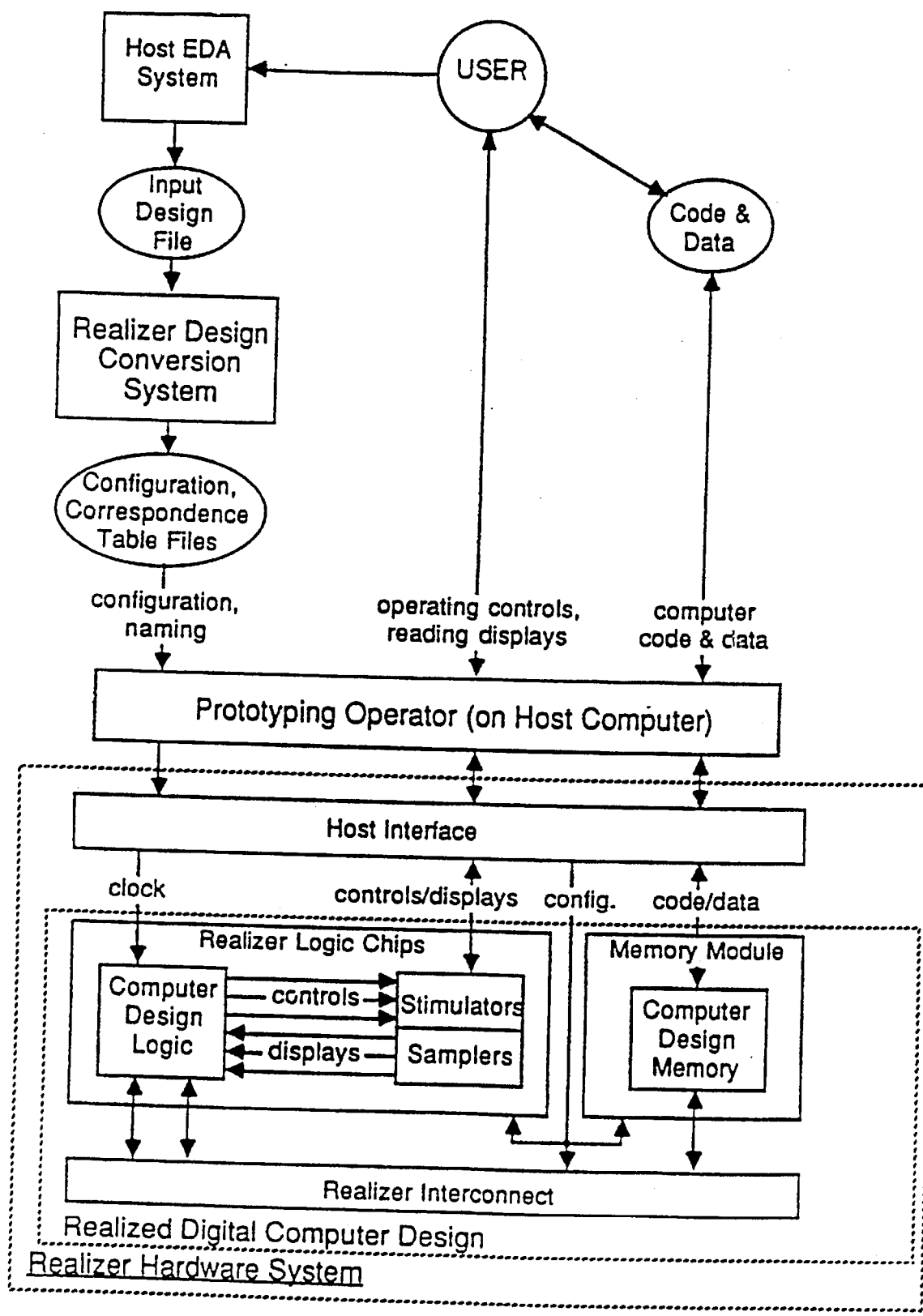
FIG. 57 illustrates a digital computer example on a Realizer prototyping system.

In a specific example shown in FIG. 57, a digital computer design is realized with the Realizer prototyping system. The user uses the host EDA system to represent the design for the computer's logic and memory in an input design file, which the user converts into a configuration file with the Realizer design conversion system. Front panel control inputs and display outputs, which connect to actual front panel control switches and indicators in a real implementation, are specified in the input design to be connected to stimulators and samplers under user control via the prototype operator. The computer's clock input signal is specified to be generated by the Realizer clock generator.

In a specific example shown in FIG. 57, a digital computer design is realized with the Realizer prototyping system. The user uses the host EDA system to represent the design for the computer's logic and memory in an input design file, which the user converts into a configuration file with the Realizer design conversion system. Front panel control inputs and display outputs, which connect to actual front panel control switches and indicators in a real implementation, are specified in the input design to be connected to stimulators and samplers under user control via the prototype operator. The computer's clock input signal is specified to be generated by the Realizer clock generator.

To operate the prototype computer, the user runs the Realizer prototype operator to configure the Realizer system according to the computer design. The user loads the computer program code to be executed on the realized computer design and its initial data into the design memory at the beginning of operation, via the prototype operator. When the user enables the clock generator, the computer design actually operates in the configured logic and interconnect chips of the Realizer hardware, executing program instruction codes read from design memory and reading and writing data in design memory. The user operates the front panel control inputs and reads the display outputs during operation via the prototype operator's access to the corresponding stimulators and samplers. Results are read out of the memory by the user via the prototype operator, upon completion of the program. The user analyzes the results to determine if the design is correct, that is, operating according to the user's intent. If it is not, due to some design error in the input design, the user corrects the error using the host EDA system, and repeats the prototyping process.

3.4.1 Realized Virtual Instruments

When stimulus and/or analysis instruments are called for in the prototype debugging process, conventional instruments, such as logic analyzers, are connected directly to the realized design, via the user-supplied device module. To connect a real instrument, include a primitive representing the instrument USD in the input design, connected to the design nets which are to be connected to the instrument, and create a USD specification file defining the USD connections. Then directly connect the instrument to the USDM, and convert and operate the realized design as above.

Figure 58:
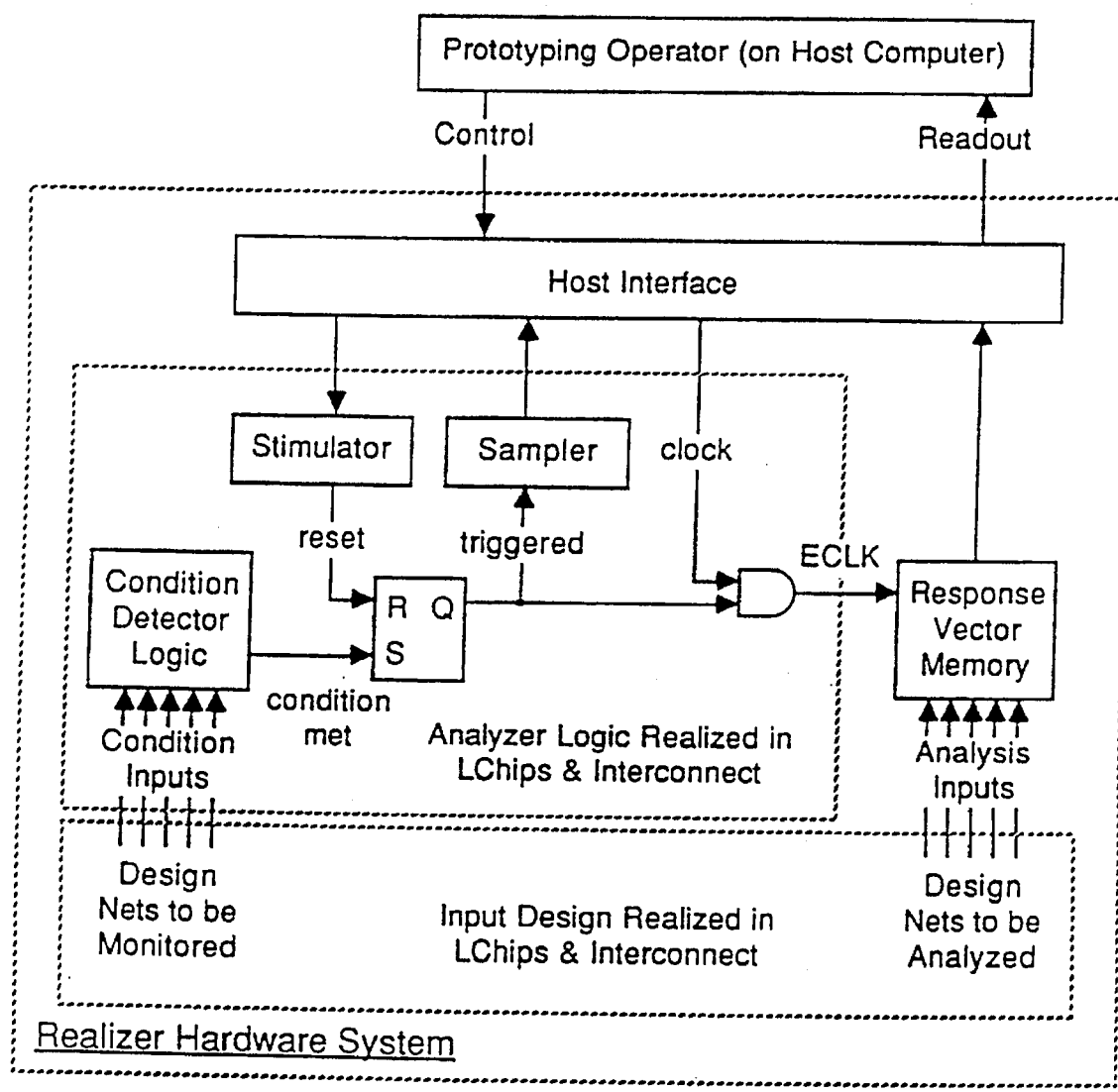
FIG. 58 is a schematic block diagram of a virtual logic analyzer configuration.

Additionally, "virtual instruments" consist of primitives and nets included with the design in the input design file and realized along with the design. For example, a logic analyzer is a well-known instrument which monitors a set of logic signals, and when they satisfy a certain trigger condition, a set of analyzed signals are continuously sampled and their values recorded in a memory, which is then read out for analysis. FIG. 58 shows the configuration of a virtual logic analyzer, composed of a response vector memory, a condition detector composed of logic primitives, one or more stimulators and samplers, and other logic primitives.

To realize and use a virtual logic analyzer with a design:

1) Include the primitives for these components in the input design file in addition to the design, interconnected as shown. In particular, connect response vector memory inputs to the design nets which are to be analyzed, connect condition detector inputs to the design nets which are to be monitored for the trigger condition, and specify the condition detector logic according to the condition to be detected.

2) Convert the input design file to a configuration file according to the normal procedure.

3) Configure the design in the Realizer prototyping system.

4) Cycle the 'reset' signal via its stimulator, and assert the stimulus required to cause the realized design to begin operation.

5) Monitor the 'triggered' sampler. When the sampler shows the 'trigger' signal is true, the logic analyzer is collecting analyzed signal data.

6) Read this data out of the logic analyser's response vector memory via the host interface. Display and analyze it by using an ordinary computer debuffer program or the like.

This is just an example which shows how virtual stimulus or analysis instrumentation is realized with the design in the Realizer system. Note that the instrumentation concepts, themselves, such as the concept of a logic analyzer, are not novel. One element of the novelty is realizing instrumentation along with the input design in a Realizer system.

3.5 Realizer Execution System

The Realizer Execution System is used to execute hardware functions, specified in input design files, which are not yet constructed or are never intended for construction in permanent hardware. There are several advantages to be gained by doing this:

Realized designs are put to use, for software development or other purposes, during the time the permanent hardware is being constructed. This allows software development, for example, to proceed during fabrication, so it is debugged and ready for use when the permanent hardware is finished.

The Realizer execution system acts as a universal hardware device, and is put to use for many different interchangeable functions, as required. When a particular function is needed (once it has been realized by the Realizer design conversion system) the configuration and other files for that hardware system are called up from storage by the host computer, the Realizer system is configured according to that design, and the function is executed. For example, in an electronic design environment, the Realizer execution system is used to execute the functions of a logic simulation hardware accelerator, a routing hardware accelerator, or a hardware graphics processor, as needed. In a digital signal processing environment, the Realizer execution system is used to execute the functions of a real-time spectrum analyzer, or a special-effects synthesizer, as needed.

The Realizer execution system is the same as the Realizer prototyping system, except that:

1) Instrumentation for analysis is not used, as the input design is considered correct. Stimulators, samplers and design memory access are only used to control the executing function and to input and output data.

2) A controller, specific to the particular executed function, may be created and used to control the Realizer prototyping operator, to give the executing function an input/output and control interface appropriate to the function's usage.

3.6 Realizer Production System

A variation of the Realizer design conversion system is used to automatically create a permanent non-reconfigurable implementation of the input design. This permanent implementation uses the same type and number of Realizer logic chips as would be configured for the realized design. The Realizer production system uses its ERCGA netlist conversion tool to permanently configure non-reconfigurable logic devices equivalent in function to the ERCGA logic chips, and drives an automatic printed circuit board (PCB) placement and routing tool ("Getting Started with Board Station", "Layout User's Manual", Mentor Graphics Corp., Beaverton, Oreg., 1989) with the specifications of the logic chip interconnections, to manufacture the PCB which permanently interconnects those non-reconfigurable logic devices.

In the preferred embodiment, LCAs are used as the ERCGA logic chips. The LCA manufacturers provide a non-reconfigurable logic device equivalent in function to the LCA, in the form of an LCA chip coupled with a configuration PROM memory chip ("The Programmable Gate Array Data Book", Xilinx, Inc., San Jose, 1989). The LCA netlist conversion tool creates the binary file used to program the PROM, and the LCA contains logic which causes it to automatically configure itself upon applying power, using the PROM, when one is present.

Figure 59:
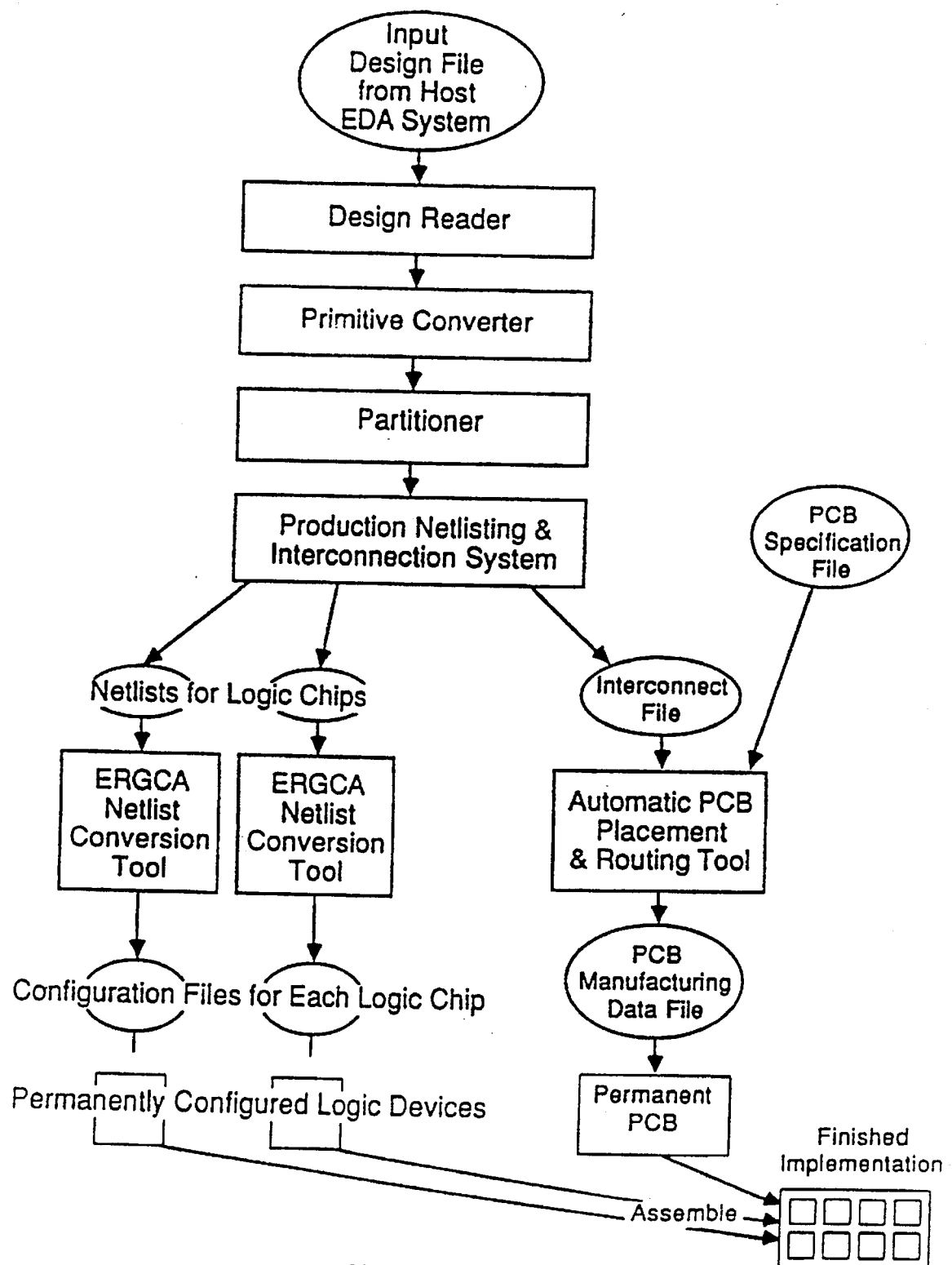
FIG. 59 is a schematic block diagram of a Realizer production system.

The Realizer Production System consists of the same design reader, primitive converter, and partitioner used in the Realizer design conversion system (RDCS), an interconnection and netlisting system and an ERCGA netlist conversion tool which are variations of the ones in the RDCS, as described and an automatic PCB placement and routing tool (FIG. 59). It does not include the Realizer hardware system or host computer. It reads the input design file and a PCB specification file. It operates with the following method:

1) Use the design reader to read the input design file and create the design data structure.
2) Use the primitive converter to convert the design data structure into logic chip primitives.
3) Use the partitioner to assign the primitives to specific logic chips.
4) Use the interconnection and netlisting system to create netlist files for the logic chips. Instead of generating netlist files for the interconnect chips, issue a list of cut nets and their logic chip I/O pin connects to a single interconnect file in a form acceptable to the automatic PCB placement and routing tool.
5) Use the ERCGA netlist conversion tool to generate binary configuration files for each logic chip in the form appropriate for configuring the equivalent non-reconfigurable logic devices.
6) Use the automatic PCB placement and routing tool, which reads in the interconnect file and the PCB specification file (containing physical information, not directly related to the logic design, such as PCB dimensions, connector requirements, etc., ) and which generates the PCB manufacturing data file.

The Realizer Production System user then uses the PCB manufacturing data file to manufacture PCBs, uses the binary configuration files to configure non-reconfigurable logic devices, and assembles the devices and PCBs to produce finished implementations of the input design.

What is novel about the Realizer production system is not the use of non-reconfigurable gate array chips equivalent in function to ERCGAs in a permanent hardware implementation, which is common practice. Rather, one aspect of the novelty is the ability of this system to take a digital system of arbitrary size (not limited to the capacity of one IC chip), and expressed in generic primitive logic form in an input design file (not the logic library of a specific vendor), and automatically generate a permanent hardware implementation.

3.7 Realizer Computing System

The Realizer hardware system can be configured according to the behavior specified in an input program written in a higher-level computer language, such as Pascal, and used to execute a computing function according to that program, just as general-purpose stored-program computers can do. This is accomplished by using a high-level design synthesis compiler to convert the computer program into digital logic form, represented in an input design file, and then realizing and operating that design on Realizer hardware.

This methodology is a fundamentally novel means of computing. From the point of view of computing, the Realizer hardware is a highly parallel data processor, whose data processing elements are the logic functions and storage devices in the Realizer logic chips, interconnect chips and special-purpose elements. This data processor does not operate according to the stored-program computing method of sequential instruction execution. It operates according to the data paths, functional units and finite state machine control structures configured into the Realizer hardware that operate according to the behavior specified in the input program. The advantage is one of higher computation speed that that which is possible with sequential stored-program computing.

Figure 60:
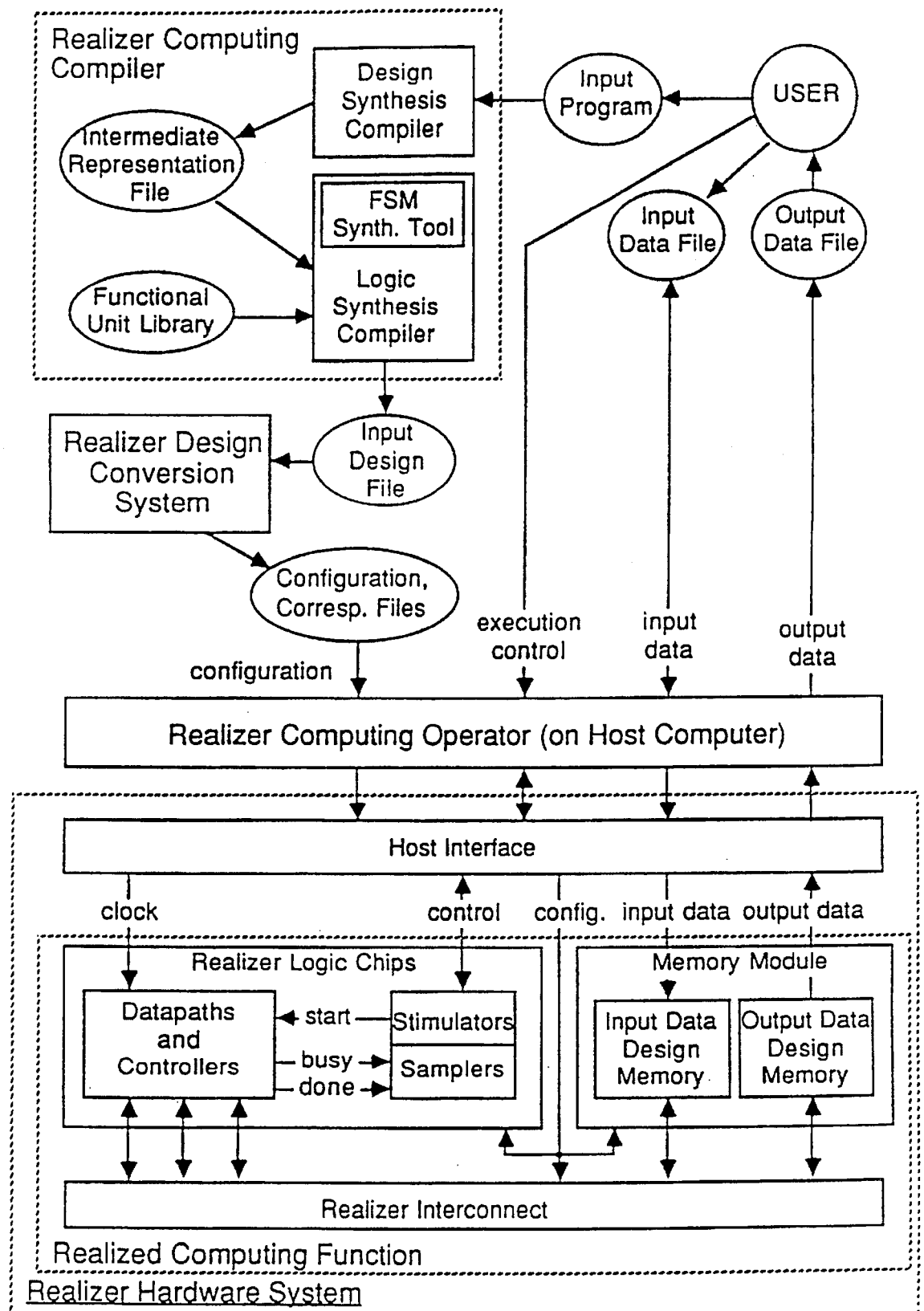
FIG. 60 is a schematic block diagram of a Realizer computing system.

The illustrated Realizer computing system consists of the Realizer computing compiler, the Realizer design conversion system, and the Realizer computing operator, along with the Realizer hardware system and host computer (FIG. 60). Note that the host computer is only used as a means for running the Realizer computing operator, not for executing the computing function specified in the input program. Other means for running the Realizer computing operator may of course be used.

3.7.1 Realizer Computing Compiler

The Realizer computing compiler converts an input program file, written in a higher-level computer language using a text editor, into an input design file. It is composed of a design synthesis compiler, a logic synthesis compiler, and a functional unit library.

The design synthesis compiler is a tool, several examples of which have been recently developed ("Tutorial on High-Level Synthesis", McFarland, Parker and Camposano, Proceedings of the 25th Design Automation Conference, ACM and IEEE, 1988), which constructs a description of a system of finite-state machine controllers and datapaths, composed of functional units, data inputs and outputs, and bus interconnections, which operates according to the behavior specified in a standard procedural computer language. An example of an actual design synthesis compiler is "Flamel", whose methodology is described in detail in "Flamel: A High-Level Hardware Compiler", Howard Trickey, IEEE Transactions on Computer-Aided Design, Vol. CAD-6, No. 2, March 1987. Quoting from the reference:

"The input to Flamel is a Pascal program."

"The user provides a Pascal program together with execution frequency counts for a typical execution of the input program. The other user input is a number saying roughly how much hardware is allowed. The output is a design for hardware that will perform the same function as the Pascal program."

"The general model for a circuit produced by Flamel is that of a synchronous digital machine consisting of a datapath and a controller. The datapath consists of functional units (ALUs, adders, registers, I/O pads, etc.) interconnected by busses. The controller is a finite-state machine."

"Ordinary Pascal programs are used to define the behavior required of the hardware. Flamel undertakes to find parallelism in the program, so it can produce a fast-running implementation that meets a user-specified cost bound."

"An implementation of Flamel has been completed. The output is a description of a datapath and a controller. On a series of tests, Flamel produces implementations of programs that would run 22 to 200 times faster than an MC68000 (microcomputer) running the same programs, if the clock cycles were the same."

The "user specified cost bound" input is provided to this design synthesis compiler by the user or by the Realizer computing system, according to the capacity of the Realizer hardware system to be used. The output of the design synthesis compiler is an intermediate representation file containing the datapath and controller descriptions.

The functional unit library is a set of pre-defined functional unit descriptions, one for each type of functional unit generated by the design synthesis compiler. These descriptions specify logic and user-supplied device (USD) primitives, and their net interconnections, which meet the requirements for Realizer input design primitives. USD primitives are optionally used to provide higher performance or capacity primitives than can be realized with the logic chips and design memories. For example, if fast VLSI floating point multipliers are installed as USDs, the functional unit library will contain a description for the floating point multiplier functional unit which specifies that USD primitive.

The logic synthesis compiler converts the description of datapaths and finite-state machine controllers into a representation of logic primitives and interconnect nets in an input design file. It contains a finite-state machine synthesis tool, which is available commercially from Mentor Graphics Corp., VLSI Technology Inc., Synopsis Inc., and others ("Logic Synthesis speeds ASIC Design", A. J. de Geus, IEEE Spectrum, August 1989), or is developed according to methods described in the literature ("The Implementation of a State Machine Compiler", C. Kingsley, Proceedings of the 24th Design Automation Conference, ACM and IEEE, 1987; "A State Machine Synthesizer", D. Brown, Proceedings of the 18th Design Automation Conference, ACM and IEEE, 1989; "An Overview of Logic Synthesis Systems", L. Trevillyan, Proceedings of the 24th Design Automation Conference, ACM and IEEE, 1989). It operates according to the following method:

1. Read the intermediate representation file containing the datapath and controller descriptions into data structures.
2) Convert each datapath functional unit description into logic and USD primitives and nets, according to the descriptions in the functional unit library.
3) Provide design memory primitives for each data input and output to and from the datapaths.
4) Use the finite-state machine synthesis tool to convert the finite state machine controller descriptions into logic primitives and their net interconnections.
5) Provide stimulator and sampler primitives for 'start' input and 'busy' and 'done' outputs to and from the finte-state machine controllers.
6) Specify that the clock net is to be driven by a Realizer clock generator.
7) Issue the primitives and nets into the input design file.

3.7.2 Realizer Computing Operator

The Realizer computing operator configures the Realizer system and causes execution of the realized computing function originally specified by the input program. The Realizer computing operator reads in the configuration file and correspondence table file created by design conversion, and it reads a user-supplied file of input data to the computing function and writes a file of output data from the computing fashion.

To operate the realized computing function:
1) Read the design's configuration file and use it to configure all Realizer logic and interconnect chips, as described in the configuration section.
2) Read the input data file and write its data into input data design memory(s). Clear the output data design memory.
3) Read the correspondence table file and establish correspondences between control inputs and outputs and the stimulators and samplers and their host interface bus addresses.
4) Enable the clock generator, and assert the 'start' control input via its stimulator, initiating operation.
5) Monitor the 'done' control output, and when it becomes true, read the data from the output design memory and write it to the output data file.

To use the Realizer computing system:
1) Prepare the input program and the input data file using a text editor or other means.
2) Use the Realizer computing compiler to generate the input design file.
3) Use the Realizer design conversion system, which operates in the normal way, as described elsewhere, to generate the configuration and correspondence table files.
4) Use the Realizer computing operator to actually execute the computing function.
5) Read the data computed by the realized computing function from the output data file.

4 Preferred Embodiment

The preferred embodiment referred to throughout this disclosure has the following characteristics:

4.1 Hardware

Figure 61A:
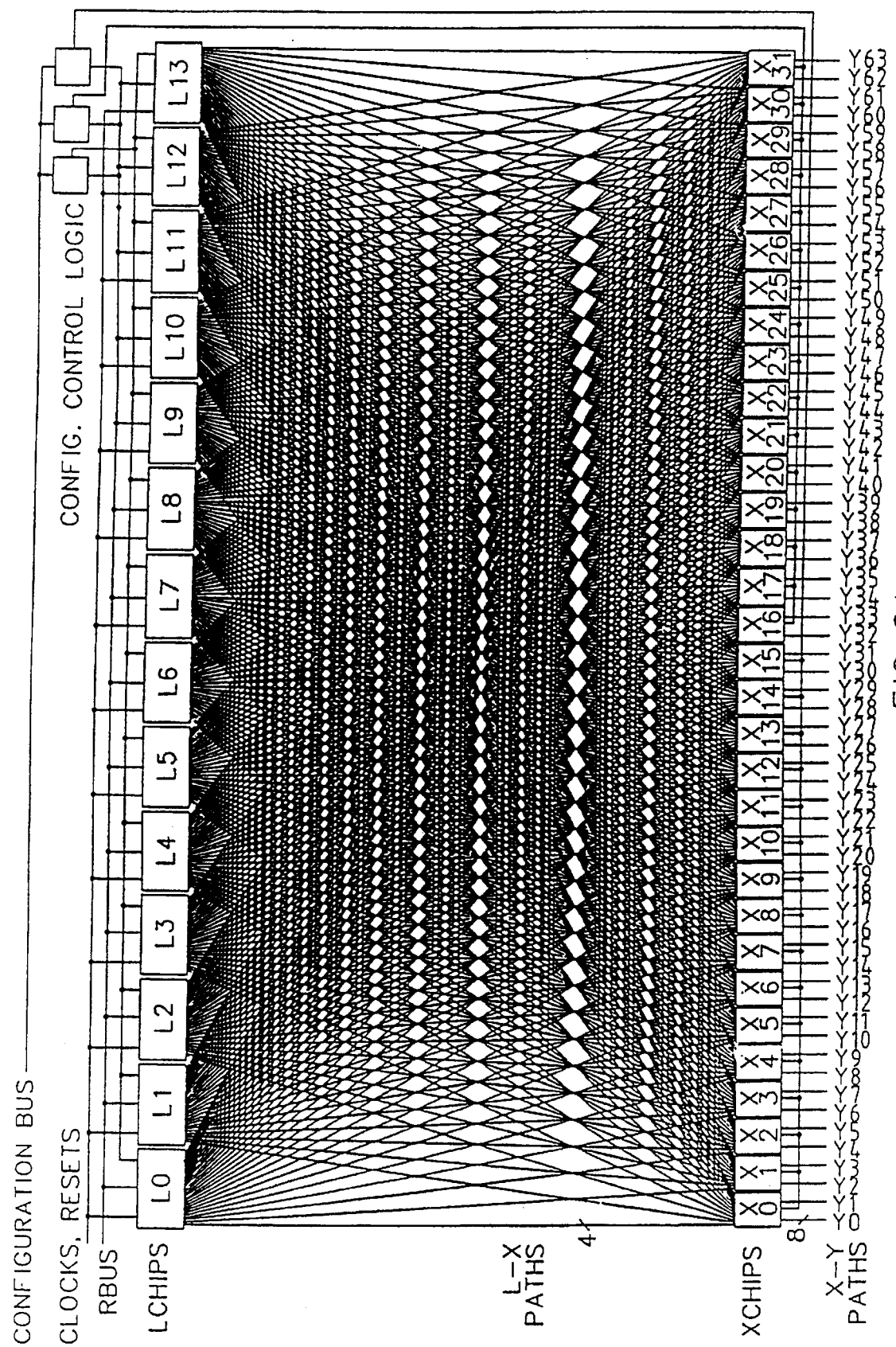
FIGS. 61a–c illustrate the general architecture of the preferred embodiment, including the hierarchical interconnection of logic boards, boxes and rack.
Figure 61B:
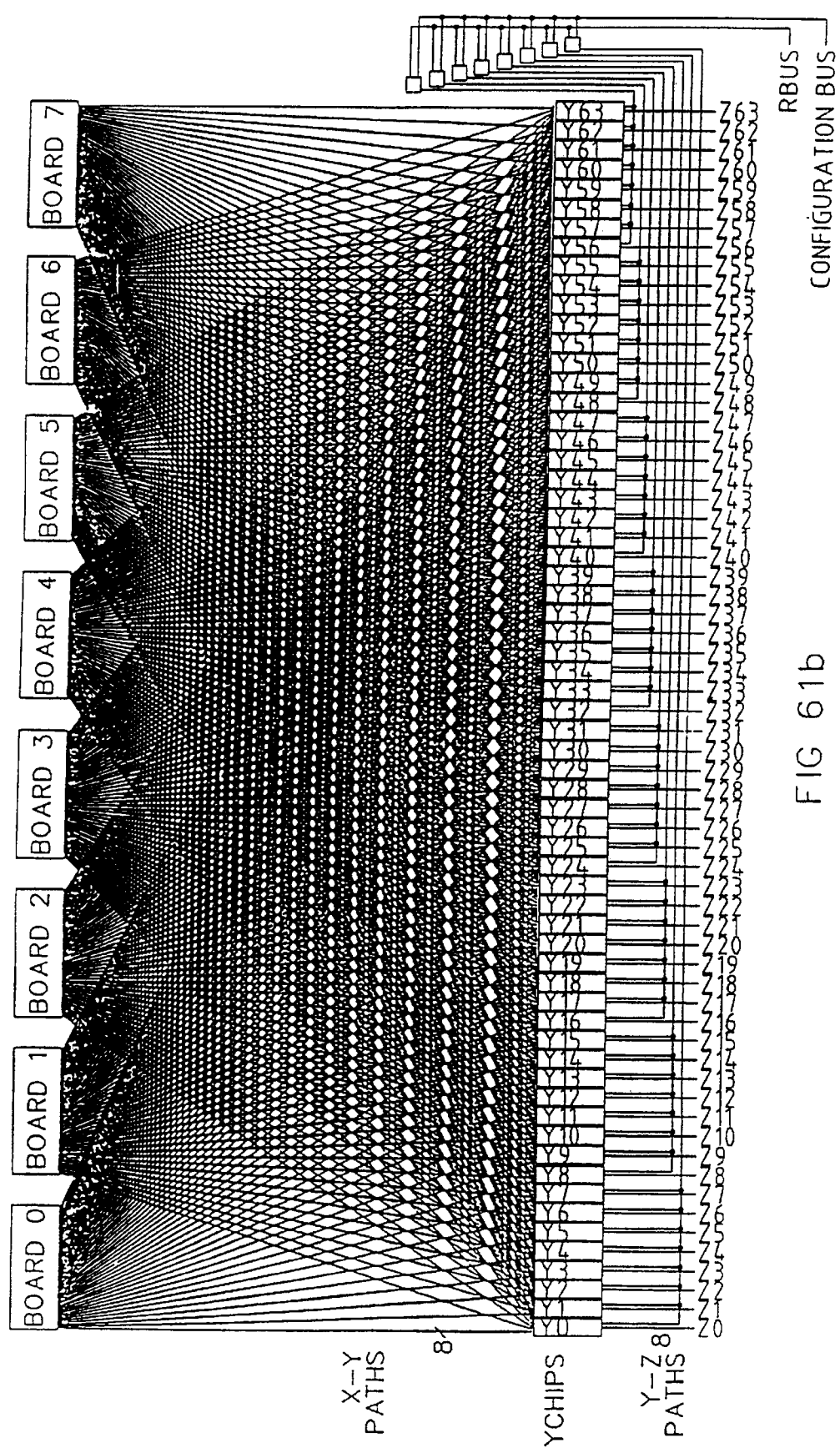
Figure 61C:
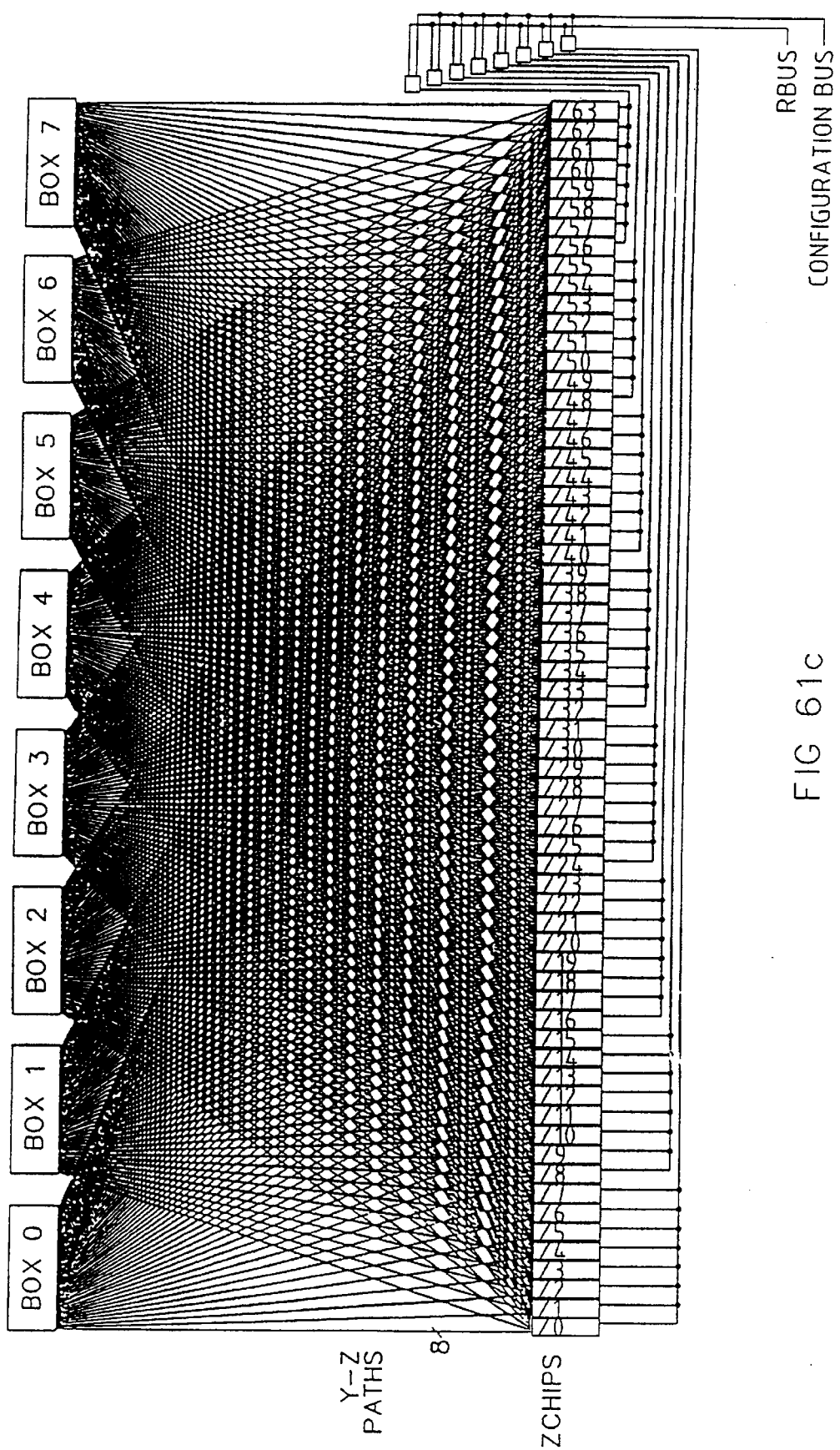
Figure 62A:
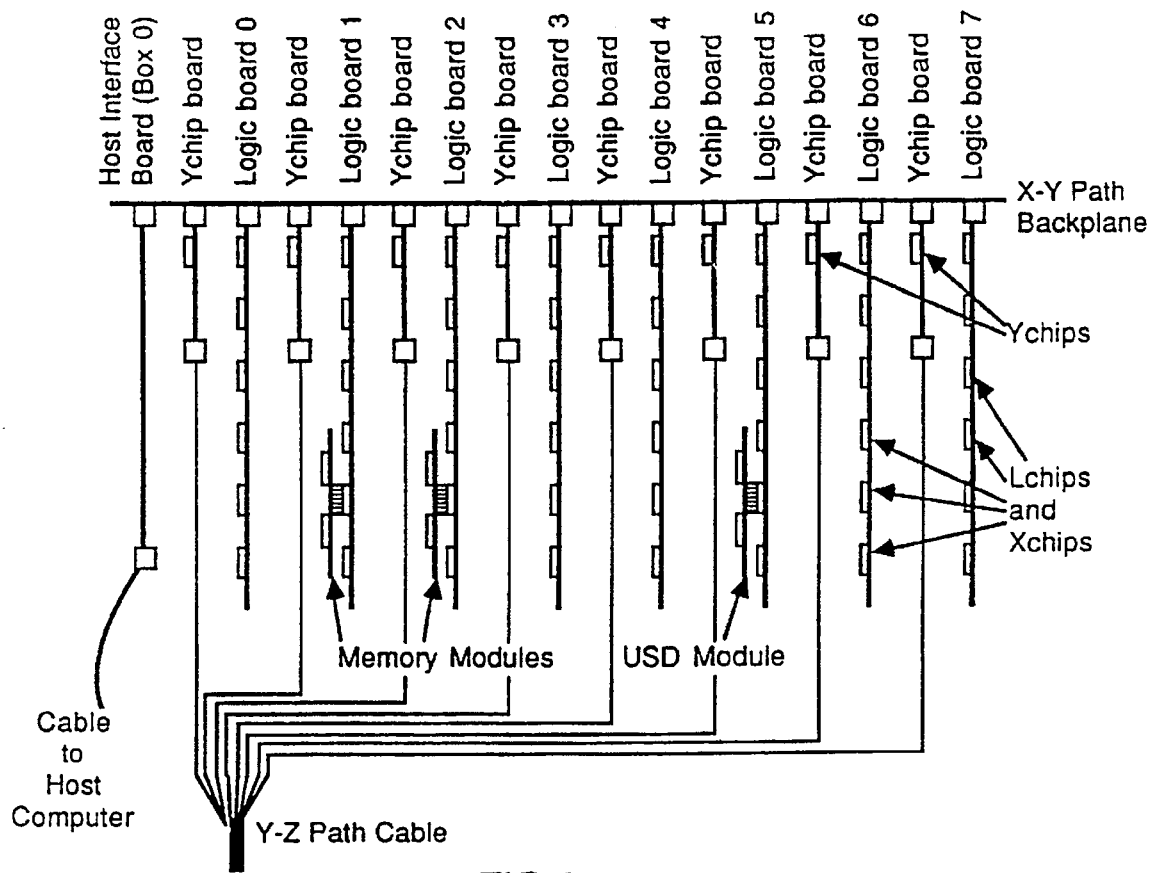
FIGS. 62a–b show the physical construction of a logic board box and a Z-level box.
Figure 62B:
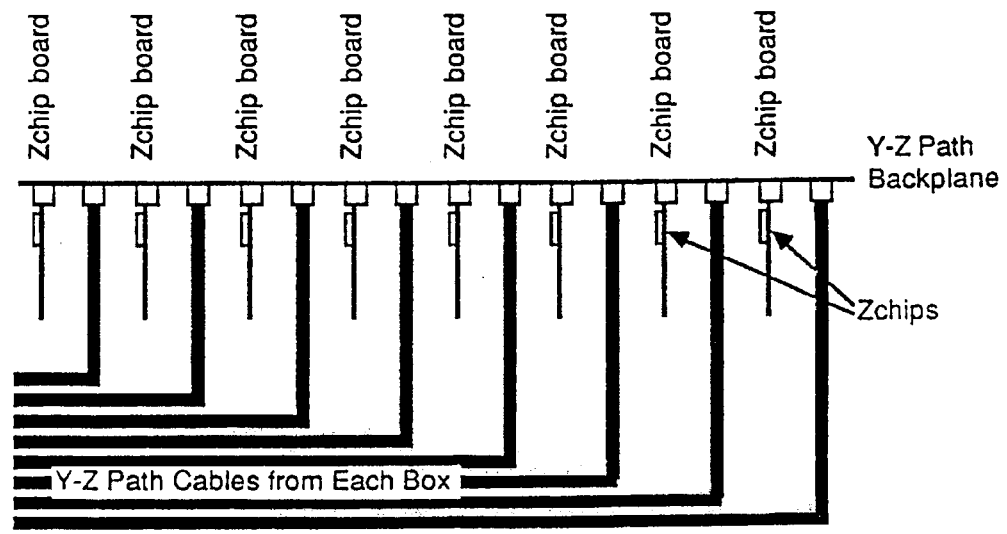

The partial crossbar interconnect is used hierarchically at three levels across the entire hardware system. FIGS. 61a–c show the general architecture of logic boards, boxes and rack hierarchically interconnected. FIGS. 62a–b show the physical construction of the boards, boxes and rack.

Logic Boards (FIG. 61a):

Each logic board consists of 14 Lchips, interconnected by 32 X-level crossbar chips.

Each Lchip has 128 I/O pins per chip connected to the X-level partial crossbar, 4 connections to each of the 32 Xchips. 14 additional I/O pins are used; 11 are connected to the RBus, one is connected to each of two clock signals, and one is connected to the design reset signal. Xilinx XC3090 LACs are used as logic chips.

Each Xchip has 56 I/O pins connected to the logic chips, 4 connections to each of the 14 Lchips. It has 8 additional I/O pin connections to each of two Ychips. Xilinx XC2018 LCAs are used as Xchips.

Each logic board has 512 backplane I/O pins for X-Y paths. It also has connections for the RBus and configuration bus.

Boxes (FIG. 61b):

Each box consists of one to eight boards, interconnected by 64 Y level crossbar chips.

Each Ychip has 64 I/O pins connected to the logic boards, eight connections to an Xchip on each board. It has 8 additional I/O connections to one Zchip. Xilinx XC2018 LCAs are used as Ychips.

The 64 Ychips are mounted on 8 Ychip boards, each of which has 512 backplane I/O pins for X-Y paths. The 8 Ychip boards and 8 logic boards are interconnected by wires in the box's X-Y path backplane.

Each Ychip board also has 64 I/O pins on a cable connector for its Y-Z paths. Each box will have 8 such connectors. Those connections are collected into a single 512-wire Y-Z path cable from each box. It also has connections for the configuration bus.

FIG. 62a shows the physical construction of the X-Y path backplane with a host interface, 8 logic boards and 8 Ychip boards, with the Y-Z path cable.

Racks (FIG. 61c):

Each rack consists of one to eight boxes, interconnected by 64 Z level crossbar chips.

Each Zchip has 64 I/O pins connected to the boxes, eight connections to a Ychip in each box. Xilinx XC2018 LCAs are used as Zchips.

The boxes of a rack are interconnected by an additional box, with connectors to the Y-Z path cables from each box in place of the logic boards. The physical construction of this Z-level box is shown in FIG. 62b. The 64 Zchips are mounted on 8 Zchip boards, each of which has 512 backplane I/O pins for Y-Z paths. The 8 Zchip boards and 8 Y-Z path cable connectors are interconnected by traces in a Y-Z path backplane.

Memory modules, each composed of 16 RAM chips and 10 LCAs, as described in the memory section, are installed in place of logic chip LCAs where needed. They are used for design memory, vector memory, simulators and samplers, as defined in the stimulus and response section.

User-supplied Hardware Device modules, each composed of 10 LCAs, as described in the the section on that topic, are installed in place of logic chip LCAs were needed.

The configuration bus with a 16bit data path connects all logic and crossbar chips with the host interface, for all configuration functions. Each board's 14 Lchips are in one configuration group, and its 32 Xchips are split into two groups. The 8 Ychip boards in each box are each one group, as are each of the 8Zchip boards.

4.2 Software

The Design Conversion System consists of the following modules, each of which is described in the section on its topic:

Design Reader, reading Mentor Graphics design files containing QuickSim logic primitives.

Primitive Converter, converting QuickSim primitives into Xilinx LCA primitives. Tri-state and wired-net drivers are converted according to the crossbar summing configuration, described in the tri-state section.

Partitioner, based on the cluster-building technique described in its section.

Interconnect and Netlisting System, interconnecting the three levels of the partial crossbar and issuing an XNF-format netlist file for each logic and crossbar chip in the system.

Xilinx LCA Netlist Conversion Tool, consisting of XNF2LCA, APR and Makebits.

Configuration File Collector

Applications

Realizer Logic Simulaton System, based on Mentor Graphics Logfiles and using the RSIM batch simulation interface tool.

Realizer Fault Simulation System, based on Mentor Graphics Logfiles and using the RSIM batch simulation interface tool.

Realizer Logic Simulator Evaluation System, acting as an evaluator for Mentor Graphics' QuickSim logic simulator.

Realizer Prototyping System with Realized Virtual Instrument, consisting of a logic analyzer.

Realizer Execution System

Realizer Production System, using the Mentor Graphics Board Station automatic PCB placement and routing tool.

Realizer Computing System, using the Pascal language, the Flamel design synthesis compiler, and the Mentor Graphics Design, Knowledge and Logic Consultant FSM and logic synthesis tools.

Having described and illustrated the principles of our invention with reference to a preferred embodiment, it will be apparent that the invention can be modified in arrangement and detail without departing from such principles. For example, while the invention has been described as operating advantageously in conjunction with a variety of electronic design automation tools from Mentor Graphics, it will be recognized that the invention can similarly be used with a variety of other design automation tools.

Similarly, while the invention has been illustrated with reference to an implementation employing off-the-shelf logic and interconnect chips mounted on conventional printed circuit boards, interconnected by conventional printed wiring backplanes and cables, in other embodiments, parts or all of a Realizer system can be implemented directly in wafer-scale silicon (or other technology).

In such an embodiment, the wafer(s) are organized as a collection of logic and interconnect functions, each one of which can be similar in scale and organization to an individual logic or interconnect chip. However, instead of mounting these functions in separate packages interconnected by wire, they are left on the wafer and interconnected by additional metal layers, or by a variety of other means available for wafer-scale integrated circuit connections.

A serious problem which impedes the application of wafer-scale fabrication to most applications is that it is nearly impossible, and certainly uneconomic, to fabricate an entire wafer which is free of faults. A wafer-scale Realizer system according to the preferred embodiment of this form of the invention is intrinsically tolerant of fabrication faults. After fabrication, a wafer-scale Realizer system is tested to identify its faults. These faults are stored in a fault file associated with the wafer. This file identifies which logic elements and interconnection elements are unavailable for use. These identified elements are the smallest and lower-level elements which are faulty and which can be isolated from the working parts. For example, if the Xilinx LCA organization is used for the logic and interconnect functions, faults are identified down to the level of Configurable Logic Blocks and individual interconnection segments and paths.

In the Realizer design conversion system, the partitioner and interconnector are organized to additionally read in the fault file for the wafer which is to receive the converted input design. The partitioner does not assign design logic onto elements which are known to be faulty. Likewise, the netlist converting software reads the fault file and does not assign logic or nets to faulty logic elements or interconnection segments.

In this embodiment, when the Realizer hardware is configured according to the input design, only working logic elements and interconnection are used, and correct operation occurs. Since the fraction of the total hardware that is faulty is typically very small, the resulting capacity is nearly as large as if all wafers were made without faults. Since faulty wafers are acceptable for use, the fabrication yield is high and the hardware cost is low.

In view of the wide variety of forms to which the principles of our invention may be put, it should be recognized that the detailed embodiment is illustrative only and should not be taken as limiting the scope of our invention.

Rather, we claim as our invention all such embodiments as may fall within the scope and spirit of the following claims and equivalents thereto.

We claim:

1. An electrically reconfigurable hardware emulation apparatus which can be configured with a logic circuit design, said electrically reconfigurable hardware emulation apparatus comprising:

a plurality of electrically reconfigurable devices, at least some of said electrically reconfigurable devices containing reprogrammable functional logic elements and input/out terminals capable of being connected to at least some of said functional logic elements, said plurality of electrically reconfigurable devices further comprising stimulators and samplers, said stimulators providing input signals to the circuit design undergoing emulation, said samplers collecting output signals from the circuit design undergoing emulation which said emulation system generates in response to said input signals;

at least one other of said electrically reconfigurable devices containing reprogrammable electrical conductors which are used to reconfigurably interconnect selected input/output terminals of selected electrically reconfigurable devices containing functional logic elements such that selected functional logic elements in one of said selected electrically reconfigurable devices containing functional logic elements can be electrically coupled to selected functional logic elements in an other of said selected electrically reconfigurable devices containing functional logic elements; and a set of fixed electrical conductors connecting said input/output terminals on said electrically reconfigurable devices containing reprogrammable functional logic elements to input/output terminals on said electrically reconfigurable devices containing reprogrammable electrical conductors.

* * * * *